US011257835B2

(12) United States Patent
Li et al.

(10) Patent No.: US 11,257,835 B2
(45) Date of Patent: Feb. 22, 2022

(54) THREE-DIMENSIONAL MEMORY DEVICE CONTAINING A DUMMY MEMORY FILM ISOLATION STRUCTURE AND METHOD OF MAKING THEREOF

(71) Applicant: SANDISK TECHNOLOGIES LLC, Addison, TX (US)

(72) Inventors: Liang Li, Shanghai (CN); Chao Xu, Shanghai (CN); Zhe Song, Shanghai (CN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 73 days.

(21) Appl. No.: 16/692,027

(22) Filed: Nov. 22, 2019

(65) Prior Publication Data

US 2021/0159241 A1    May 27, 2021

(51) Int. Cl.
*H01L 27/11565*    (2017.01)
*H01L 27/11524*    (2017.01)
(Continued)

(52) U.S. Cl.
CPC .. *H01L 27/11565* (2013.01); *H01L 21/76816* (2013.01); *H01L 21/76877* (2013.01);
(Continued)

(58) Field of Classification Search
CPC ......... H01L 27/11524; H01L 27/11529; H01L 27/11551–11556;
(Continued)

(56) References Cited

U.S. PATENT DOCUMENTS 5,915,167 A    6/1999 Leedy
9,576,967 B1    2/2017 Kimura et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Nelson Garces
(74) *Attorney, Agent, or Firm* — The Marbury Law Group PLLC

(57) ABSTRACT

A three-dimensional memory device includes an alternating stack of insulating layers and electrically conductive layers, rows of memory openings vertically extending through the alternating stack, memory opening fill structures located within a first subset of the rows of memory openings, where each of the memory opening fill structures includes a respective memory film and a respective vertical semiconductor channel extending through an opening at a bottom portion of the respective memory film and contacting a respective underlying semiconductor material portion, and dummy memory opening fill structures located within a second subset of the rows of memory openings that do not belong the first subset, where each of the dummy memory opening fill structures includes a respective dummy memory film and a respective dummy vertical semiconductor channel that is electrically isolated from a respective underlying semiconductor material portion by a bottom portion of the respective dummy memory film.

17 Claims, 42 Drawing Sheets

(51) Int. Cl.
    *H01L 27/11556* (2017.01)
    *H01L 27/11519* (2017.01)
    *H01L 21/28* (2006.01)
    *H01L 21/768* (2006.01)
    *H01L 27/11582* (2017.01)
    *H01L 23/522* (2006.01)
    *H01L 23/528* (2006.01)
    *H01L 27/1157* (2017.01)

(52) U.S. Cl.
    CPC ...... *H01L 23/5226* (2013.01); *H01L 23/5283* (2013.01); *H01L 27/1157* (2013.01); *H01L 27/11519* (2013.01); *H01L 27/11524* (2013.01); *H01L 27/11556* (2013.01); *H01L 27/11582* (2013.01); *H01L 29/40114* (2019.08); *H01L 29/40117* (2019.08)

(58) Field of Classification Search
    CPC .......... H01L 27/11578–11582; H01L 23/5283; H01L 27/11519; H01L 27/11565; H01L 27/11573; H01L 29/7883
    See application file for complete search history.

(56) References Cited

U.S. PATENT DOCUMENTS

| | | | |
|---|---|---|---|
| 9,659,956 | B1 | 5/2017 | Pachamuthu et al. |
| 9,754,963 | B1 | 9/2017 | Kawamura et al. |
| 9,786,681 | B1 | 10/2017 | Ariyoshi |
| 9,853,038 | B1 | 12/2017 | Cui |
| 9,881,929 | B1 | 1/2018 | Ravikirthi et al. |
| 9,887,207 | B2 | 2/2018 | Zhang et al. |
| 9,905,573 | B1 | 2/2018 | Mada et al. |
| 9,978,766 | B1 | 5/2018 | Hosoda et al. |
| 10,014,316 | B2 | 7/2018 | Yu et al. |
| 10,115,632 | B1 | 10/2018 | Masamori et al. |
| 10,141,331 | B1 | 11/2018 | Suzuki et al. |
| 10,256,245 | B2 | 4/2019 | Ariyoshi |
| 10,269,820 | B1 | 4/2019 | Kaminaga |
| 10,381,434 | B1 | 8/2019 | Pachamuthu et al. |
| 10,475,879 | B1 | 11/2019 | Pachamuthu et al. |
| 2016/0049421 | A1 | 2/2016 | Zhang et al. |
| 2017/0287926 | A1 | 10/2017 | Ariyoshi |
| 2018/0061850 | A1 | 3/2018 | Mada et al. |
| 2018/0108671 | A1 | 4/2018 | Yu et al. |
| 2018/0130812 | A1 | 5/2018 | Hosoda et al. |
| 2018/0151672 | A1* | 5/2018 | Choi .................. H01L 27/1157 |
| 2018/0261613 | A1 | 9/2018 | Ariyoshi |
| 2018/0301374 | A1 | 10/2018 | Masamori et al. |
| 2018/0342531 | A1 | 11/2018 | Susuki et al. |

OTHER PUBLICATIONS

U.S. Appl. No. 16/276,952, filed Feb. 15, 2019, SanDisk Technologies LLC.
U.S. Appl. No. 16/276,996, filed Feb. 15, 2019, SanDisk Technologies LLC.
U.S. Appl. No. 16/284,240, filed Feb. 25, 2019, SanDisk Technologies LLC.
U.S. Appl. No. 16/361,773, filed Mar. 22, 2019, SanDisk Technologies LLC.
U.S. Appl. No. 16/368,007, filed Mar. 28, 2019, SanDisk Technologies LLC.

* cited by examiner

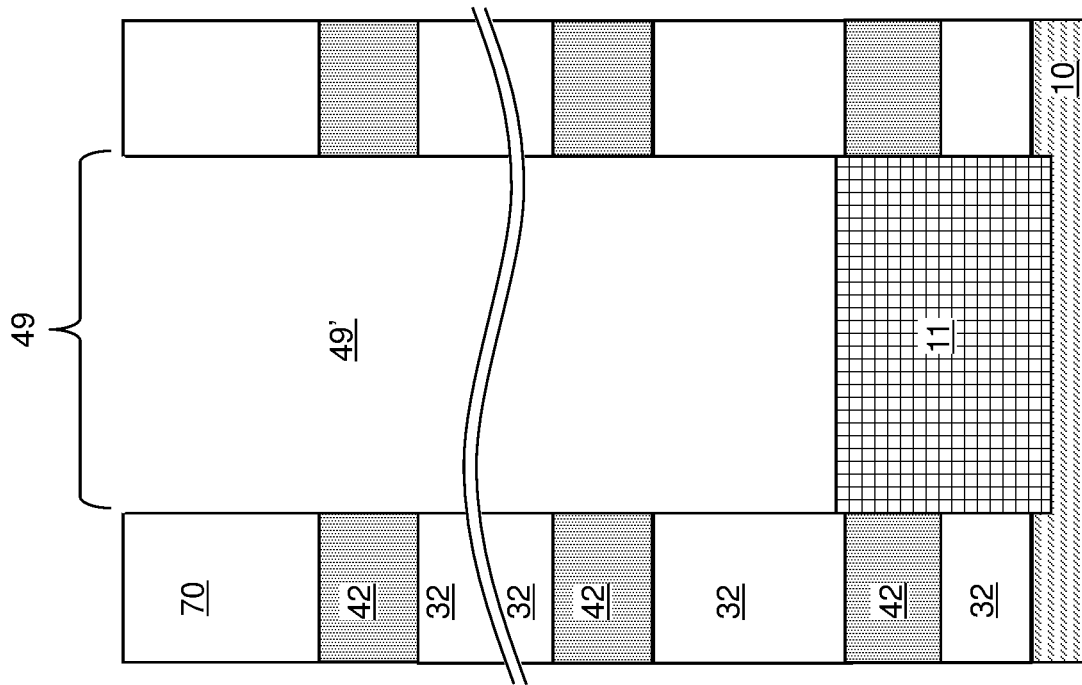
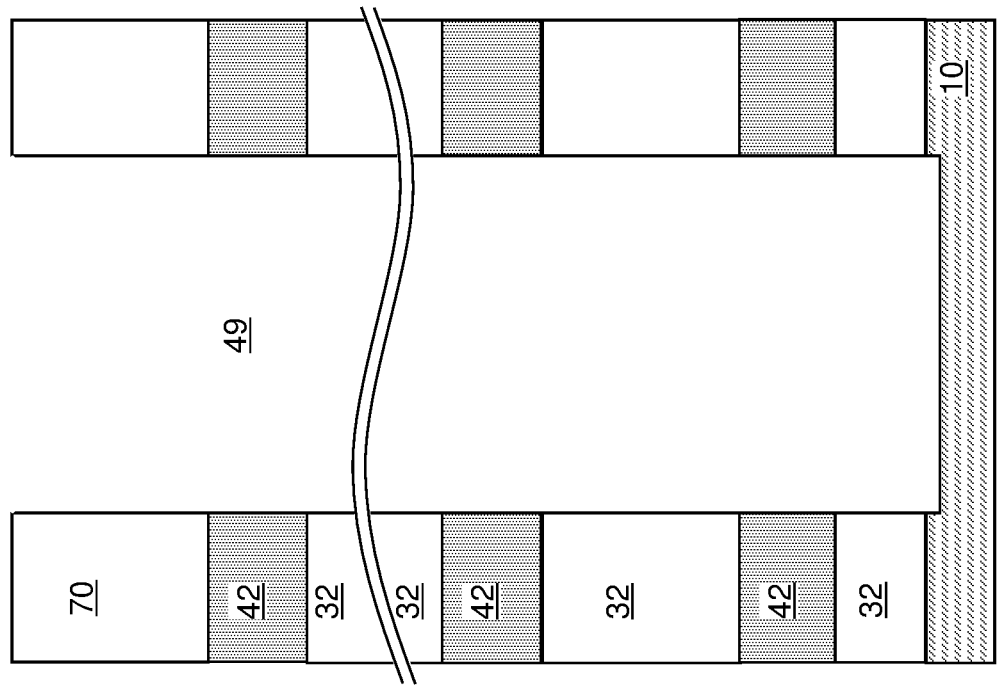

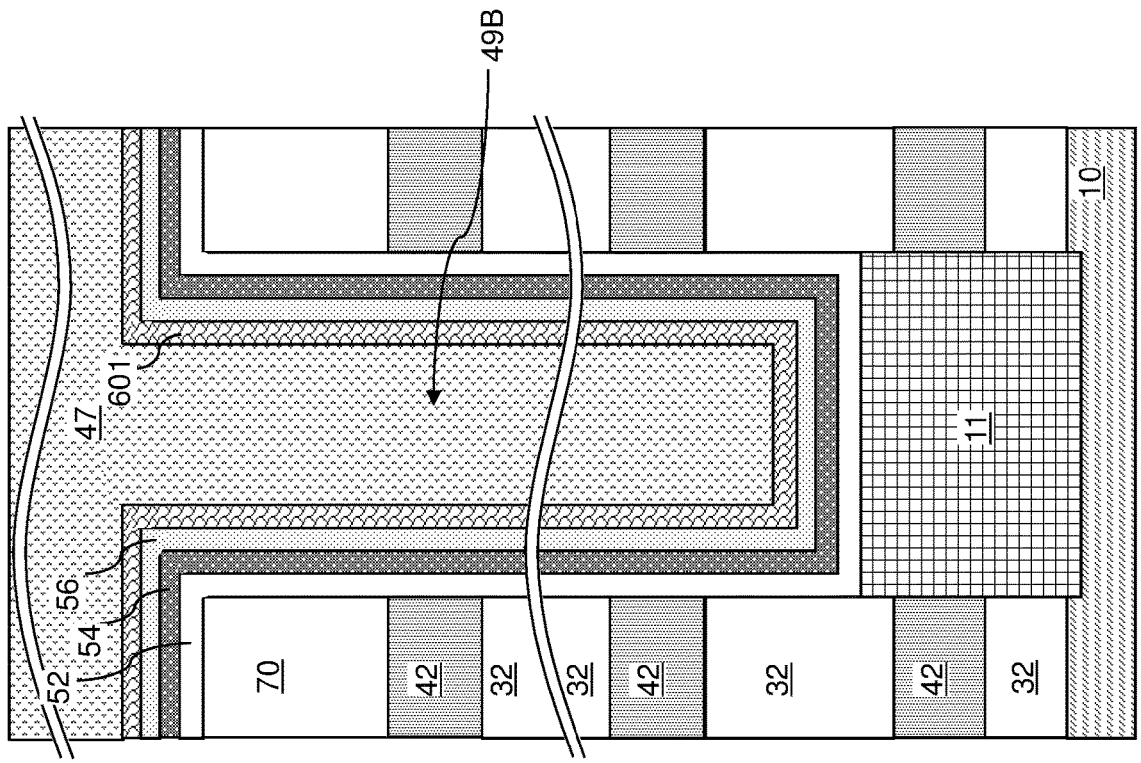
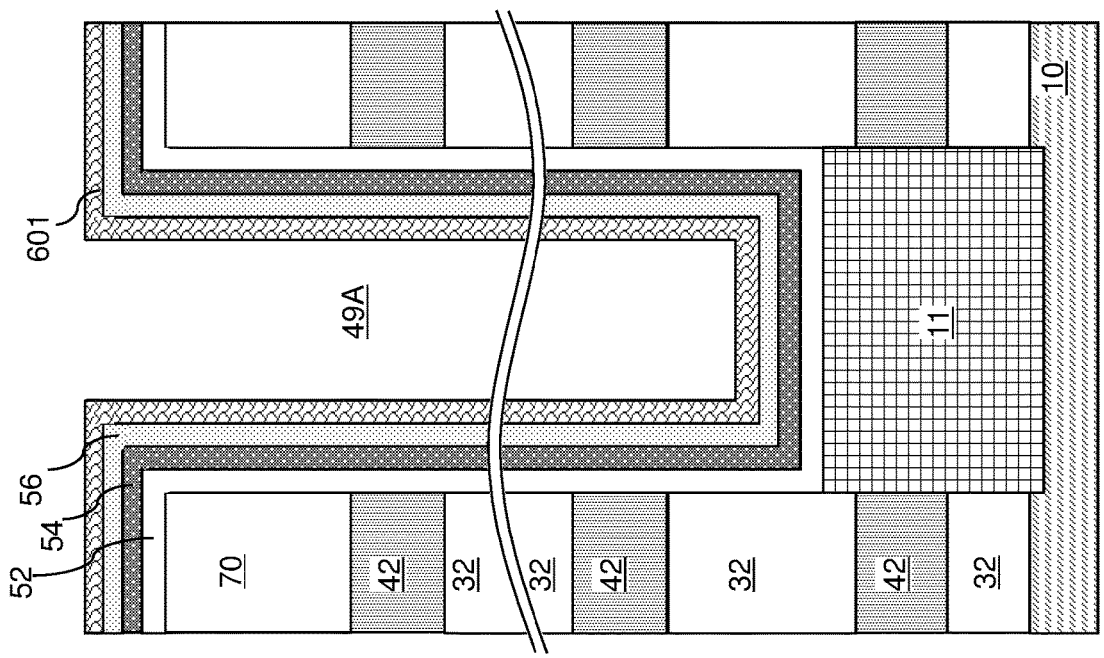
FIG. 8B
FIG. 8A

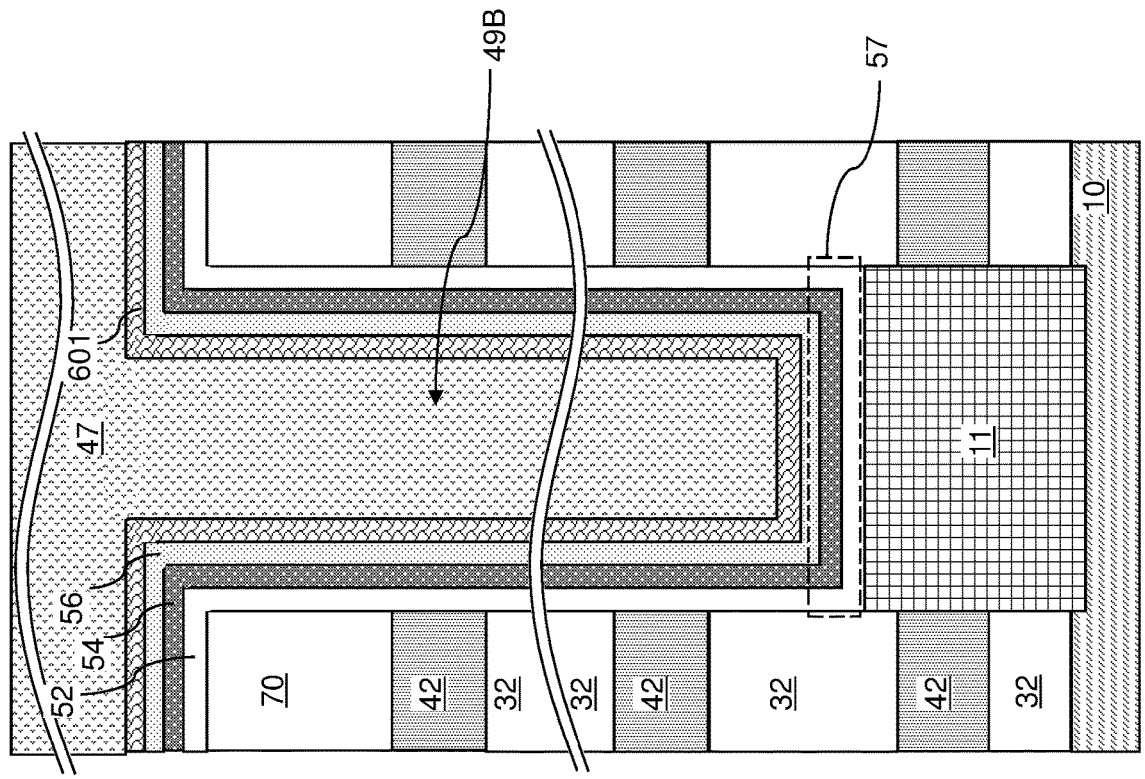
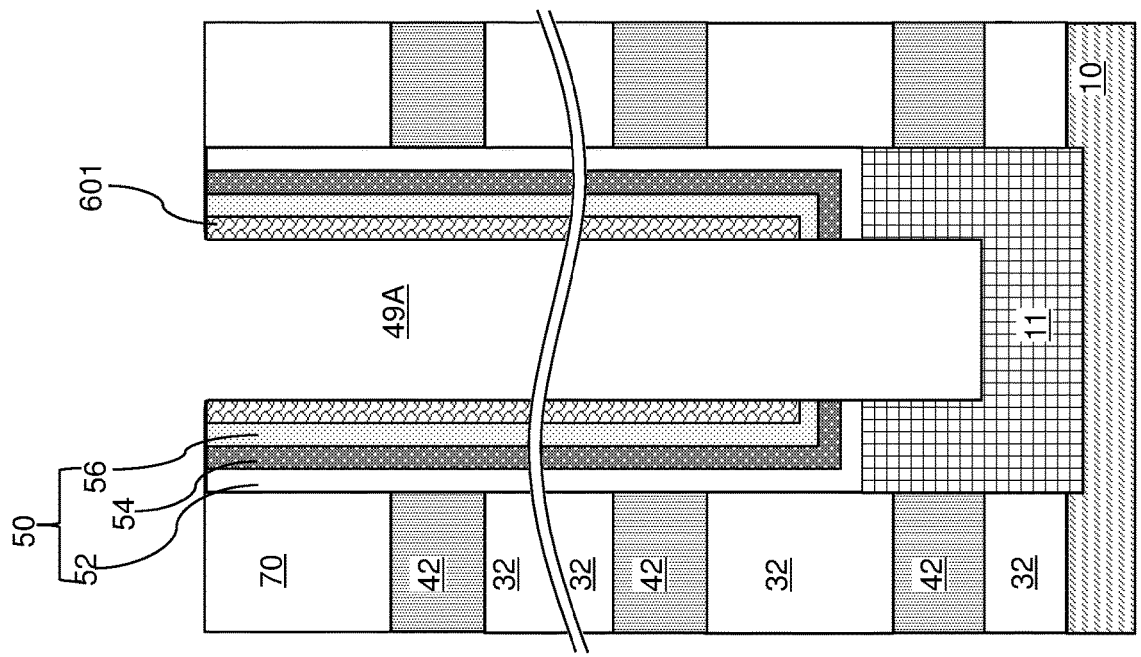

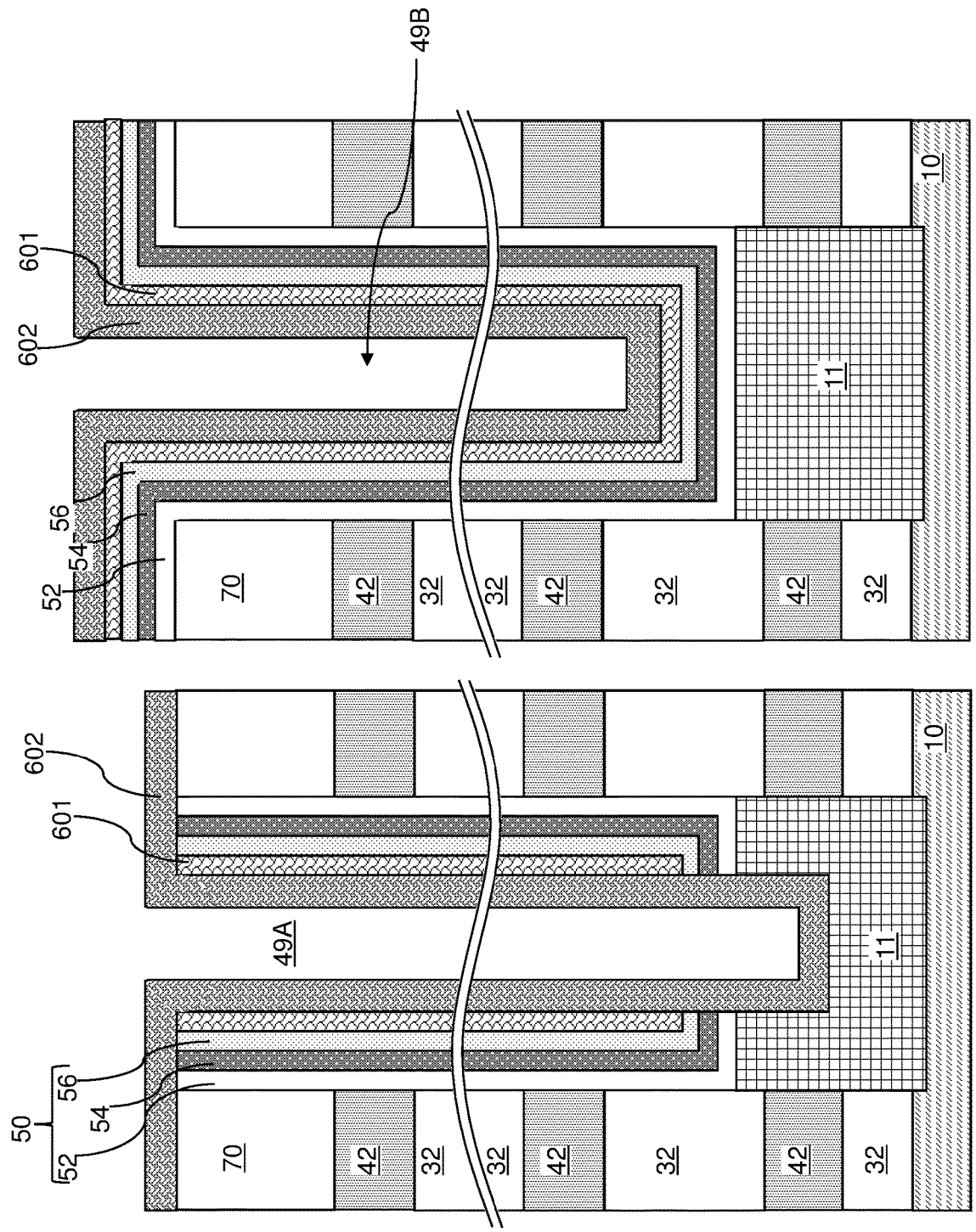

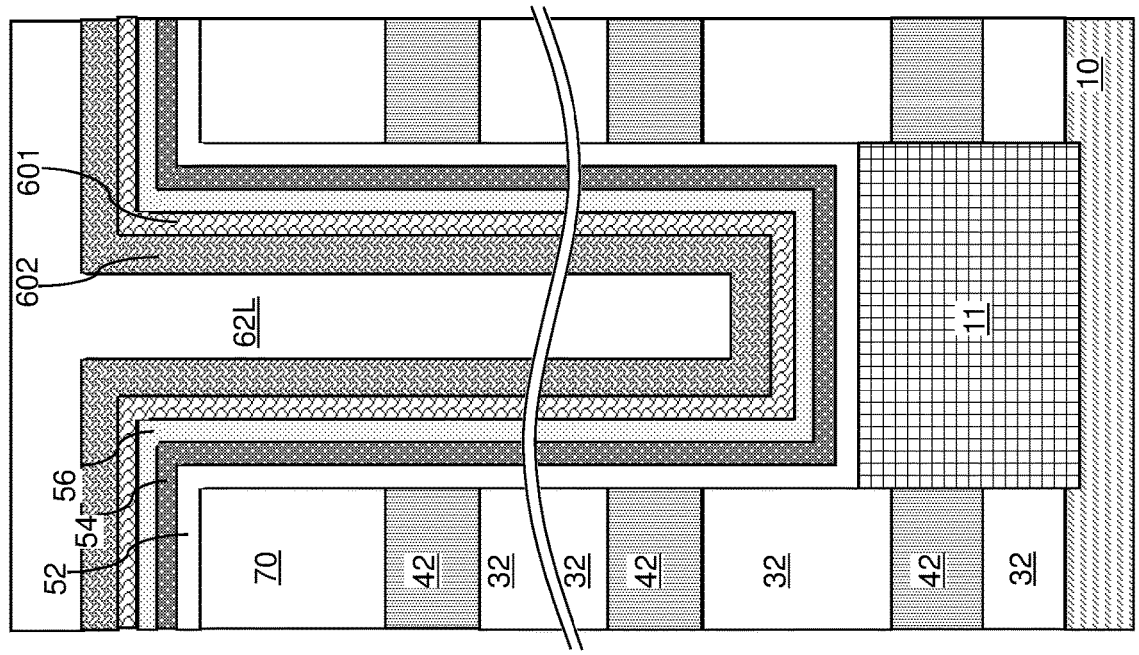
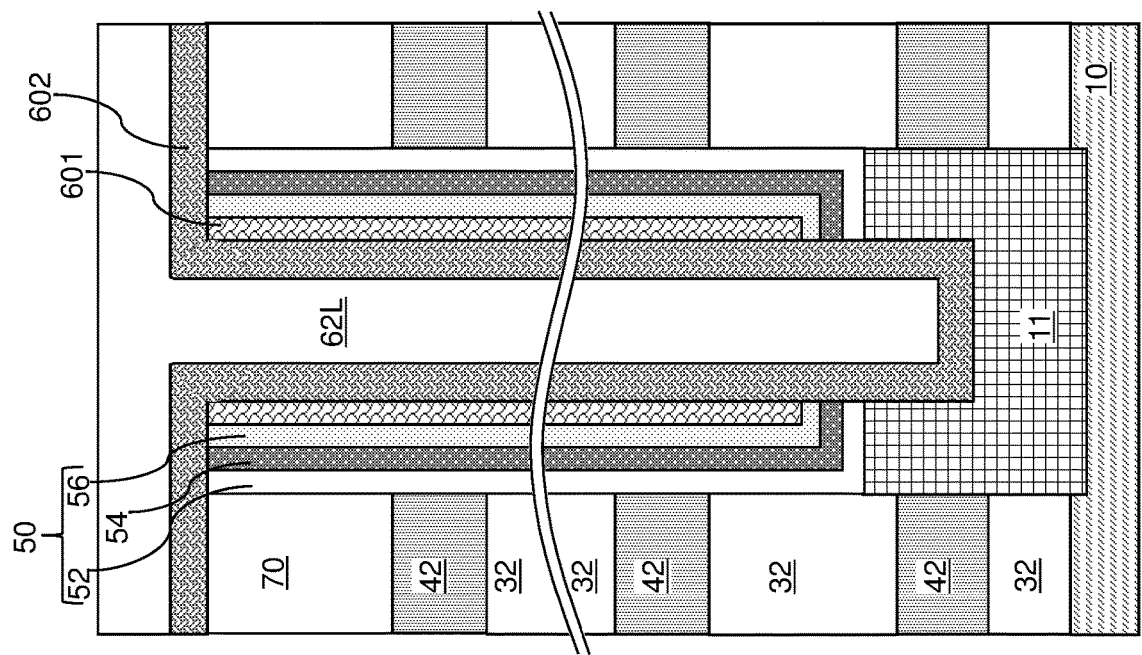

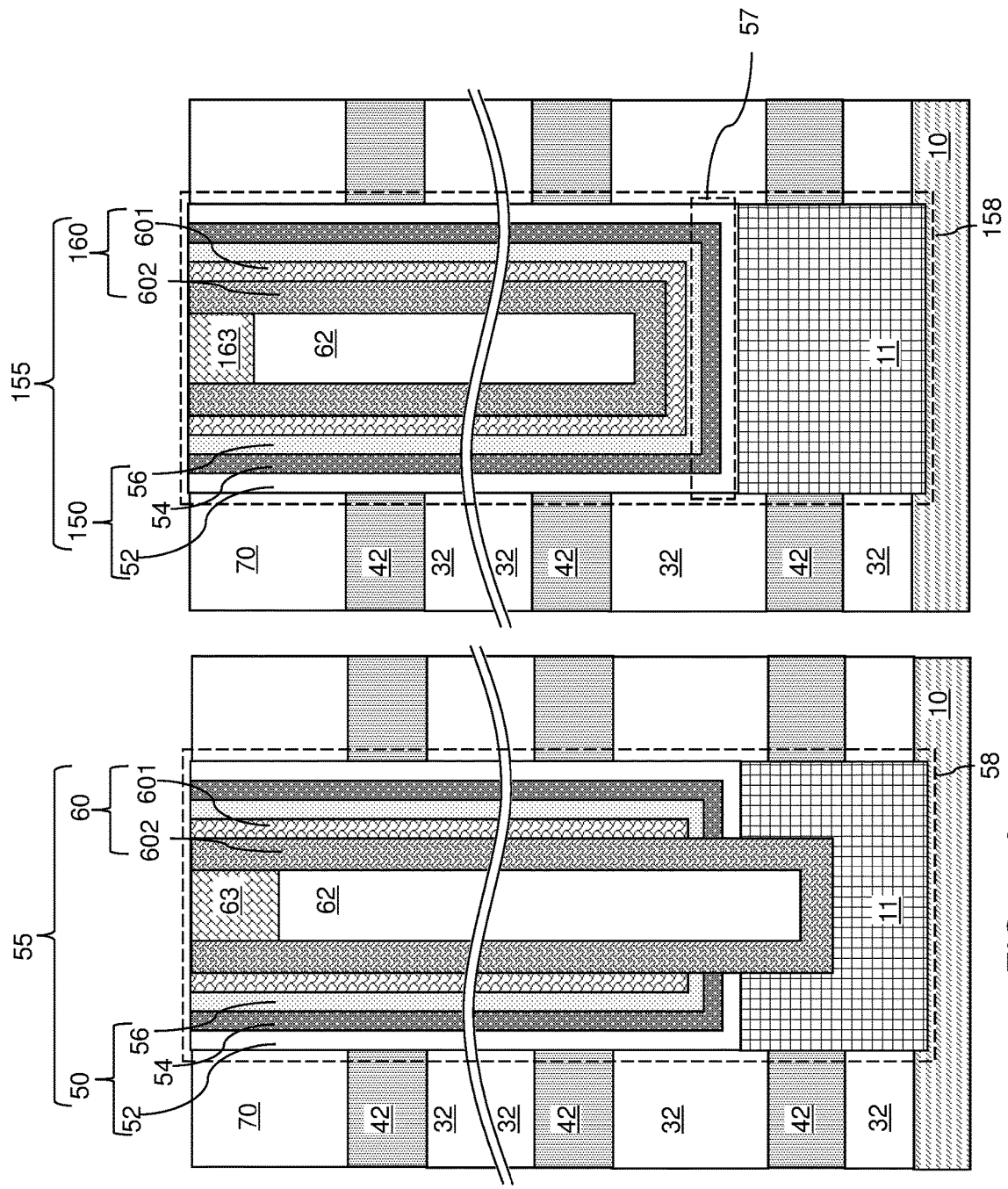

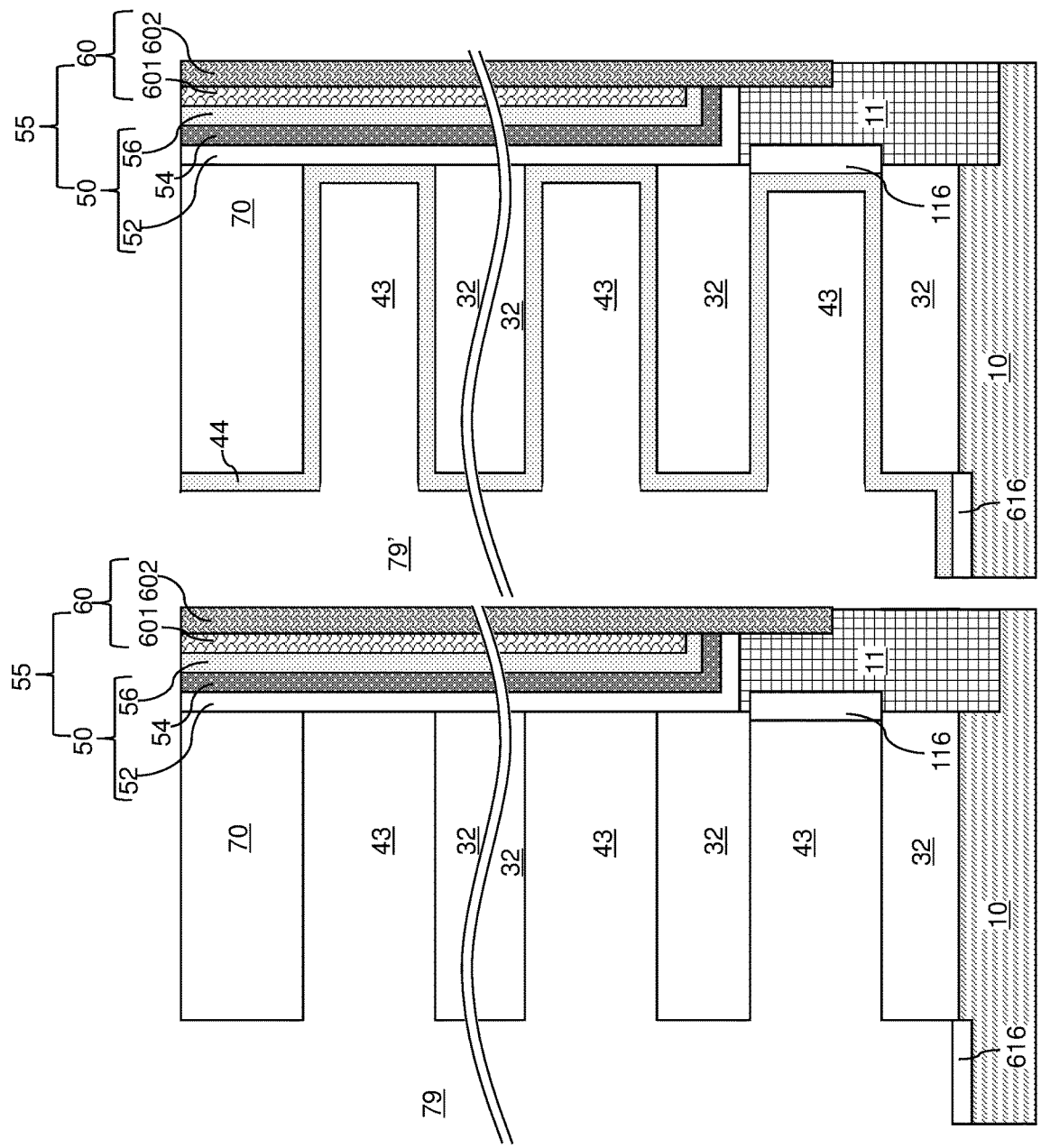

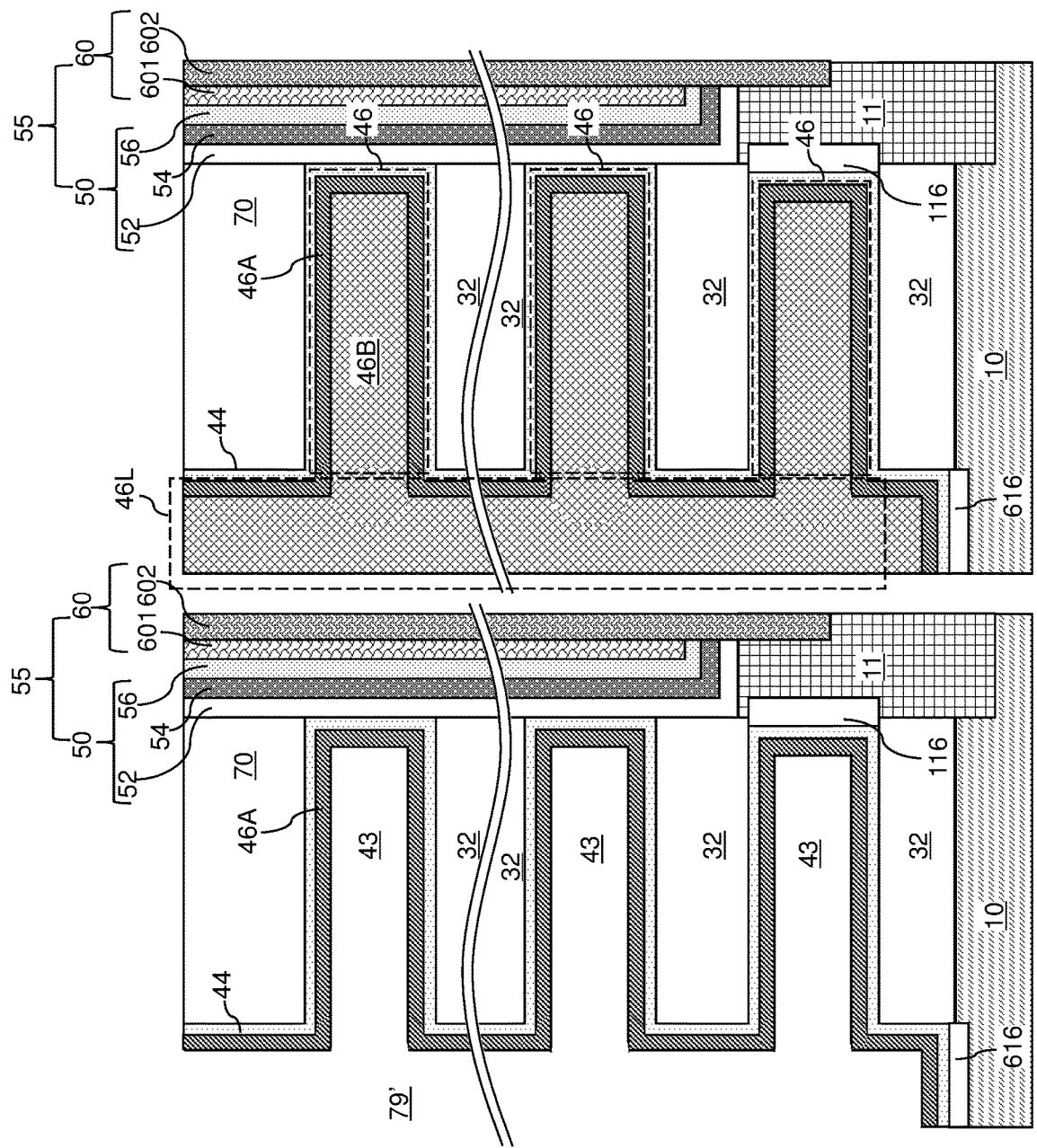

THREE-DIMENSIONAL MEMORY DEVICE CONTAINING A DUMMY MEMORY FILM ISOLATION STRUCTURE AND METHOD OF MAKING THEREOF

FIELD

The present disclosure relates generally to the field of semiconductor devices, and particularly to a three-dimensional memory device including memory opening fill structures containing a dummy memory film which isolates the bottom of the dummy vertical channel from the substrate and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; rows of memory openings vertically extending through the alternating stack; memory opening fill structures located within a first subset of the rows of memory openings, wherein each of the memory opening fill structures comprises a respective memory film and a respective vertical semiconductor channel extending through an opening at a bottom portion of the respective memory film and contacting a respective underlying semiconductor material portion; and dummy memory opening fill structures located within a second subset of the rows of memory openings that do not belong the first subset, wherein each of the dummy memory opening fill structures comprises a respective dummy memory film and a respective dummy vertical semiconductor channel that is electrically isolated from a respective underlying semiconductor material portion by a bottom portion of the respective dummy memory film.

According to another aspect of the present disclosure, a method of forming a three-dimensional memory device is provided, which comprises the steps of: forming an alternating stack of insulating layers and spacer material layers over a substrate, wherein the spacer material layers are formed as, or are subsequently replaced with, electrically conductive layers; forming rows of memory openings extending through each layer within the alternating stack down to the substrate; forming a continuous memory film that extends into each of the memory openings; forming a patterned etch mask layer that masks portions of the continuous memory film, wherein a first subset of the memory openings is not covered by the patterned etch mask layer and a second subset of the memory openings that includes a single row of memory openings is covered by the patterned etch mask layer; forming connection openings by anisotropically etching through bottom portions of the continuous memory film located within the first subset of the rows of memory openings; removing the patterned etch mask layer; and forming memory opening fill structures within the first subset of rows of memory openings and dummy memory opening fill structures within the second subset of the rows of memory openings, wherein each of the memory opening fill structures comprises a respective memory film that is a respective remaining portion of the continuous memory film and a respective vertical semiconductor channel extending through a respective connection opening and contacting a respective first underlying semiconductor material portion, and wherein each of the dummy memory opening fill structures comprises a respective dummy memory film that is a respective remaining portion of the continuous memory film and a respective dummy vertical semiconductor channel that is electrically isolated from a respective second underlying semiconductor material portion by a bottom portion of the respective dummy memory film.

BRIEF DESCRIPTION OF THE DRAWINGS

FIGS. 5A-5C are sequential schematic vertical cross-sectional views of a memory opening within the exemplary structure up to the processing steps for forming a continuous memory film according to an embodiment of the present disclosure.

FIG. 8A is vertical cross-sectional view of a memory opening within a first subset of memory openings along the vertical plane X-X' of FIG. 6B or 7B.

FIG. 8B is a vertical cross-sectional view of a memory opening within a second subset of memory openings along the vertical plane Y-Y' of FIG. 6B or 7B.

FIG. 9A is vertical cross-sectional view of a memory opening within a first subset of memory openings after an anisotropic etch process according to an embodiment of the present disclosure.

FIG. 9B is a vertical cross-sectional view of a memory opening within a second subset of memory openings at the anisotropic etch process.

FIG. 10A is vertical cross-sectional view of a memory opening within a first subset of memory openings after deposition of a second semiconductor channel layer according to an embodiment of the present disclosure.

FIG. 10B is a vertical cross-sectional view of a memory opening within a second subset of memory openings after deposition of the second semiconductor channel layer.

FIG. 11A is vertical cross-sectional view of a memory opening within a first subset of memory openings after deposition of a dielectric core material layer according to an embodiment of the present disclosure.

FIG. 11B is a vertical cross-sectional view of a memory opening within a second subset of memory openings after deposition of the dielectric core material layer.

FIG. 13A is vertical cross-sectional view of a memory opening within a first subset of memory openings after formation of drain regions according to an embodiment of the present disclosure.

FIG. 13B is a vertical cross-sectional view of a memory opening within a second subset of memory openings after formation of the drain regions.

FIGS. 19A-19D are sequential vertical cross-sectional views of a region of the exemplary structure during formation of electrically conductive layers according to an embodiment of the present disclosure.

DETAILED DESCRIPTION

Figure 1:
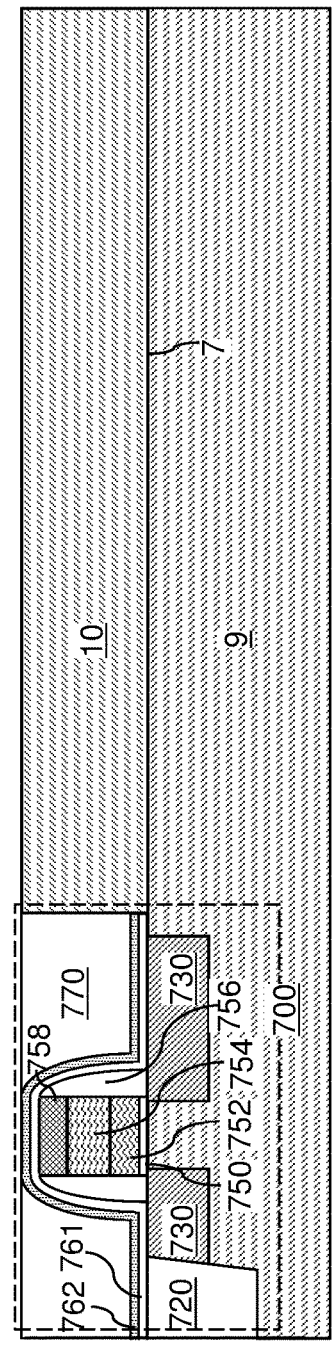
FIG. 1 is a schematic vertical cross-sectional view of an exemplary structure after formation of at least one peripheral device and a semiconductor material layer according to an embodiment of the present disclosure.

As discussed above, the embodiments of the present disclosure are directed to three-dimensional memory device containing a dummy memory film which electrically isolates the bottom of the dummy vertical channel from the horizontal channel located in substrate and methods of making thereof, the various aspects of which are described below. The embodiments of the disclosure may be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated employing the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming A page is also the smallest unit that may be selected to a read operation.

Referring to FIG. 1, an exemplary structure according to an embodiment of the present disclosure is illustrated, which may be employed, for example, to fabricate a device structure containing vertical NAND memory devices. The exemplary structure includes a substrate (9, 10), which may be a semiconductor substrate. The substrate may include a substrate semiconductor layer 9 and an optional semiconductor material layer 10. The substrate semiconductor layer 9 maybe a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, at least one semiconductor device 700 for a peripheral circuitry may be formed on a portion of the substrate semiconductor layer 9. The at least one semiconductor device may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants employing the at least one gate structure (750, 752, 754, 758) as masking structures. Additional masks may be employed as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry may contain a driver circuit for memory devices to be subsequently formed, which may include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be employed for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200. In an alternative embodiment, the at least one semiconductor device 700 may be formed on a separate substrate and then bonded to substrate (9, 10) containing the memory array region 100.

Figure 2:
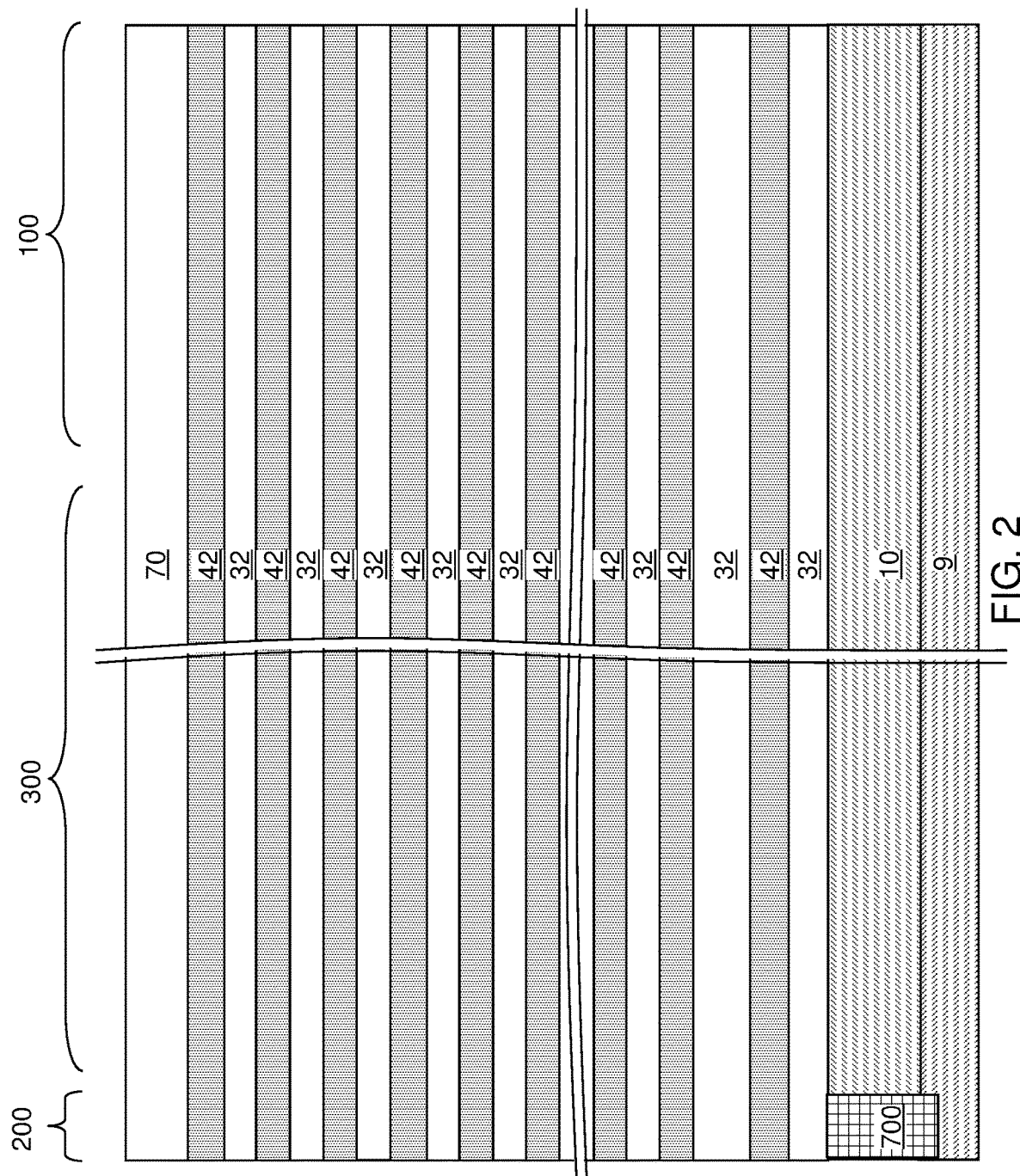
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which may be insulating layers 32) and second material layers (which may be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is employed for the insulating layers 32, tetraethyl orthosilicate (TEOS) may be employed as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be employed for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be employed. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be employed for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3:
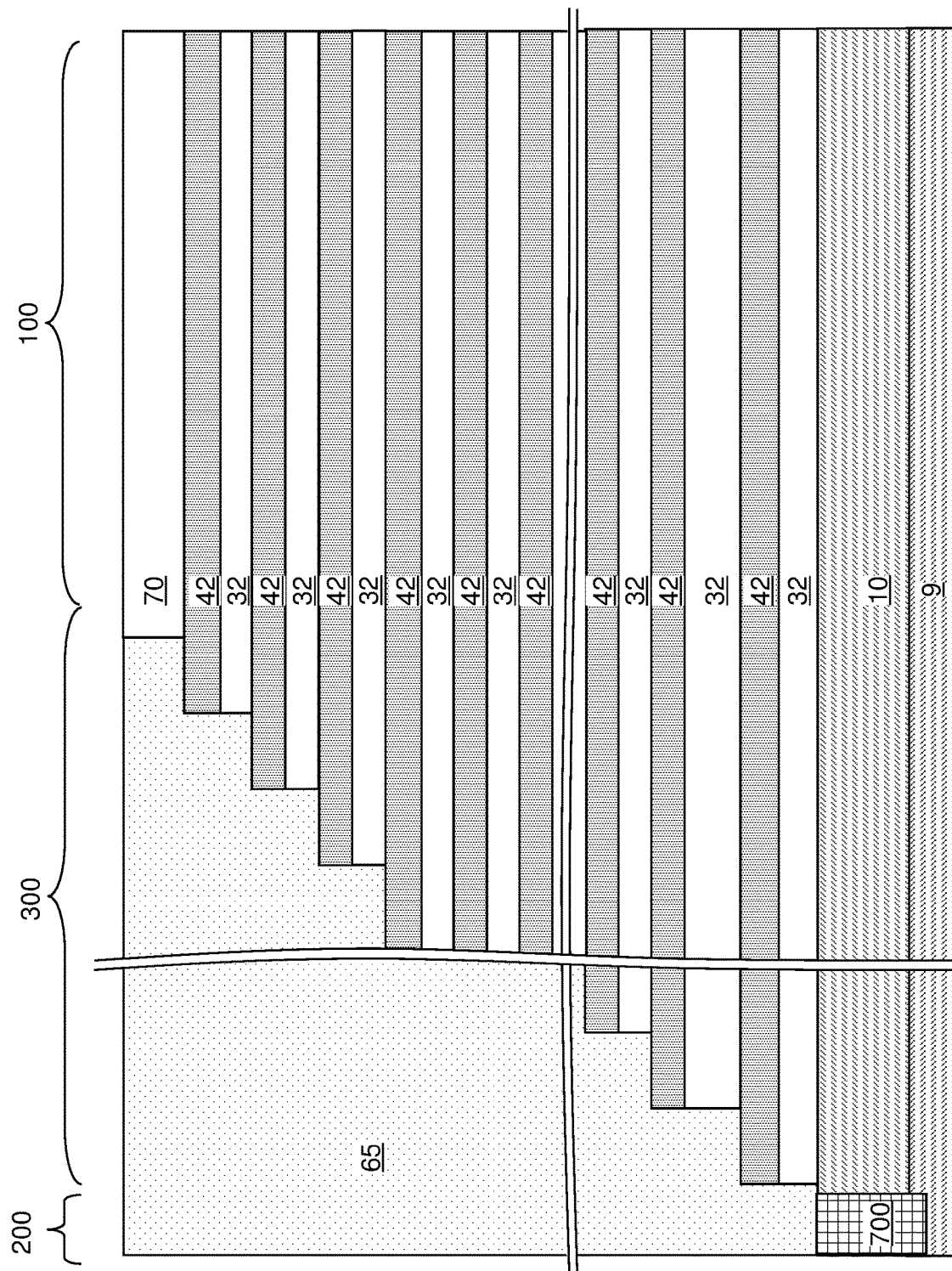
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 4A:
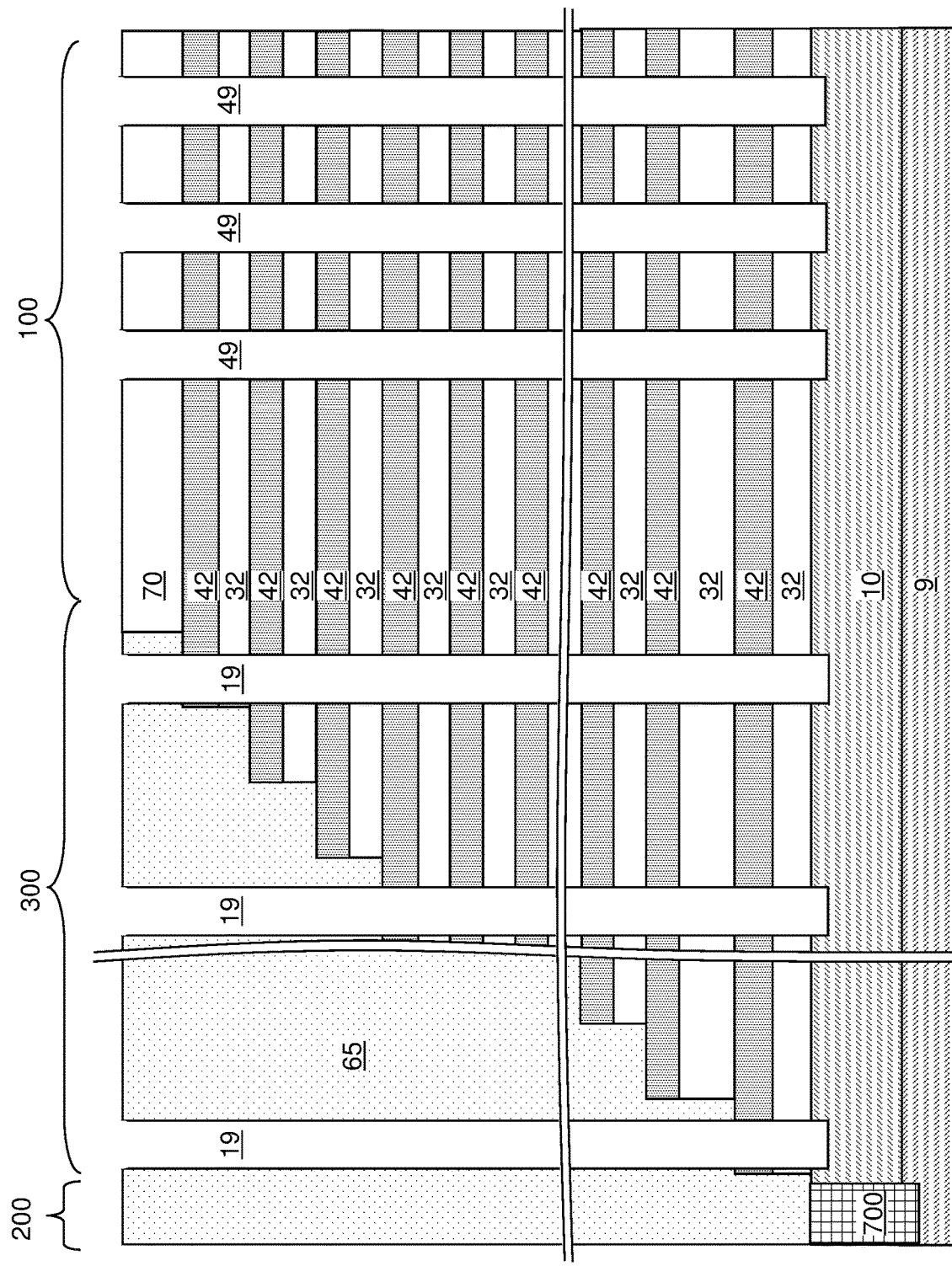
FIG. 4A is a schematic vertical cross-sectional view of the exemplary structure after formation of memory openings and support openings according to an embodiment of the present disclosure.
Figure 4B:
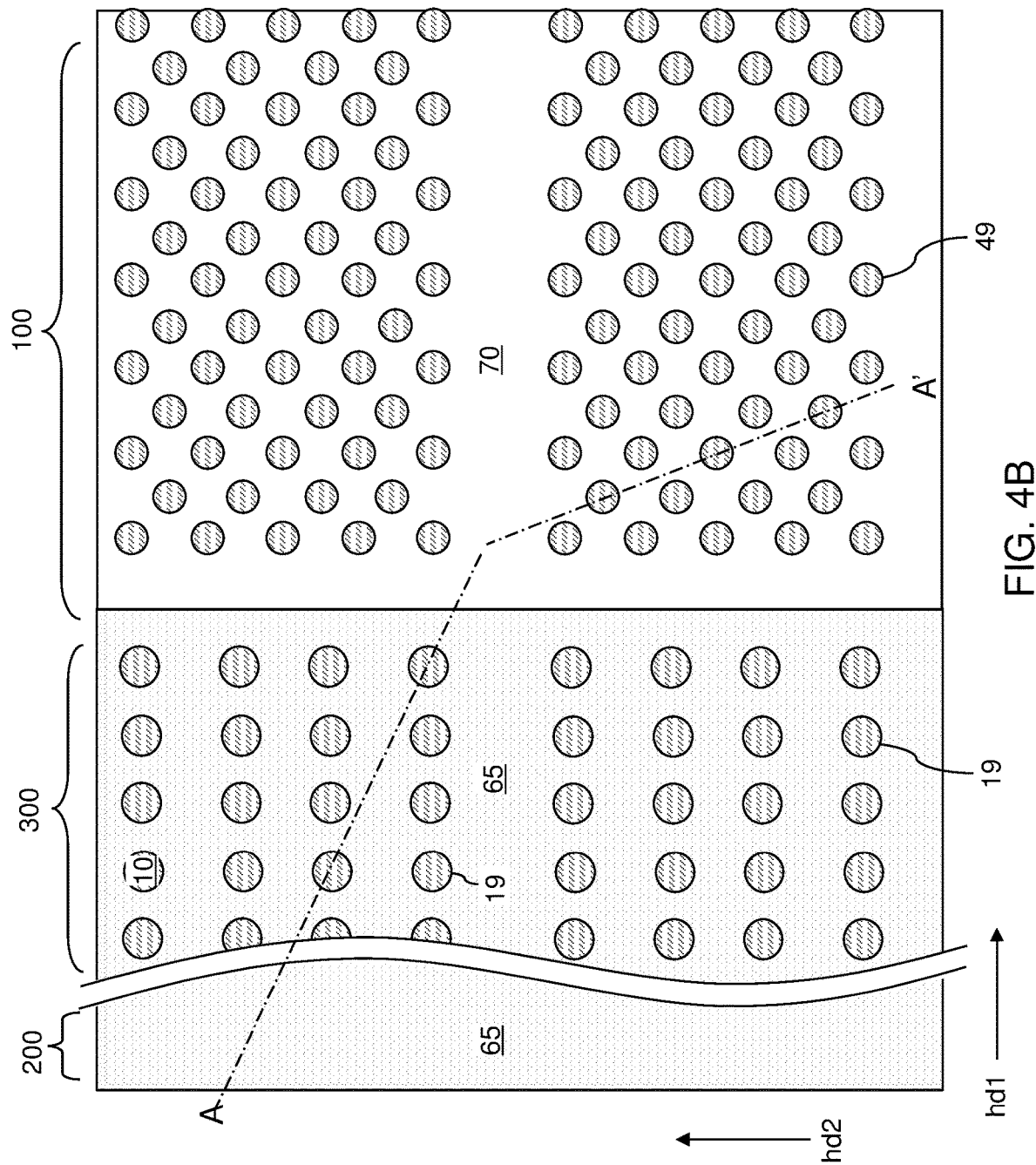
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be employed. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100.

A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

Figure 5C:
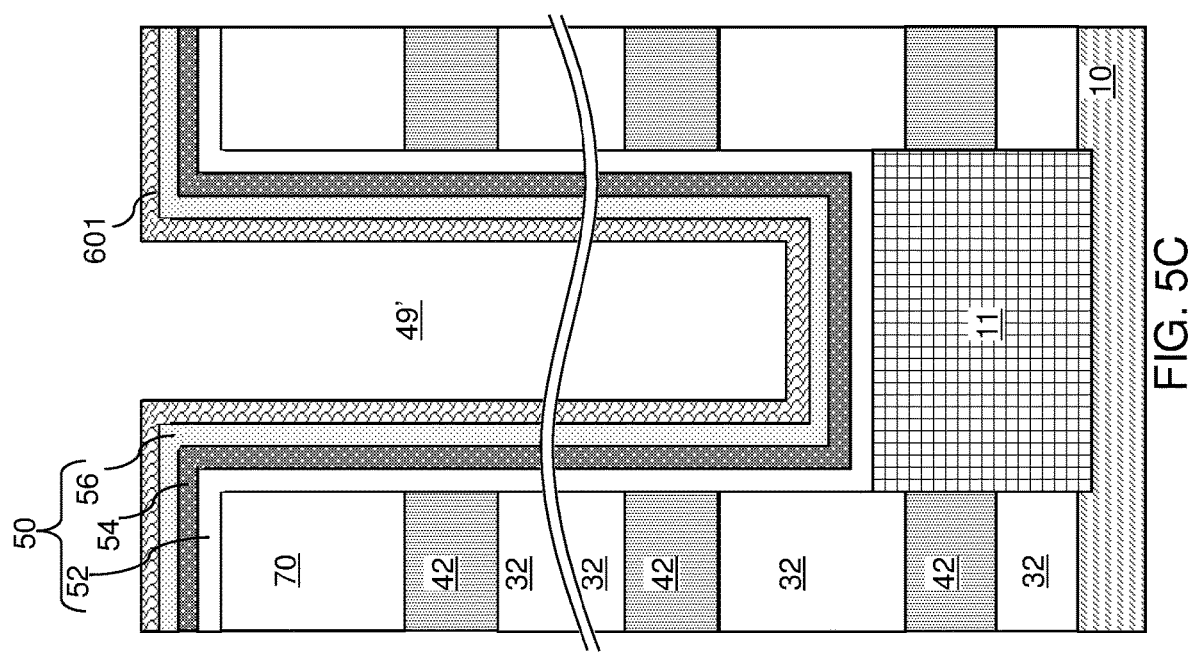

FIGS. 5A-5C illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be employed. Optionally, the sacrificial material layers 42 may be laterally recessed partially to form lateral recesses (not shown), for example, by an isotropic etch.

Referring to FIG. 5B, an optional pedestal channel portion (e.g., an epitaxial pedestal) 11 may be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 may be formed above a horizontal plane including the top surface of a bottommost sacrificial material layer 42. In this case, a source select gate electrode may be subsequently formed by replacing the bottommost sacrificial material layer 42 with a conductive material layer. The pedestal channel portion 11 may be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Referring to FIG. 5C, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be employed. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be employed. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if employed, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be employed.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be employed. A memory cavity 49' is formed in the volume of each memory opening 49 that is not filled with the deposited material layers (52, 54, 56, 601). The stack of the blocking dielectric layer 52, the charge storage layer 54, the tunneling dielectric layer 56 constitutes a memory film 50.

Referring to FIGS. 6A, 6B, 8A, and 8B, a patterned etch mask layer 47 may be formed over the exemplary structure. The patterned etch mask layer 47 may be a photoresist layer that is applied over the exemplary structure, and is lithographically patterned to cover all of the support openings 19 and a subset of the memory openings 49B without covering another subset of the memory openings 49A. The subset of the memory openings 49A that are not masked by the patterned etch mask layer 47 is herein referred to as a first subset of the memory openings 49A. The subset of the memory openings 49B that are masked by the patterned etch mask layer 47 is herein referred to as a second subset of the memory openings 49B.

According to an aspect of the present disclosure, the second subset of the memory openings 49B are selected such that the second subset of the memory openings 49B includes all memory openings 49B in which dummy memory opening fill structures are to be subsequently formed. As used herein, a "dummy" structure refers to a structure that is not electrically connected to a bit line and does not include any intentionally electrically active element therein. An "electrically active" element refers to an element into which, through which, or out of which, electrical current may intentionally (i.e., by an intentional programming, erasing or reading control step) flow at least temporarily by electrical conduction or by charge tunneling. As such, a "dummy memory opening fill structure" refers to a structure that partially fills a respective memory opening 49B without including any electrically active element therein. In other words, all components within a dummy memory opening structure are electrically inactive components through which, into which, and out of which, electrical current does not flow. Thus, a dummy memory opening fill structure cannot be employed to store electrical charges or to store any information in any other manner. In contrast, the first subset of memory openings 49A include all memory openings 49A in which a respective memory opening fill structure is subsequently formed. Each memory opening fill structure includes at least one electrically active element, i.e., an element into which, through which, or out of which electrical current may flow.

In one embodiment, the memory openings 49 may be arranged as blocks 490 (e.g., memory blocks) of memory openings 49 that are laterally spaced apart from each other along the second horizontal direction (e.g., bit line direction) hd2. In one embodiment, each block 490 of memory openings 49 may include a plurality of rows of memory openings 49. Memory openings 49 within each row of memory openings 49 may be arranged along the first horizontal direction (e.g., word line direction) hd1 with a uniform pitch, which is herein referred to as an intra-row pitch. In other words, all rows of memory openings 49 may include a respective subset of memory openings 49 that are arranged as a one-dimensional periodic array that is periodic along the first horizontal direction hd1 with the intra-row pitch.

The number of rows of memory openings 49 within each block 490 of memory openings may be at least 3, and may be n×g+(g−1), in which n is an integer greater than 1 and g is a positive integer greater than 1. In this case, the integer n represents a total number of rows of memory openings 49 between each neighboring pair of laterally-extending divider structures to be subsequently formed. The laterally-extending divider structures to be subsequently formed include backside trenches and drain-select-level isolation structures. The backside trenches are trenches to be subsequently formed between neighboring blocks 490 of memory openings. In other words, each backside trench is formed in an area between a neighboring pair of blocks 490 of memory openings 49. The drain-select-level isolation structures are dielectric material portions to be subsequently formed through at least one sacrificial material layer 42 including the topmost sacrificial material layer 42, which are later replaced with electrically conductive layers which function as drain select gate electrodes of drain select transistors of each vertical NAND string. Preferably, the drain-select-level isolation structures do not extend through the sacrificial material layers 42 which are later replaced with electrically conductive layers which function as word lines/control gate electrodes and as source select gate electrodes of source select transistors of each vertical NAND string. Each drain-select-level isolation structure is formed over a respective row of memory openings 49B within the second subset of the memory openings 49B (i.e., the subset of the memory openings 49B that are covered by the patterned etch mask layer 47) in a subsequent processing step.

At least one drain-select-level isolation structure which separates the drain select gate electrodes in the same memory block is to be later formed within the area of each block 490 of memory openings 49. Each drain-select-level isolation structure laterally extends along the first horizontal direction hd1, and is formed over an area of a respective row of memory openings 49B. The area of each drain-select-level isolation structure to be subsequently formed may overlap with the area of a respective row of memory openings 49B within the second subset of memory openings 49B (i.e., the subset of the memory openings 49B that are covered by the patterned etch mask layer 47). The at least one drain-select-level isolation structure within the area of a block 490 of memory openings 49 divides the area of the block 490 into multiple areas each having separate drain select gate electrodes and each including a respective group of rows of memory openings 49A. The total number of groups of rows of memory openings 49A within each block 490 of memory openings 49 is the integer g and the integer n represents the number of rows of memory openings 49A within each group of memory openings 49A.

Figure 6A:
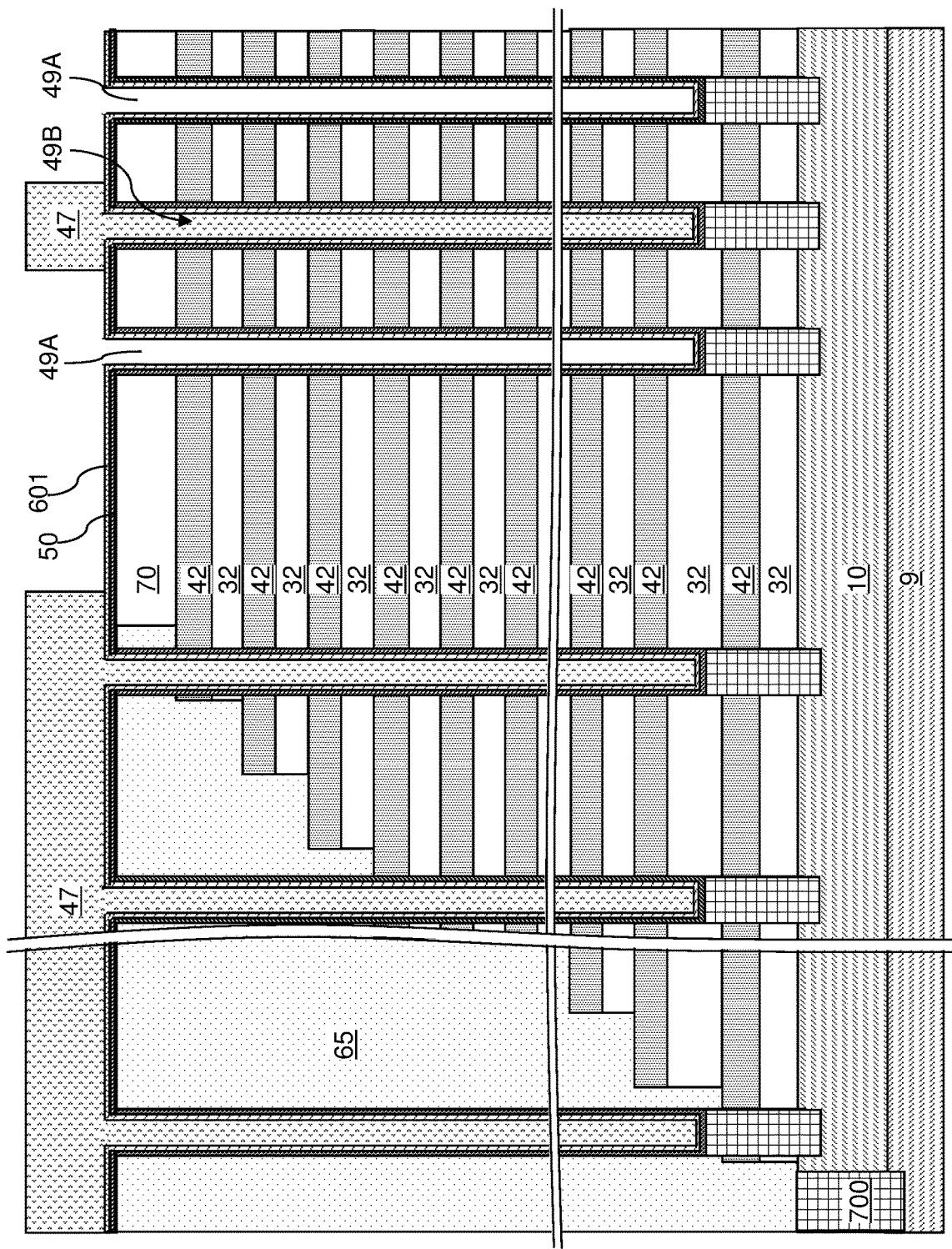
FIG. 6A is a vertical cross-sectional view of the exemplary structure after formation of a patterned etch mask layer according to an embodiment of the present disclosure.
Figure 6B:
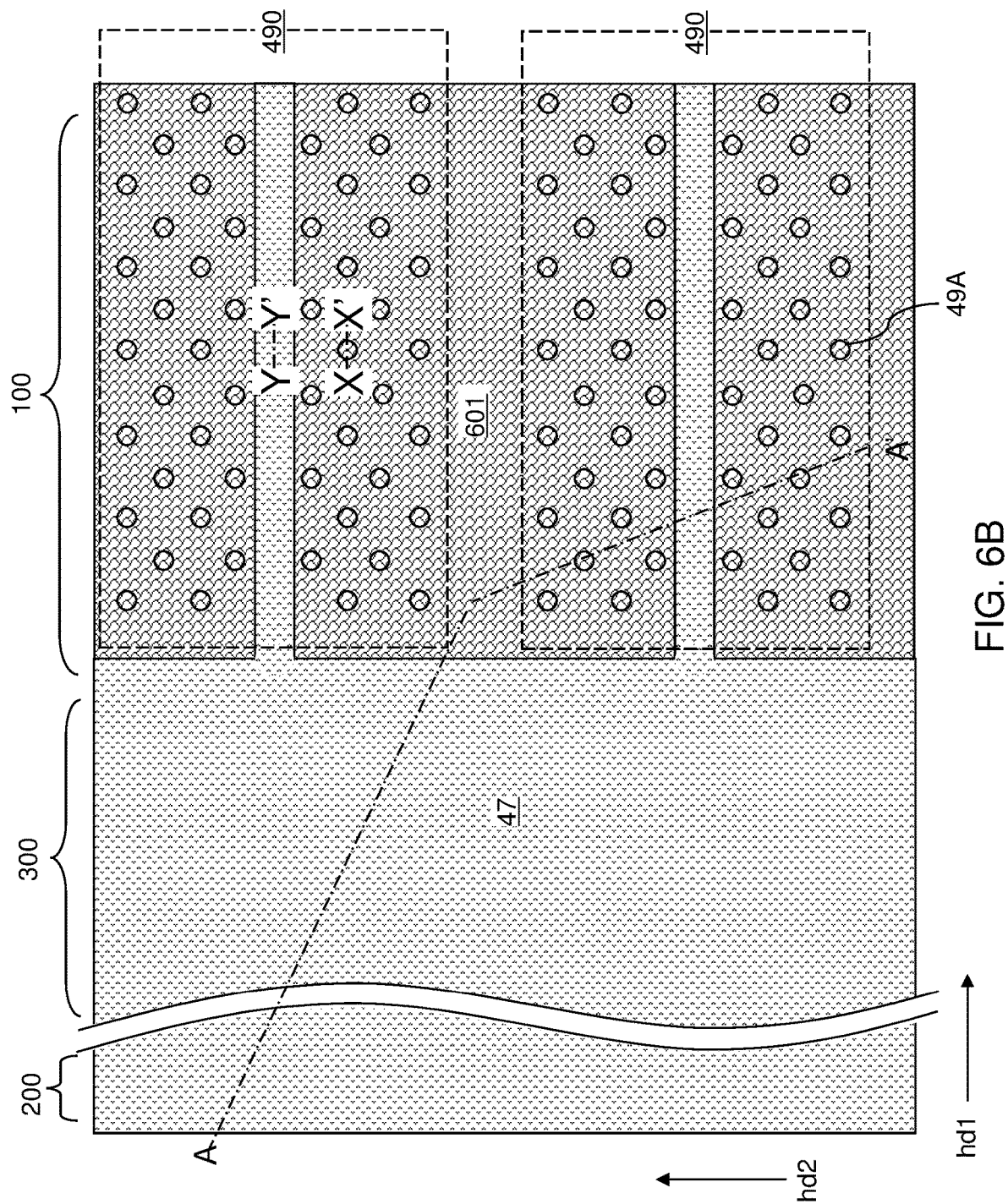
FIG. 6B is a top-down view of the exemplary structure of FIG. 6A.
Figure 7A:
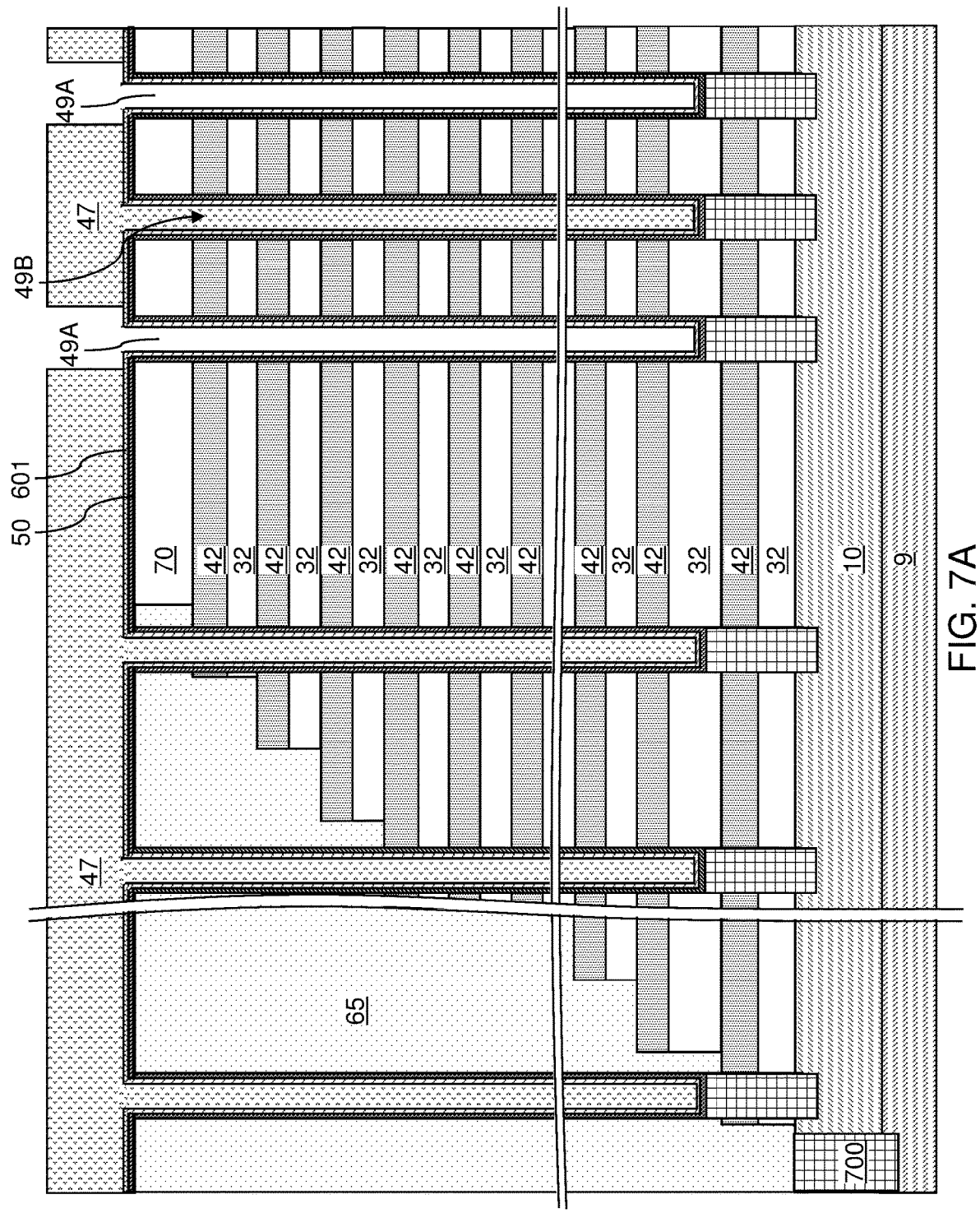
FIG. 7A is a vertical cross-sectional view of an alternative embodiment of the exemplary structure after formation of a patterned etch mask layer according to an embodiment of the present disclosure.
Figure 7B:
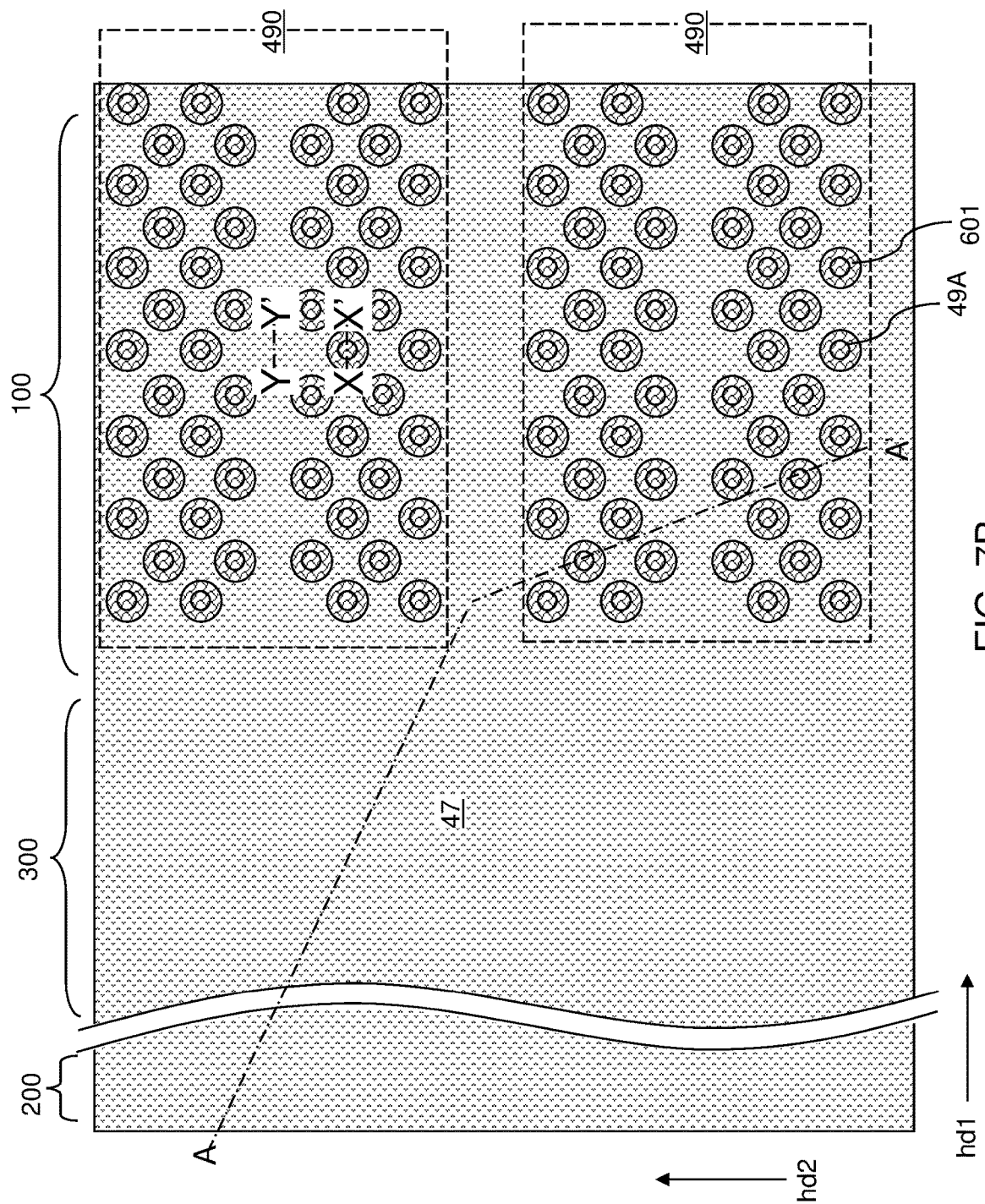
FIG. 7B is a top-down view of the alternative embodiment of the exemplary structure of FIG. 7A.

In the illustrated example in FIG. 6B, the number g is 2, and the number n is 4. The total number of rows of memory openings 49 within each block 490 of memory openings 49 includes (4×2)+(2−1)=9. Each block 490 of memory openings 49 includes two groups of rows of memory openings 49A (which belong to the first subset of memory openings 49A) that are laterally divided by a row of memory openings 49B (which belong to the second subset of memory openings 49B, and thus, are covered by the patterned etch mask layer 47). While the present embodiment contains g=2 and n=4, embodiments in which different integers are employed for either g or n are expressly contemplated herein.

In one embodiment, the patterned etch mask layer 47 may cover the entire area of the staircase region 300 and the peripheral device region 200. The patterned etch mask layer 47 may include straight edges that extend along the second horizontal direction hd2 at, or in proximity to, the boundary between the memory array region 100 and the staircase region 300. Further, the patterned etch mask layer 47 may include pairs of straight edges that laterally extend along the first horizontal direction hd1 from the boundary between the memory array region 100 and the staircase region 300 into the memory array region 100 such that the area between each pair of straight edges covers a respective row of memory openings 49B that belong to the second subset of memory openings 49B. In one embodiment, the straight edges of the patterned etch mask layer 47 may be located between a covered row of memory openings 49B (which are covered by the patterned etch mask layer 47) and each neighboring uncovered row of memory openings 49A (which are not covered by the patterned etch mask layer 47). In this embodiment, the straight edges of the patterned etch mask layer 47 do not overlie or cross sidewalls of the memory openings 49, and extend between sidewalls of the memory openings 49.

Alternatively, a lateral undulation along the second horizontal direction hd2 may be introduced to the sidewalls of the patterned etch mask layer 47 that laterally extend along the first horizontal direction hd1 in the memory array region 100. The pattern of the lateral undulation in the sidewalls of the patterned etch mask layer 47 may be selected such that the undulated sidewalls of the patterned etch mask layer 47 extends about midway between each laterally neighboring pair of a memory opening 49A within the first subset (i.e., the subset of the masked memory openings 49A) and a memory opening 49B within the second subset (i.e., the subset of the unmasked memory openings 49B).

Referring to FIGS. 7A, 7B, 8A, and 8B, an alternative embodiment of the exemplary structure is illustrated, which may be derived from the exemplary structure by altering the pattern in the patterned etch mask layer 47. The pattern of the memory openings 49 in FIGS. 7A and 7B may be identical to the pattern of the memory openings in FIGS. 6A and 6B. Thus, the number of rows of memory openings 49 within each block 490 of memory openings may be at least 3, and may be n×g+(g−1), in which n is an integer greater than 1 and g is a positive integer greater than 1. In the alternative embodiment of the exemplary structure of FIGS. 7A and 7B, the patterned etch mask layer 47 of FIGS. 6A and 6B may be modified to form discrete openings around each memory openings 49B that is not to be covered with the patterned etch mask layer 47 instead of large openings encompassing areas of multiple memory openings 49A. Thus, each memory opening 49B within the first subset of memory openings 49B within the exemplary structure of FIGS. 7A and 7B may underlie a discrete opening in the patterned mask layer 47, and each memory opening 49 within the second subset of openings 49 within the exemplary structure of FIGS. 7A and 7B may be covered by the patterned mask layer 47. In one embodiment, the patterned etch mask layer 47 may cover the entire area of the staircase region 300 and the peripheral device region 200.

Referring to FIGS. 9A and 9B, the optional first semiconductor channel layer 601, the tunneling dielectric layer 56, the charge storage layer 54, and the blocking dielectric layer 52 are sequentially anisotropically etched employing at least one anisotropic etch process. The patterned etch mask layer 47 (which may be a patterned photoresist layer) may be employed as an etch mask for the at least one anisotropic etch process. The unmasked horizontal portions of the first semiconductor channel layer 601, the tunneling dielectric layer 56, the charge storage layer 54, and the blocking dielectric layer 52 located above the top surface of the insulating cap layer 70 may be removed by the at least one anisotropic etch process. Further, the unmasked horizontal portions of the first semiconductor channel layer 601, the tunneling dielectric layer 56, the charge storage layer 54, and the blocking dielectric layer 52 at a bottom of each unmasked memory opening 49A may be removed to form openings in remaining portions thereof to expose the pedestal channel portion 11. Each of the first semiconductor channel layer 601, the tunneling dielectric layer 56, the charge storage layer 54, and the blocking dielectric layer 52 may be etched by a respective anisotropic etch process employing a respective etch chemistry, which may, or may not, be the same for the various material layers. The masked portions of the first semiconductor channel layer 601, the tunneling dielectric layer 56, the charge storage layer 54, and the blocking dielectric layer 52 in memory openings 49B that underlie the patterned etch mask layer 47 are protected from the at least one anisotropic etch process by the patterned etch mask layer 47.

Each remaining portion of the first semiconductor channel layer 601 within a first subset of memory openings 49A (which are not masked by the patterned etch mask layer 47) may have a tubular configuration. The charge storage layer 54 may comprise a charge trapping material or a floating gate material. In one embodiment, each charge storage layer 54 within the first subset of memory openings 49A may include a vertical stack of charge storage regions that store electrical charges upon programming. In one embodiment, each charge storage layer 54 within the first subset of memory openings 49A may be a charge storage layer in which each portion adjacent to the sacrificial material layers 42 constitutes a charge storage region.

A surface of each pedestal channel portion 11 (or a surface of the semiconductor material layer 10 in case the pedestal channel portions 11 are not employed) may be physically exposed underneath the opening through the first semiconductor channel layer 601, the tunneling dielectric layer 56, the charge storage layer 54, and the blocking dielectric layer 52 within each memory opening 49A in the first subset of memory openings 49A. Optionally, the physically exposed semiconductor surface at the bottom of each memory opening 49A may be vertically recessed so that the recessed semiconductor surface is vertically offset from the topmost surface of the pedestal channel portion 11 (or of the semiconductor material layer 10 in case pedestal channel portions 11 are not employed) by a recess distance within each memory opening 49A in the first subset of memory openings 49A. A tunneling dielectric layer 56 is located over the charge storage layer 54 within each memory opening 49A in the first subset of memory openings 49A. A set of a blocking dielectric layer 52, a charge storage layer 54, and a tunneling dielectric layer 56 constitutes a memory film 50 within each memory opening 49A in the first subset of memory openings 49A. Each memory film 50 includes a plurality of charge storage regions (which comprise the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls within each memory opening 49A in the first subset of memory openings 49A. The optional first semiconductor channel layer 601, the tunneling dielectric layer 56, the charge storage layer 54, and the blocking dielectric layer 52 remain intact in each memory opening 49B within the second subset of memory openings 49B and optionally within each support opening 19. The tunneling dielectric layer 56, the charge storage layer 54, and the blocking dielectric layer 52 at the bottom of each memory opening 49B within the second subset of memory openings 49B forms an dielectric isolation structure 57 which electrically isolates the epitaxial channel pedestal 11 and the semiconductor material layer 10 from the subsequent layers to be formed over the blocking dielectric 56 in each memory opening 49B within the second subset of memory openings 49B.

Referring to FIGS. 10A and 10B, the patterned etch mask layer 47 may be removed selective to the underlying material portions, for example, by ashing. A second semiconductor channel layer 602 may be deposited directly on the exposed semiconductor surface of the pedestal channel portion 11 or the semiconductor material layer 10 (if the pedestal channel portion 11 is omitted) within each memory opening 49A in the first subset of memory openings 49A. The second semiconductor channel layer 602 is formed on all physically exposed surfaces of the first semiconductor channel layer 601 (if present) in each of the memory openings 49 and in each of the support openings 19. The semiconductor channel layer 602 does not contact any of the pedestal channel portions 11 or the semiconductor material layer 10, the blocking dielectric layer 52, and the charge storage layer 54, in any of the memory openings 49B within the second subset of memory openings 49B or in any of the support openings 19. If the optional first semiconductor channel layer 601 is formed in the memory openings 49, then the second semiconductor channel layer 602 also does not contact the tunneling dielectric layer 56. If the optional first semiconductor channel layer 601 is not formed in the memory openings 49, then the second semiconductor channel layer 602 is formed directly on the tunneling dielectric layer 56.

The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be employed. The second semiconductor channel layer 602 may partially fill the memory cavity 49' in each memory opening 49, or may fully fill the cavity in each memory opening 49.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIGS. 11A and 11B, in case the memory cavity 49' in each memory opening 49 is not completely filled by the second semiconductor channel layer 602, a dielectric core layer 62L may be deposited in the memory cavity 49' to fill any remaining portion of the memory cavity 49' within each memory opening. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Figure 12B:
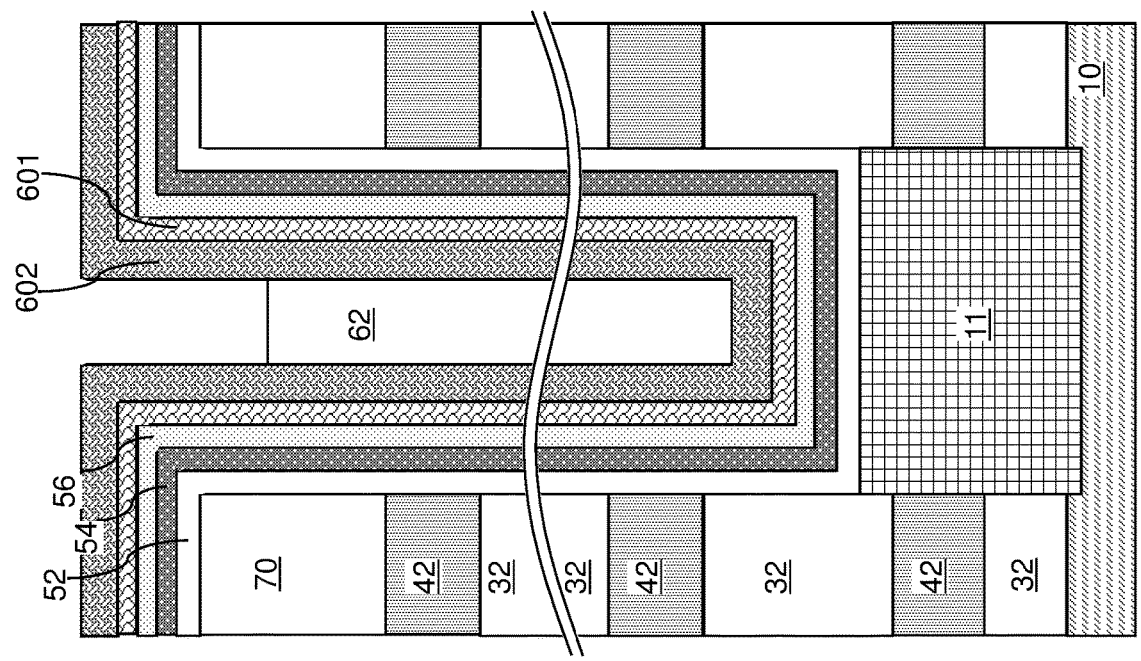
FIG. 12B is a vertical cross-sectional view of a memory opening within a second subset of memory openings after formation of the dielectric cores.
Figure 12A:
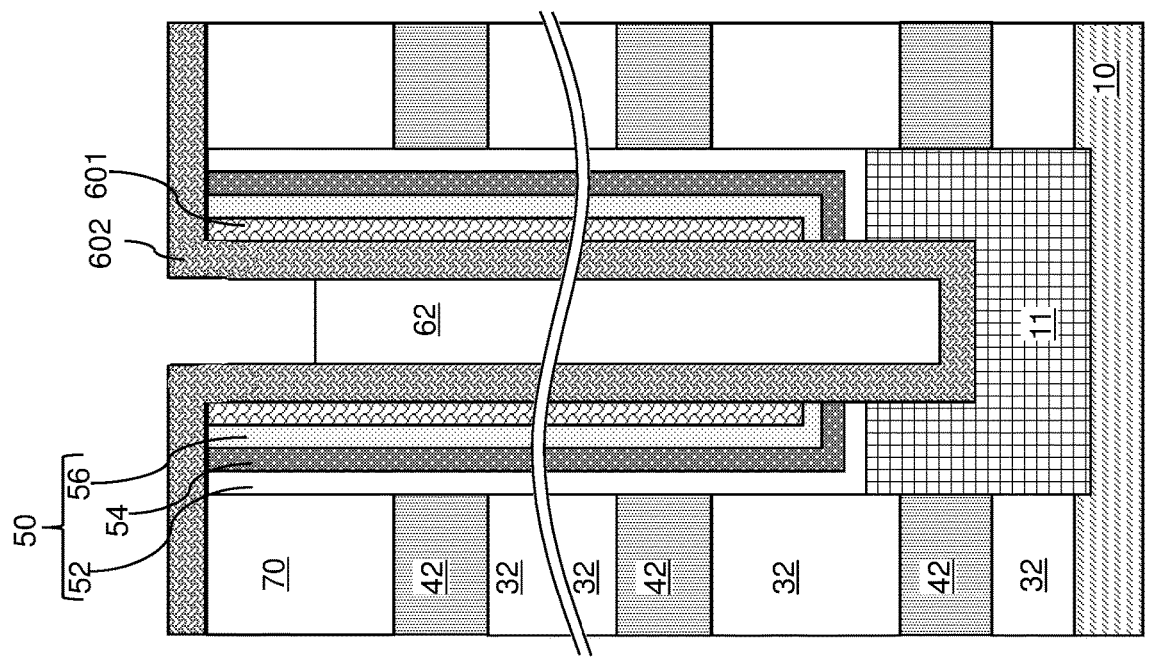
FIG. 12A is vertical cross-sectional view of a memory opening within a first subset of memory openings after formation of dielectric cores according to an embodiment of the present disclosure.
Figure 14A:
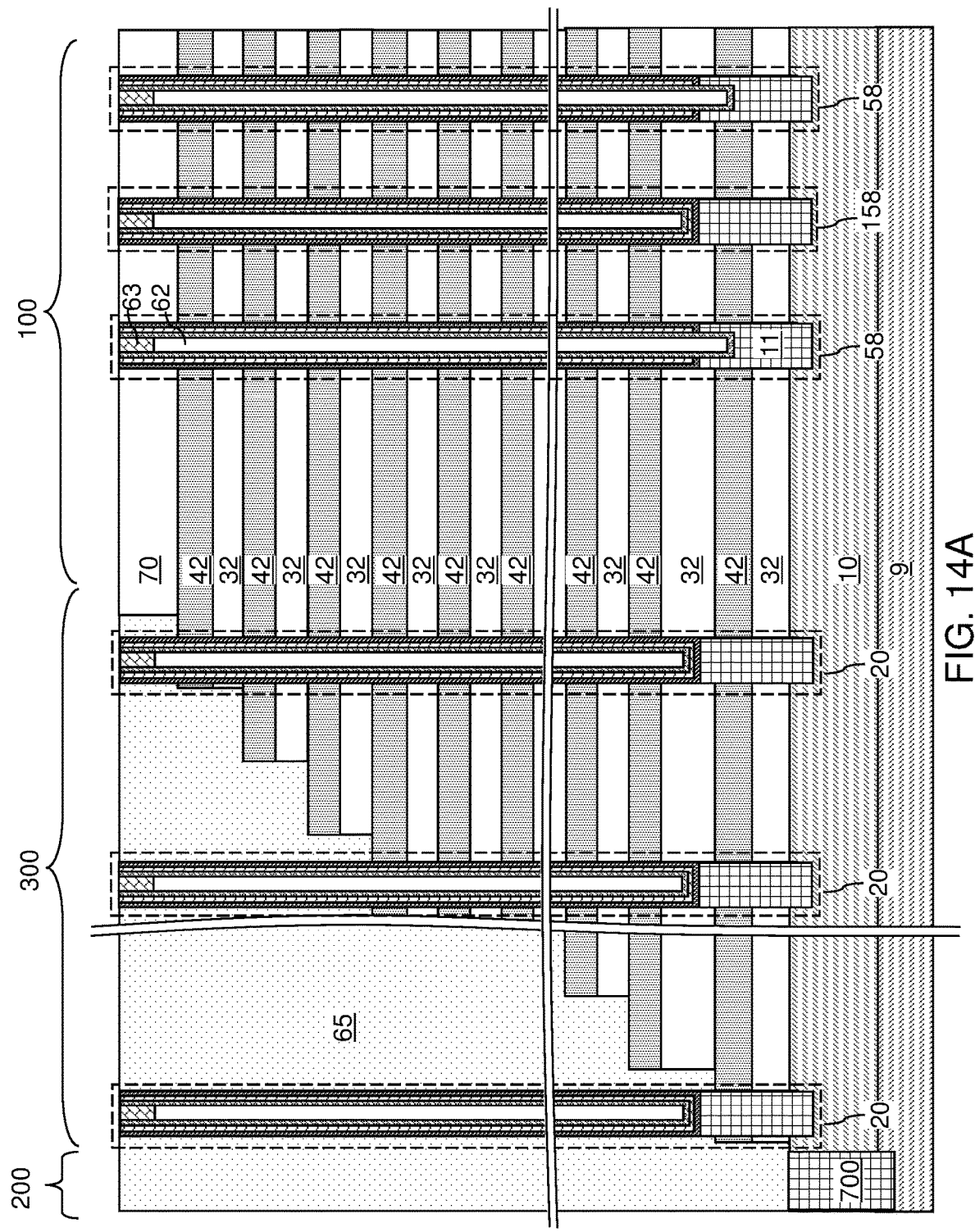
FIG. 14A is a schematic vertical cross-sectional view of the exemplary structure after formation of memory opening fill structures, dummy memory opening fill structures, and support pillar structures according to an embodiment of the present disclosure.
Figure 14B:
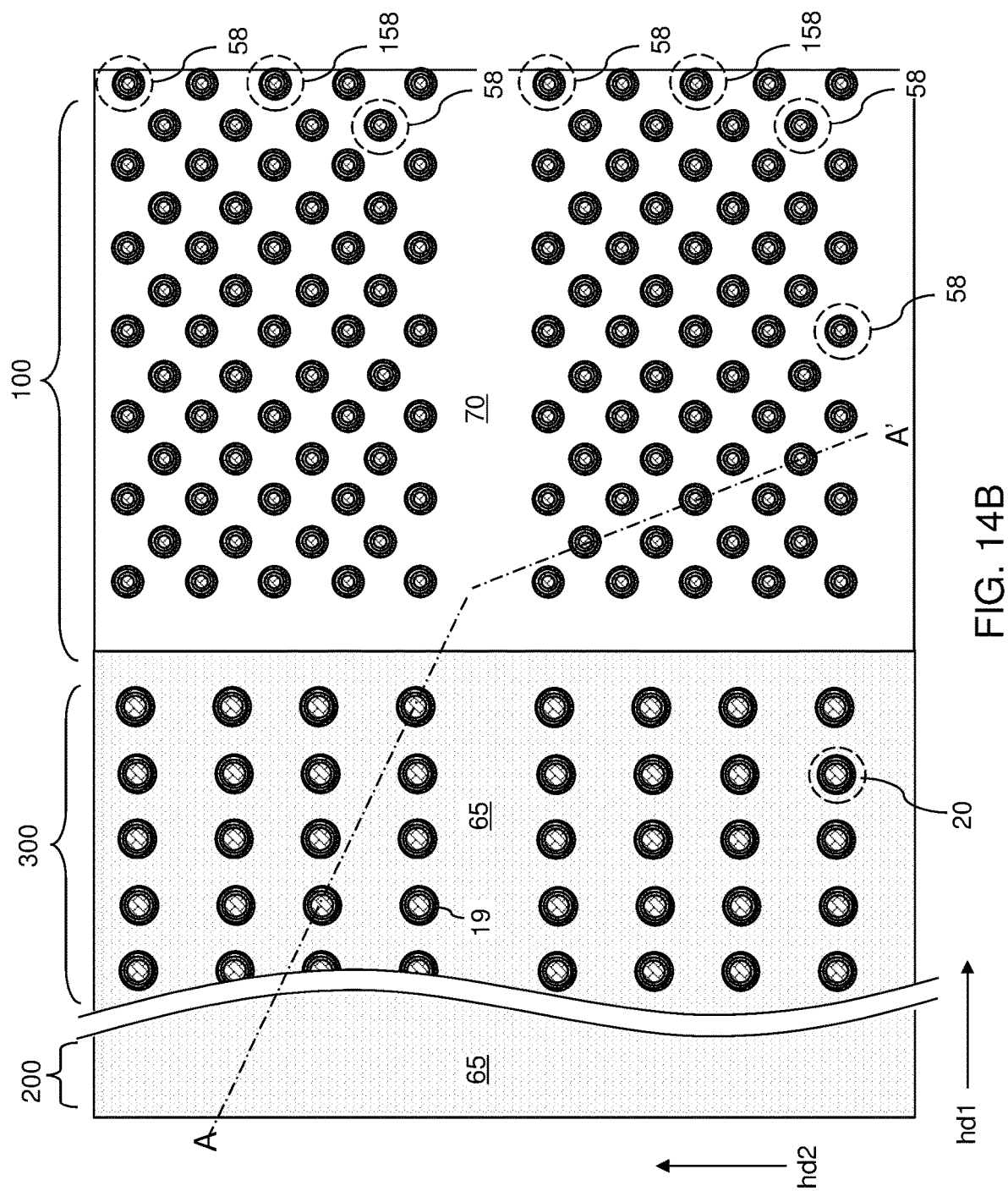
FIG. 14B is a partial see-through top-down view of the exemplary structure of FIG. 14A. The vertical plane A-A' is the plane of the schematic vertical cross-sectional view of FIG. 14A.

Referring to FIGS. 12A and 12B, the horizontal portion of the dielectric core layer 62L overlying the insulating cap layer 70 may be removed, for example, by a recess etch from above the top surface of the second semiconductor channel layer 602. Further, the material of the dielectric core layer 62L may be vertically recessed selective to the semiconductor material of the second semiconductor channel layer 602 into each memory opening 49 and into each support opening 19 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIGS. 13A, 13B, 14A, and 14B, a doped semiconductor material having a doping of a second conductivity type may be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material may be in a range from $5.0 \times 10^{19}/cm^3$ to $2.0 \times 10^{21}/cm^3$, although lesser and greater dopant concentrations may also be employed. The doped semiconductor material may be, for example, doped polysilicon.

Excess portions of the deposited semiconductor material may be removed from above the top surface of the insulating cap layer 70, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the insulating cap layer 70 may be concurrently removed by a planarization process. Further, each horizontal portion of the tunneling dielectric layer 56, the charge storage layer 54, and the blocking dielectric layer 52 that overlie the horizontal plane including the top surface of the insulating cap layer 70 may be removed during the planarization process. Thus, all material portions overlying the horizontal plane including the top surface of the insulating cap layer 70 may be removed by the planarization process. Each remaining portion of the doped semiconductor material having a doping of the second conductivity type, the second semiconductor channel layer 602, the first semiconductor material layer 601, the tunneling dielectric layer 56, the charge storage layer 54, and the blocking dielectric layer 52 may be located entirety within a memory opening 49 or entirely within a support opening 19.

Each remaining portion of the doped semiconductor material having a doping of the second conductivity type within the first subset of memory openings 49A constitutes a drain region 63. Each remaining portion of the doped semiconductor material having a doping of the second conductivity type within the second subset of memory openings 49B and within the support openings 19 constitutes a dummy drain region 63. Each adjoining pair of a first semiconductor channel layer 601 and a second semiconductor channel layer 602 within the first subset of memory openings 49A may collectively form a vertical semiconductor channel 60. Each adjoining pair of a first semiconductor channel layer 601 and a second semiconductor channel layer 602 within the second subset of memory openings 49B and/or within the support openings 19 may collectively form a dummy vertical semiconductor channel 160. Each contiguous set of a blocking dielectric layer 52, the charge storage layer 54, and the tunneling dielectric layer 56 within the first subset of memory openings 49A constitutes a memory film 50. Each contiguous set of a blocking dielectric layer 52, the charge storage layer 54, and the tunneling dielectric layer 56 within the second subset of memory openings 49B and/or within the support openings 19 constitutes a dummy memory film 150.

Each vertical semiconductor channel 60 within the first subset of memory openings 49A contacts a respective underlying semiconductor material portion, which may be a pedestal channel portion 11 or an upper portion of the semiconductor material layer 10 (in case the pedestal channel portions 11 are omitted). Thus, electrical current may flow through each vertical semiconductor channel 60 within the first subset of memory openings 49 when a vertical NAND device including the vertical semiconductor channel 60 is turned on by programming, erasing and/or reading operation based on instructions provided by the driver circuit (i.e., the peripheral devices 700). In contrast, each dummy vertical semiconductor channel 160 within the second subset of memory openings 49B or in the support openings 19 is vertically spaced and electrically isolated from a respective underlying semiconductor material portion (such as a pedestal channel portion 11 or an upper portion of the semiconductor material layer 10) by a bottom portion of a dummy memory film 150 which comprises the dielectric isolation structure 57. The dielectric isolation structure 57 comprises a stack including a blocking dielectric layer 52 and a tunneling dielectric layer 56, and optionally a charge storage layer 54 in case the charge storage layer 54 includes a dielectric material such as silicon nitride. The dielectric isolation structure 57 provides electrical isolation between each dummy vertical semiconductor channel 160 and an underlying semiconductor material portion within each memory opening 49B in the second subset of memory openings 49B or within each of the support openings 19 to stop or reduce leakage current from flowing dummy vertical semiconductor channel 160.

A tunneling dielectric layer 56 is surrounded by a charge storage layer 54, and laterally surrounds a portion of the vertical semiconductor channel 60. Each memory film 50, which includes a vertical stack of charge storage elements that may store a respective data bit with a macroscopic retention time. As used herein, a macroscopic retention time refers to a retention time suitable for operation of a memory device as a permanent memory device such as a retention time in excess of 24 hours. In alternative embodiments, a blocking dielectric layer 52 may not be formed in each memory opening 49, and may be subsequently formed in backside recesses that are formed by removal of the sacrificial material layers 42 at a subsequent processing step.

Each combination of a memory film 50 and a vertical semiconductor channel 60 within a memory opening 49A within the first subset of the memory openings 49A constitutes a memory stack structure 55. Each combination of a pedestal channel portion 11 (if present), a memory stack structure 55, a dielectric core 62, and a drain region 63 within each memory opening 49A in the first subset of memory openings 49A is herein referred to as a memory opening fill structure 58. The vertical semiconductor channel 60 within each memory opening fill structure 58 physically and electrically contacts an underlying semiconductor material portion, which may be a pedestal channel portion 11 or a surface portion of the semiconductor material layer 10.

Each combination of a dummy memory film 150 and a dummy vertical semiconductor channel 160 in a memory opening 49 within the second subset of the memory openings 49 or in a support opening 19 constitutes a dummy memory stack structure 155. The dummy memory stack structure 155 is an electrically inactive structure through which, into which, or out of which, electrical current does not flow and which is not electrically connected to a bit line. Each combination of a pedestal channel portion 11 (if present), a dummy memory stack structure 155, a dielectric core 62, and a dummy drain region 163 within each memory opening 49 in the second subset of memory openings 49 is herein referred to as a dummy memory opening fill structure 158.

Each combination of a pedestal channel portion 11 (if present), a dummy memory stack structure 155, a dielectric core 62, and a dummy drain region 163 within each support opening 19 is herein referred to as a support pillar structure 20. The dummy vertical semiconductor channel 160 within each support pillar structure 20 is electrically isolated from an underlying semiconductor material portion by the dielectric isolation structure 57 portion of the dummy memory film 150, which includes at least one dielectric material layer.

An instance of a memory opening fill structure 58 may be formed within each memory opening 49A in the first subset of memory openings 49A of the exemplary structure illustrated in FIGS. 6A and 6B or illustrated in 7A and 7B. An instance of a dummy memory opening fill structure 158 may be formed within each memory opening 49B in the second subset of memory openings 49B of the exemplary structure illustrated in FIGS. 6A and 6B or illustrated in 7A and 7B. An instance of the support pillar structure 20 may be formed within each support opening 19 of the exemplary structure illustrated in FIGS. 6A and 6B or illustrated in 7A and 7B.

While the present disclosure is described employing the illustrated configuration for the memory stack structure, the methods of the present disclosure may be applied to alternative memory stack structures including different layer stacks or structures for the memory film 50 and/or for the vertical semiconductor channel 60.

According to an embodiment of the present disclosure, the first subset of the memory openings 49A, in which the memory opening fill structures 58 are formed, may include a first subset of the rows of the memory openings 49A that laterally extend along the first horizontal direction. The rows of memory openings 49B that do not belong to the first subset of rows of memory openings 49A belong to a second subset of rows of memory openings 49B, which coincide with the second subset of memory openings 49B in which dummy memory opening fill structures 158 are formed.

In one embodiment, memory opening fill structures 58 may be located within a first subset of the rows of memory openings 49A. Each of the memory opening fill structures 58 comprises a respective memory film 50 and a respective vertical semiconductor channel 60 extending through an opening at a bottom portion of the respective memory film 50 and contacting a respective underlying semiconductor material portion, which may be an epitaxial pedestal portion 11 or a surface portion of the semiconductor material layer 10. Dummy memory opening fill structures 158 may be located within a second subset of the rows of memory openings 49B that includes a single row of memory openings 49B that does not belong the first subset. Each of the dummy memory opening fill structures 158 comprises a respective dummy memory film 150 and a respective dummy vertical semiconductor channel 160 that is electrically isolated from a respective underlying material portion by the dielectric isolation structure 57 which comprises a bottom portion of the respective dummy memory film 150.

In one embodiment, the bottom portion of the respective memory film 50 contacts a top surface of the respective underlying semiconductor material portion (such as a pedestal channel portion 11 or a semiconductor material layer 10 within, or underlying, the first subset of memory openings 49A) within each of the memory opening fill structures 58, and the bottom portion of the respective dummy memory film 150 is free of any opening therethrough and contacts a top surface of the respective underlying material portion (such as a pedestal channel portion 11 or a semiconductor material layer 10 within, or underlying, the second subset of memory openings 49). In one embodiment, each of the underlying semiconductor material portion that underlies a memory film 50 may be located within the first subset of the rows of memory openings 49A, and may comprise first pedestal channel portions 11 contacting a semiconductor material layer 10 located within the substrate (9, 10). In one embodiment, each of the underlying material portions that underlies a dummy memory film 150 may be located within the row of memory openings 49B that does not belong to the first subset, and may comprise second pedestal channel portions 11 contacting the semiconductor material layer 10.

Figure 15A:
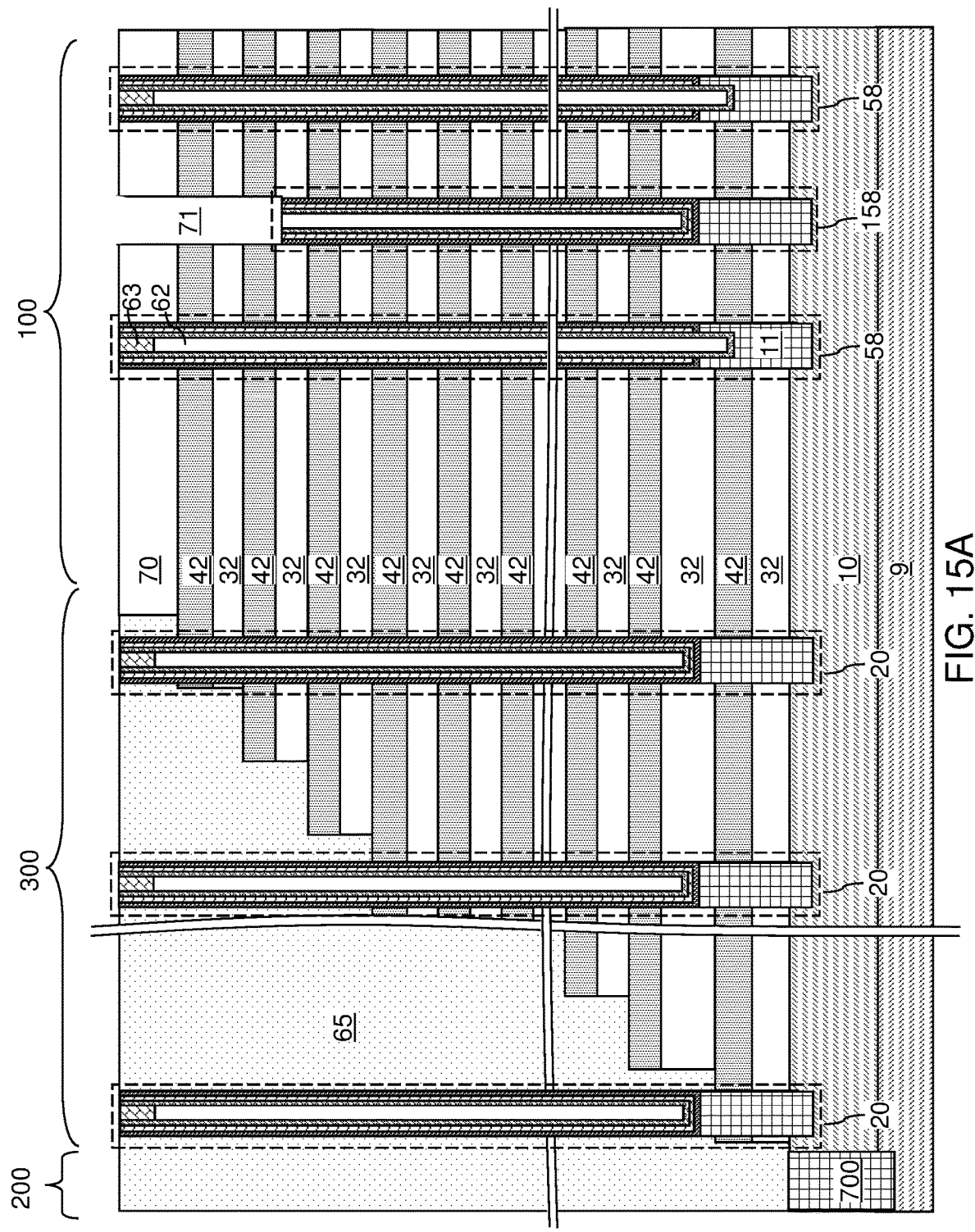
FIG. 15A is a schematic vertical cross-sectional view of the exemplary structure after formation of drain-select-level isolation trenches according to an embodiment of the present disclosure.
Figure 15B:
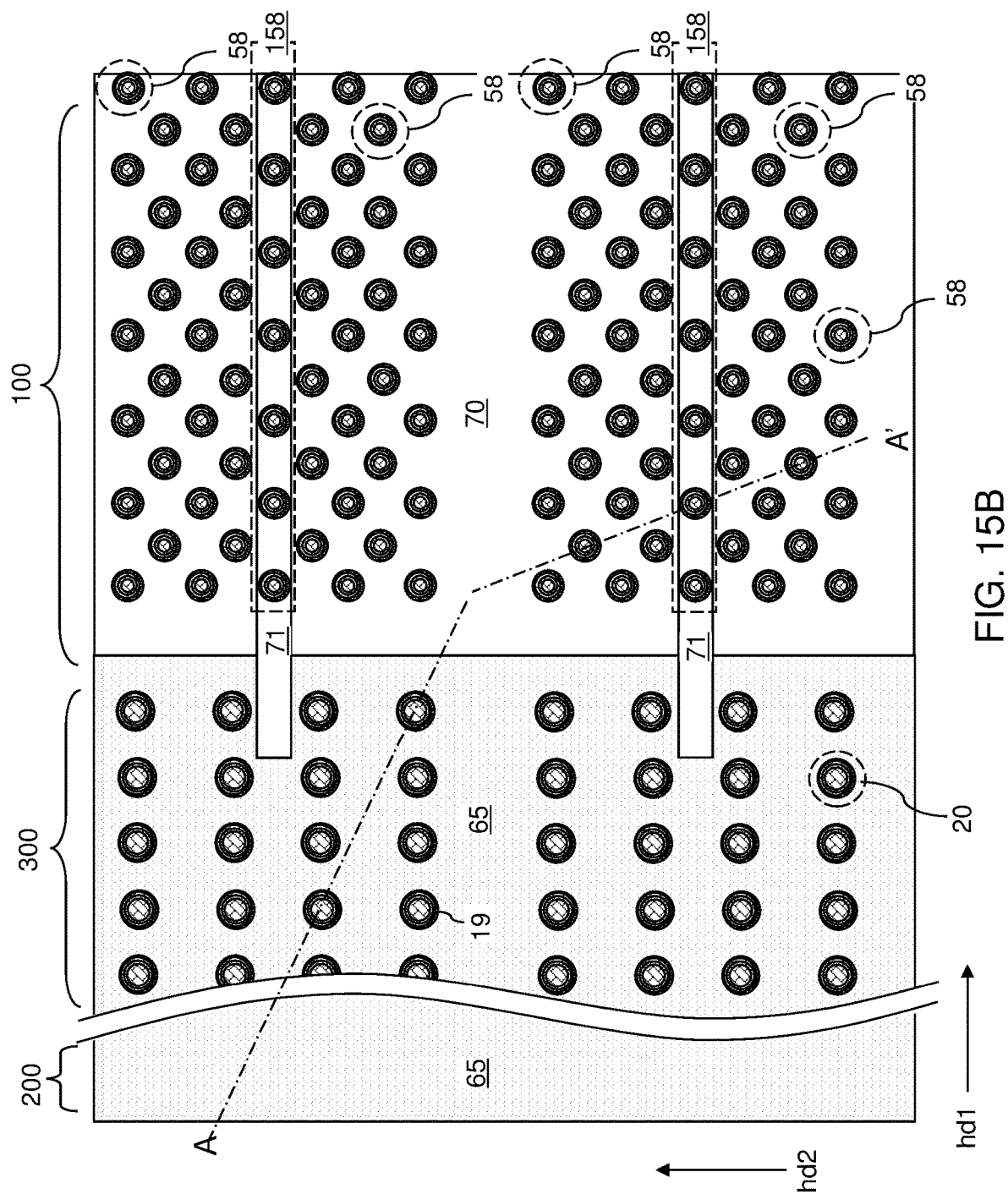
FIG. 15B is a partial see-through top-down view of the exemplary structure of FIG. 15A. The vertical plane A-A' is the plane of the schematic vertical cross-sectional view of FIG. 15A.

Referring to FIGS. 15A and 15B, a photoresist layer (not shown) may be applied over the insulating cap layer 70, and may be lithographically patterned to form line-shaped openings that laterally extend over each row of dummy memory opening fill structures 158. In one embodiment, the openings in the photoresist layer may include rectangular openings having straight edges that laterally extend along the first horizontal direction hd1. The areas of the openings in the photoresist layer may overlap with the areas of the rows of memory openings 49B in the second subset of memory openings 49B, and does not overlap with the areas of the rows of memory openings 49A in the first subset of memory openings 49A or with the support pillar structures 20.

An anisotropic etch process is performed to transfer the pattern of the openings in the photoresist layer through the insulating cap layer 70, the topmost sacrificial material layer 42, and optionally one or more underlying pairs of an insulating layer 32 and a sacrificial material layer 42. The trenches that are formed through insulating cap layer 70, the topmost sacrificial material layer 42, and optionally through one or more underlying pairs of an insulating layer 32 and a sacrificial material layer 42 are herein referred to drain-select-level isolation trenches 71. The layers of the alternating stack (32, 42) through which the drain-select-level isolation trenches 71 extend are herein referred to as drain-select-level layers, which includes at least the topmost sacrificial material layer 42, and may optionally include at least one pair of an insulating layer 32 and a sacrificial material layer 42. The total number of sacrificial material layers 42 through which the drain-select-level isolation trenches 71 extend may be in a range from 1 to 6. The photoresist layer may be subsequently removed, for example, by ashing.

Each of the drain-select-level isolation trenches 71 laterally extends along the first horizontal direction hd1. Upper portions of the dummy memory opening fill structures 158 that are located above a horizontal plane including bottom surfaces of the drain-select-level isolation trenches 71 may be removed during formation of the drain-select-level isolation trenches 71, i.e., during the anisotropic etch process that etches unmasked portions of the materials of the drain-select-level layers. Particularly, each dummy drain region 163 of the dummy memory opening fill structures 158 may be completely removed during the anisotropic etch process. In one embodiment, each dummy memory opening fill structures 158 as modified by the anisotropic etch process may have a topmost surface within the horizontal plane including the bottom surfaces of the drain-select-level isolation trenches 71. In this case, a periphery of each topmost surface of each dummy memory opening fill structure 158 may be formed at a sidewall of one of the insulating layers 32 within the alternating stack (32, 42).

In an alternative embodiment, the width of each drain-select-level isolation trench 71 may be less than the width of a dummy memory opening fill structure 158 along the second horizontal direction hd2. In this case, a dummy memory opening fill structure 158 may include vertically protruding portions that protrude above the horizontal plane including the bottom surfaces of the drain-select-level isolation trenches 71 up to the horizontal plane including the top surface of the insulating cap layer 70. In one embodiment, a dummy memory opening fill structure 158 may include a pair of vertically protruding portions that are laterally spaced apart by a respective drain-select-level isolation trench 71.

Figure 16A:
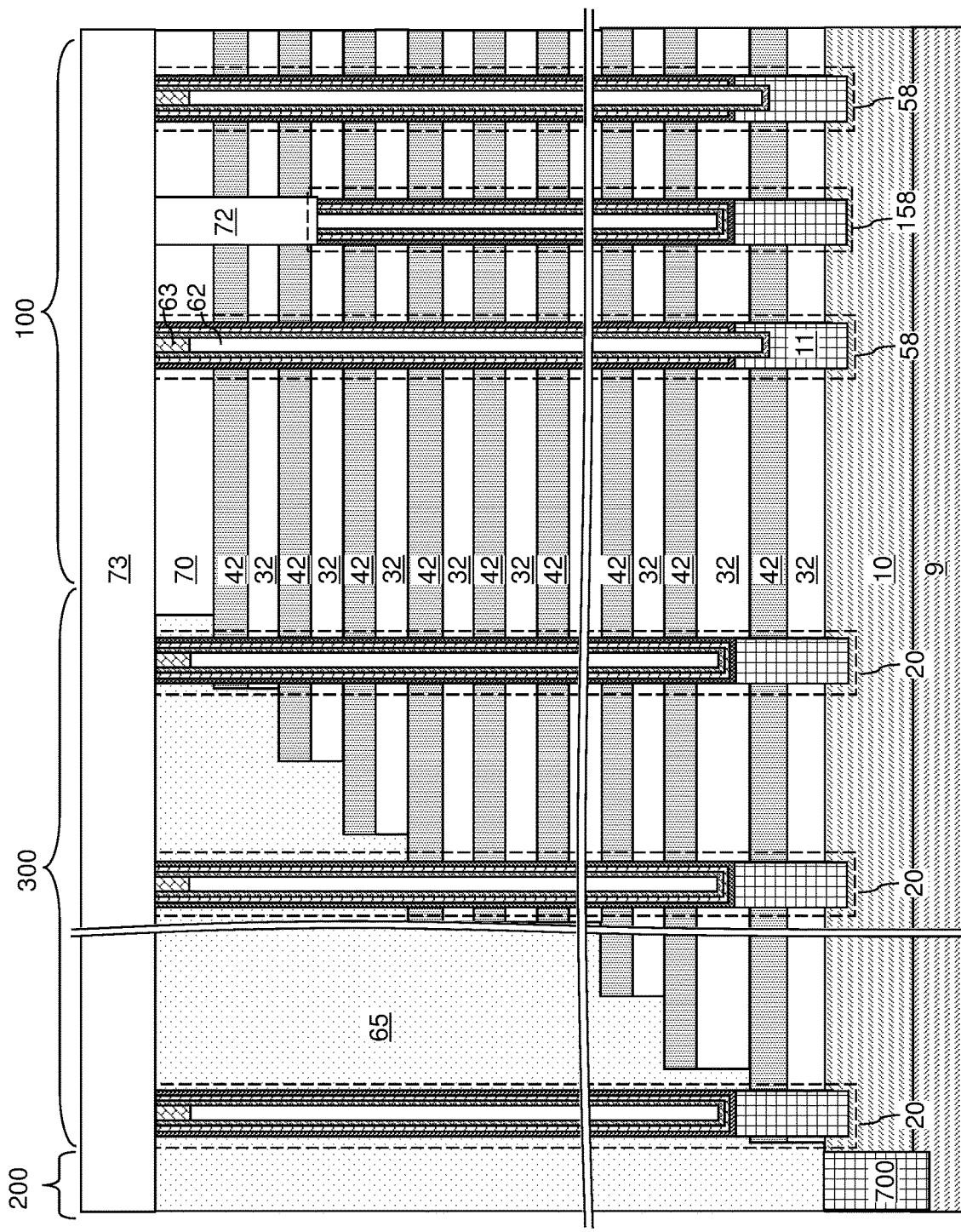
FIG. 16A is a schematic vertical cross-sectional view of the exemplary structure after formation of drain-select-level isolation structures and a contact-level dielectric layer according to an embodiment of the present disclosure.
Figure 16B:
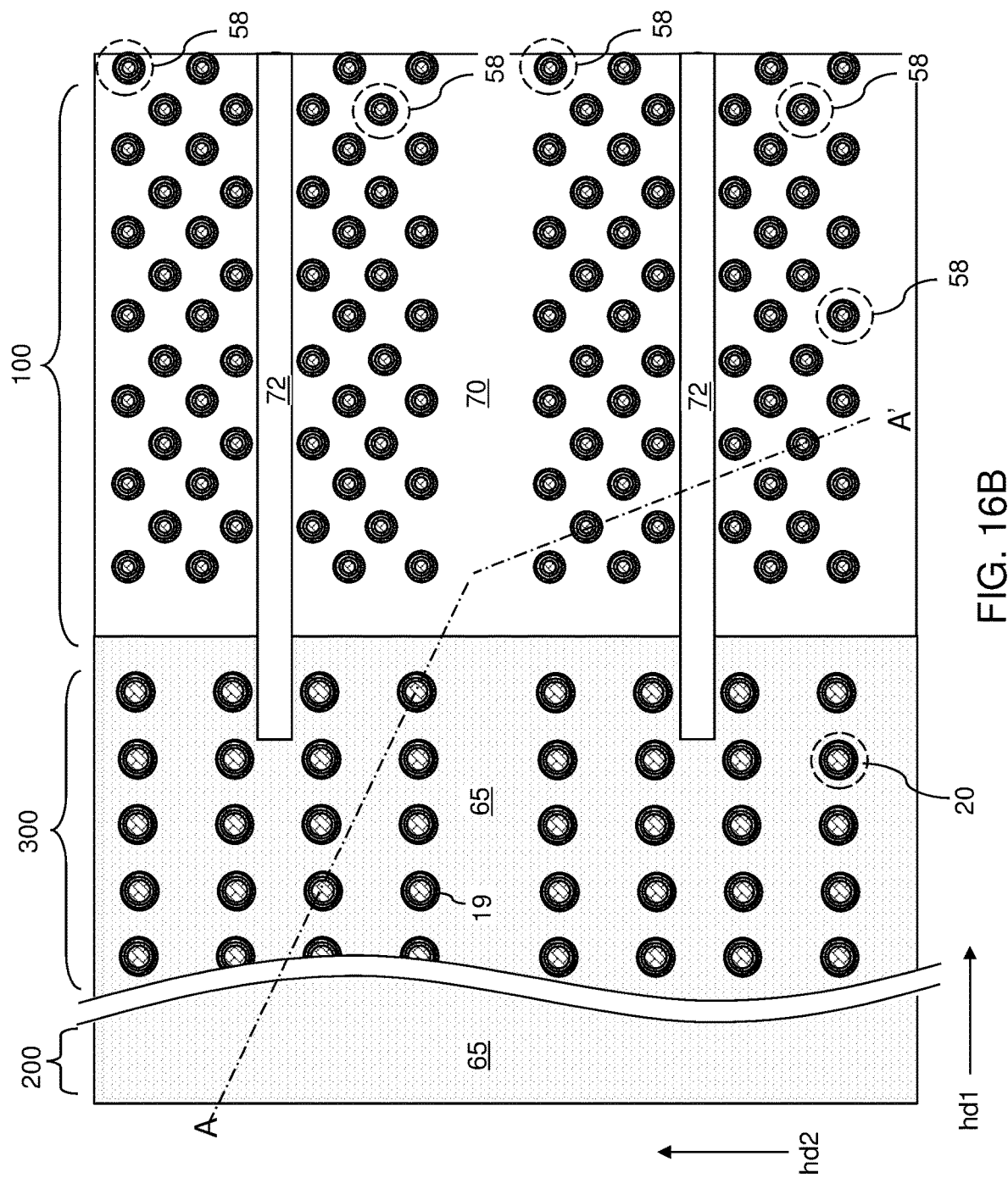
FIG. 16B is a partial see-through top-down view of the exemplary structure of FIG. 16A in which the contact-level dielectric layer is treated as a transparent layer. The vertical plane A-A' is the plane of the schematic vertical cross-sectional view of FIG. 15A.

Referring to FIGS. 16A and 16B, a dielectric material such as silicon oxide may be deposited in the drain-select-level isolation trenches 71 and over the insulating cap layer 70. The dielectric material may be conformally deposited to fill the drain-select-level isolation trenches 71. Alternatively, voids may be formed within the volume of the drain-select-level isolation trenches 71. Each portion of the deposited dielectric material that fills a drain-select-level isolation trench 71 constitutes a drain-select-level isolation structure 72. The planar horizontal portion of the dielectric material that is deposited over the top surface of the insulating cap layer 70 constitutes a dielectric material layer, which is herein referred to as a contact-level dielectric layer 73.

The contact-level dielectric layer 73 may be formed over the alternating stack (32, 42) of insulating layer 32 and sacrificial material layers 42, and over the memory opening fill structures 58, the dummy memory opening fill structures 158, the support pillar structures 20, and the drain-select-level isolation structures 72. The contact-level dielectric layer 73 includes a dielectric material that is different from the dielectric material of the sacrificial material layers 42. For example, the contact-level dielectric layer 73 may include silicon oxide. The contact-level dielectric layer 73 may have a thickness in a range from 50 nm to 500 nm, although lesser and greater thicknesses may also be employed.

Figure 16C:
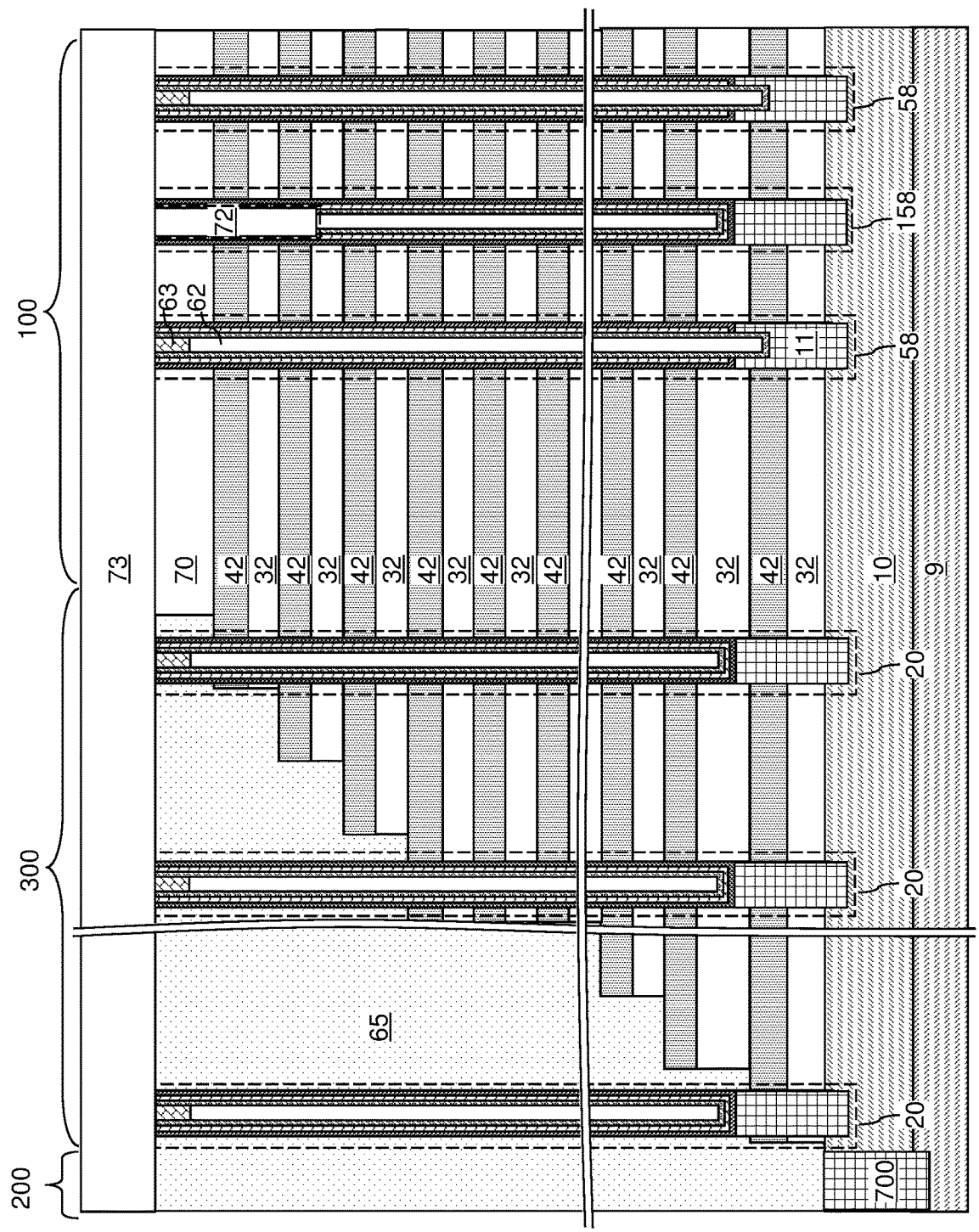
FIG. 16C is a schematic vertical cross-sectional view of an alternative embodiment of the exemplary structure after formation of drain-select-level isolation structures and the contact-level dielectric layer according to an embodiment of the present disclosure.

Referring to FIG. 16C, an alternative embodiment of the exemplary structure at the processing steps of FIGS. 16A and 16B is illustrated, which may be derived from the exemplary structure of FIGS. 15A and 15B by forming narrower drain-select-level isolation trenches 71, and by performing the processing steps of FIGS. 16A and 16B. Dummy drain regions 163 of each dummy memory opening fill structure 158 may be removed by the anisotropic etch process that forms the drain-select-level isolation trenches 71. In this embodiment, a dummy memory opening fill structure 158 may have vertically protruding portions that contact sidewalls of a respective drain-select-level isolation structure 72.

Generally, each drain-select-level isolation structure 72 comprises a dielectric material and contacts a top surface of each of the dummy memory opening fill structures 158 within a row of dummy memory opening fill structures 158. Each drain-select-level isolation structure 72 vertically extends through, and divides, at least a topmost one of the sacrificial material layers 42. In one embodiment, top surfaces of the memory opening fill structures 58 and the drain-select-level isolation structure 72 may be located within a horizontal plane including the top surface of the insulating cap layer 70. In one embodiment, each of the dummy memory opening fill structures 158 has a respective topmost surface that contacts a bottom surface of a respective drain-select-level isolation structure 72. In one embodiment, each of the dummy memory opening fill structures 158 has a respective topmost surface within the horizontal plane including the top surfaces of the top surfaces of the memory opening fill structures 58 and a respective drain-select-level isolation structure 72, and each of the dummy memory films 150 contacts a respective portion of sidewalls of the respective drain-select-level isolation structure 72.

Figure 17A:
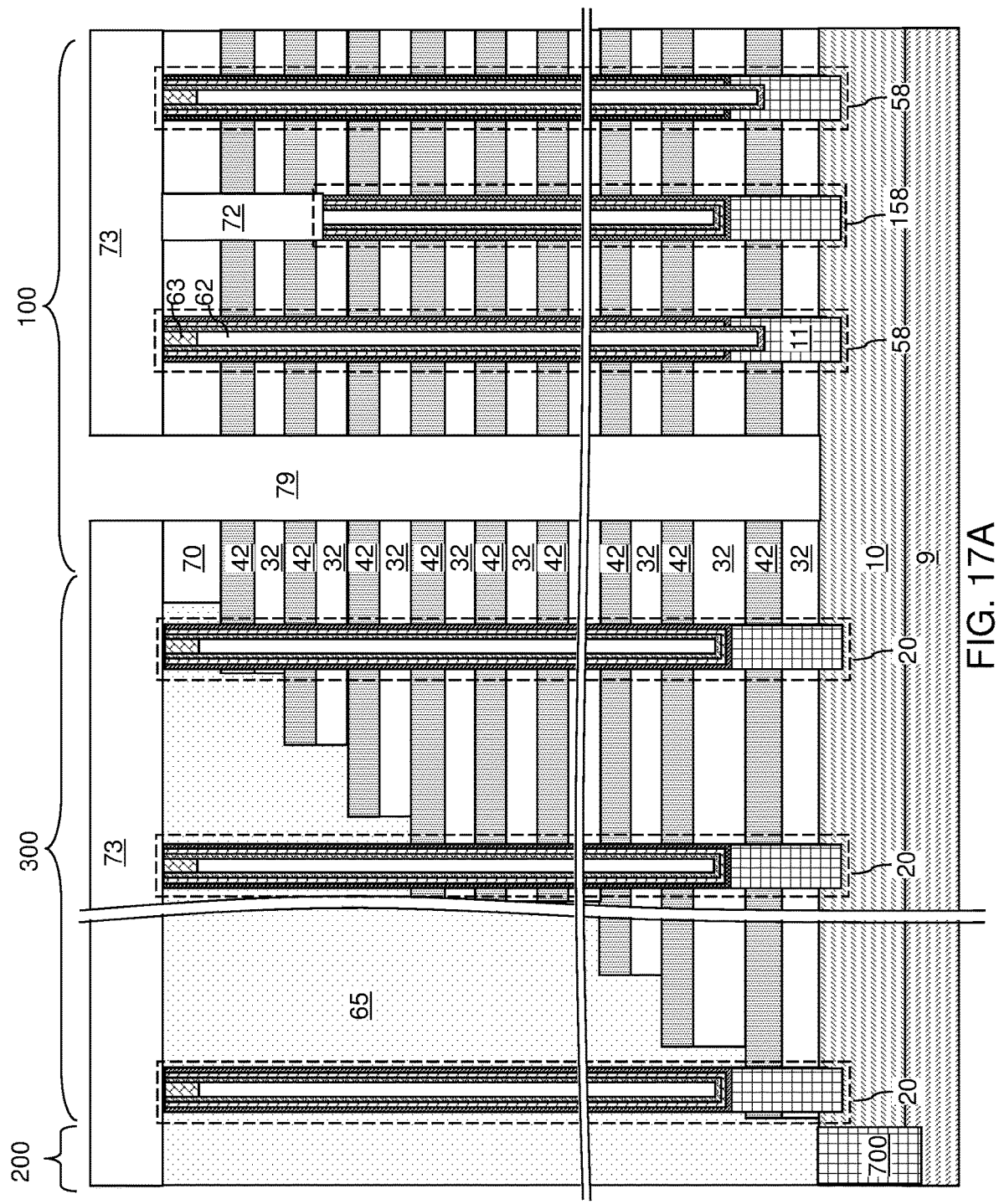
FIG. 17A is a schematic vertical cross-sectional view of the exemplary structure after formation of a contact-level dielectric layer and backside trenches according to an embodiment of the present disclosure.
Figure 17B:
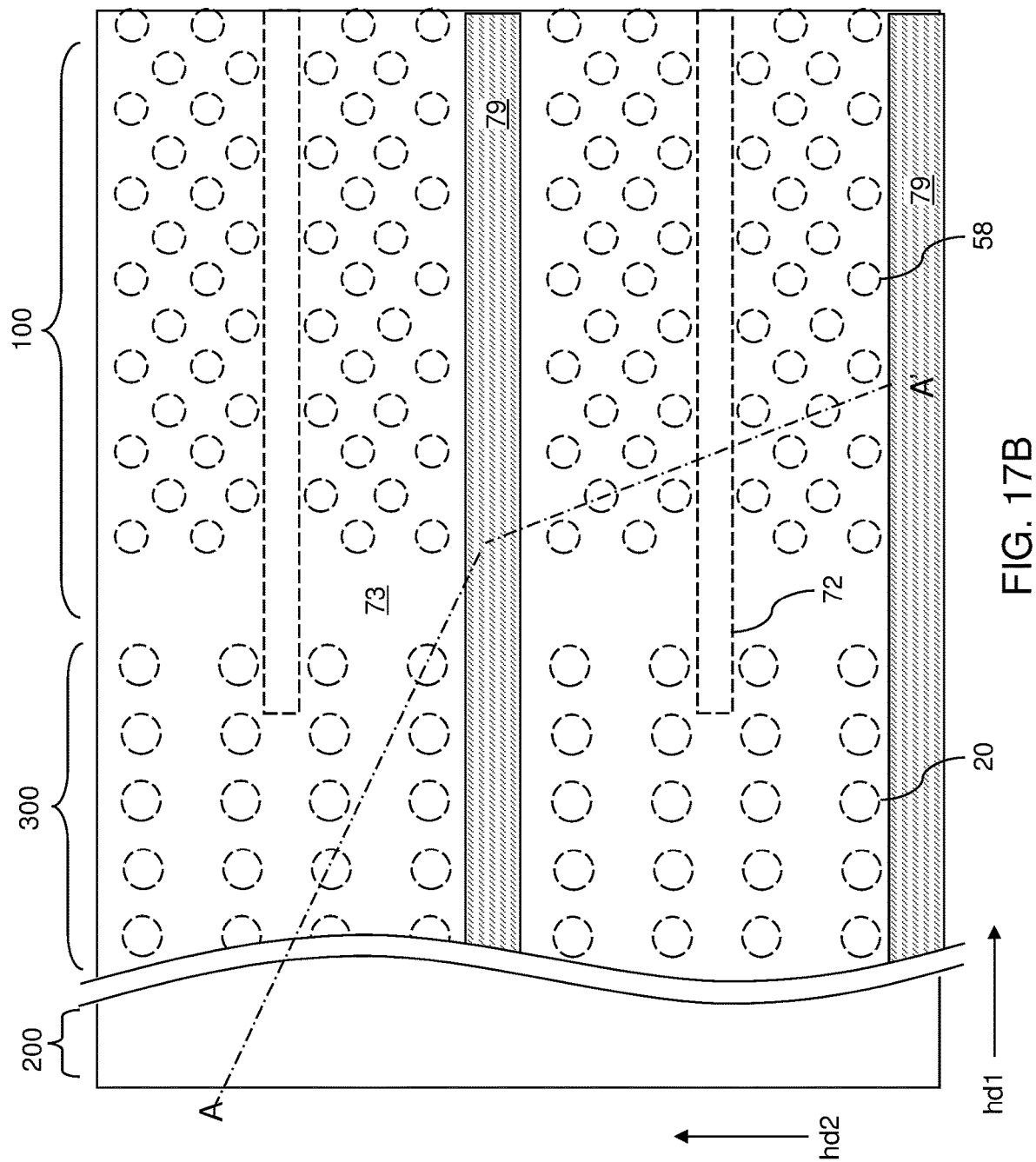
FIG. 17B is a partial see-through top-down view of the exemplary structure of FIG. 17A. The vertical plane A-A' is the plane of the schematic vertical cross-sectional view of FIG. 17A.

Referring to FIGS. 17A and 17B, a photoresist layer (not shown) may be applied over the contact-level dielectric layer 73, and is lithographically patterned to form openings in areas between blocks of memory stack structures 55. The pattern in the photoresist layer may be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart from each other along a second horizontal direction hd2 that is perpendicular to the first horizontal direction hd1. The memory stack structures 55 may be arranged in rows that extend along the first horizontal direction hd1. The drain select level isolation structures 72 may laterally extend along the first horizontal direction hd1. Each backside trench 79 may have a uniform width that is invariant along the lengthwise direction (i.e., along the first horizontal direction hd1). Each drain select level isolation structure 72 may have a uniform vertical cross-sectional profile along vertical planes that are perpendicular to the first horizontal direction hd1 that is invariant with translation along the first horizontal direction hd1. Multiple rows of memory stack structures 55 may be located between a neighboring pair of a backside trench 79 and a drain select level isolation structure 72, or between a neighboring pair of drain select level isolation structures 72. In one embodiment, the backside trenches 79 may include a source contact opening in which a source contact via structure may be subsequently formed. The photoresist layer may be removed, for example, by ashing.

Figure 18:
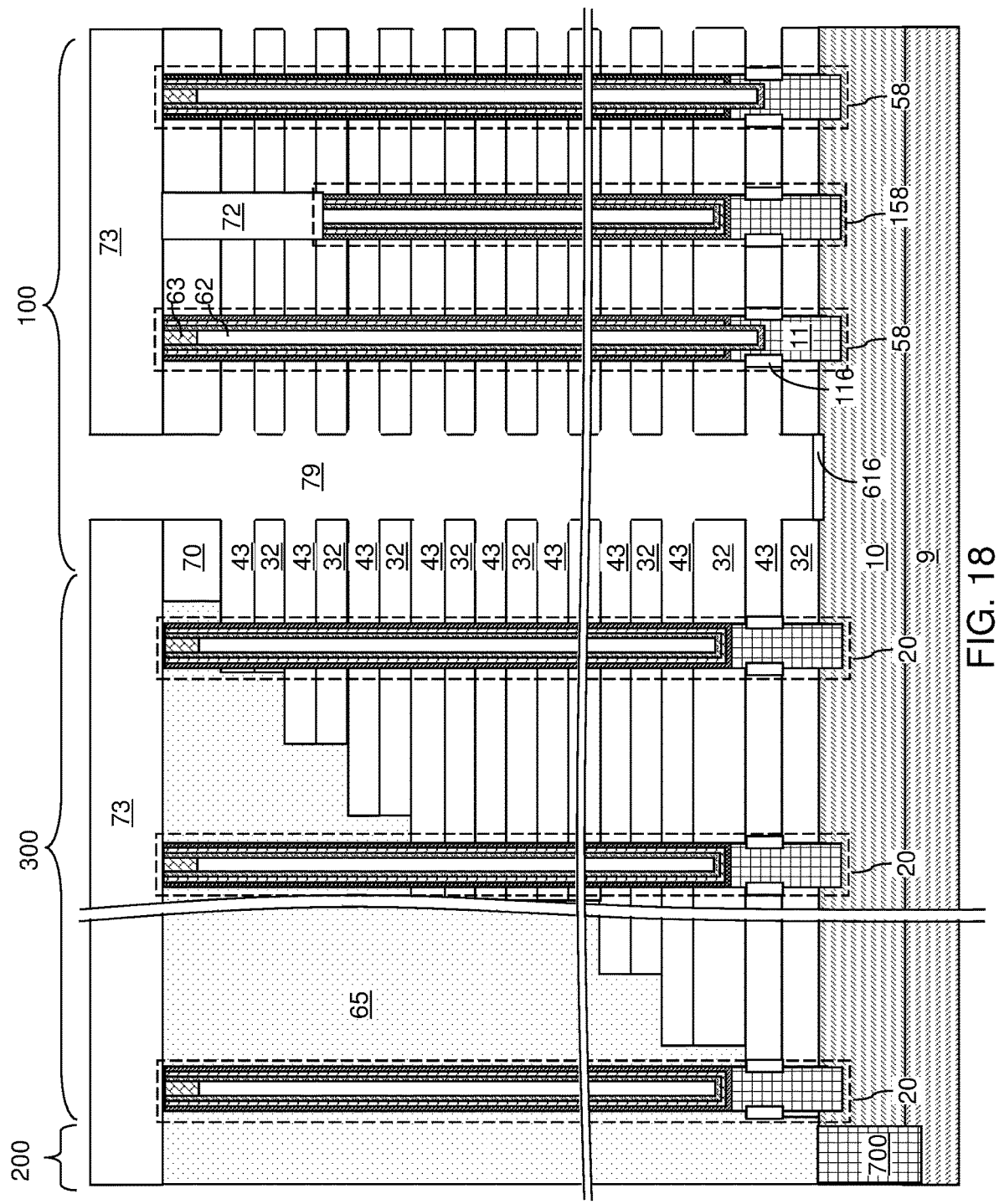
FIG. 18 is a schematic vertical cross-sectional view of the exemplary structure after formation of backside recesses according to an embodiment of the present disclosure.

Referring to FIGS. 18 and 19A, an etchant that selectively etches the second material of the sacrificial material layers 42 with respect to the first material of the insulating layers 32 may be introduced into the backside trenches 79, for example, employing an etch process. FIG. 19A illustrates a region of the exemplary structure of FIG. 18. Backside recesses 43 are formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process employing a wet etch solution, or may be a gas phase (dry) etch process in which the etchant is introduced in a vapor phase into the backside trenches 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 19B, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be employed.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 19C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be employed. In one embodiment, the metallic barrier layer 46A may consist essentially of a conductive metal nitride such as TiN.

Figure 20:
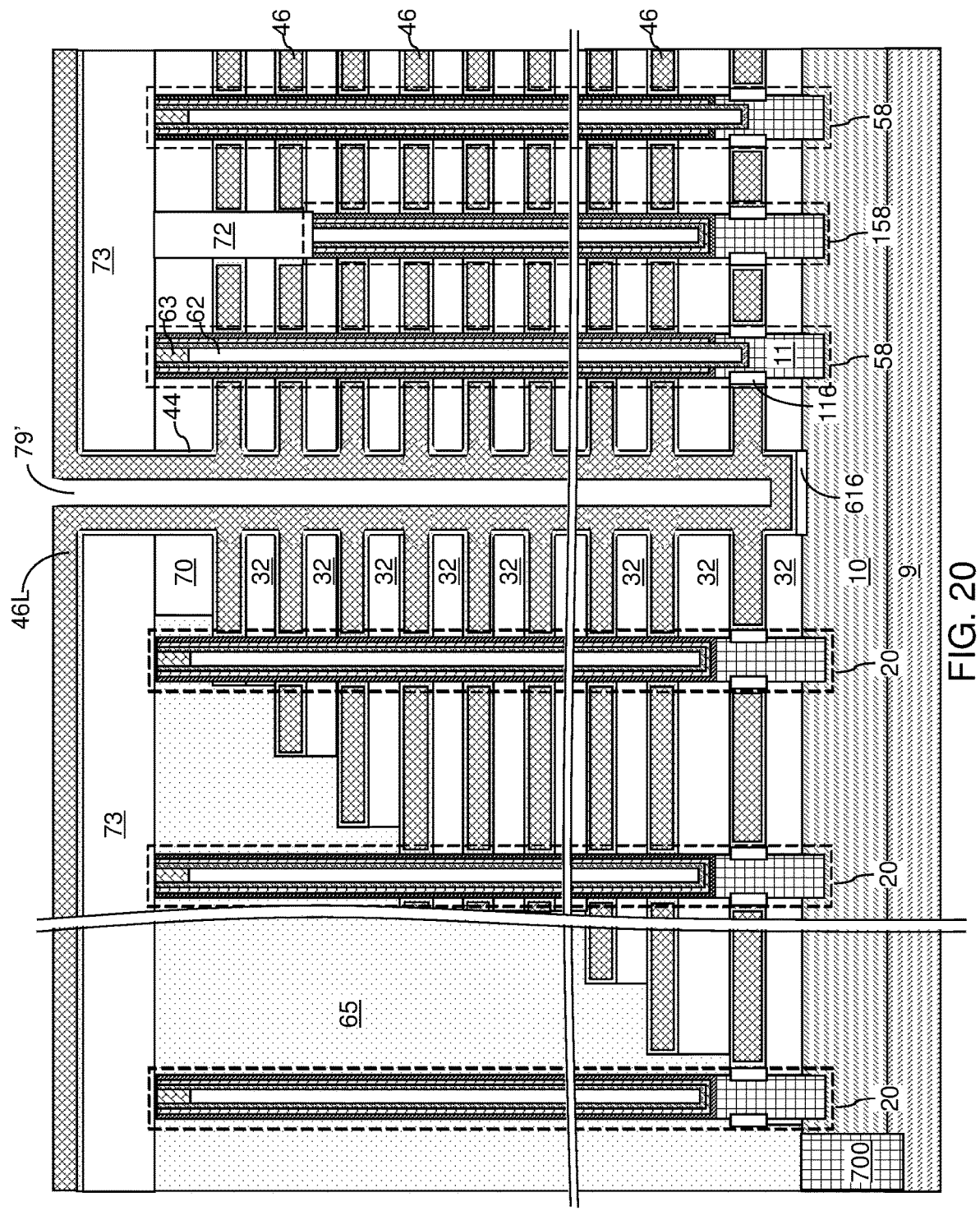
FIG. 20 is a schematic vertical cross-sectional view of the exemplary structure at the processing step of FIG. 19D.

Referring to FIGS. 19D and 20, a metal fill material is deposited in the plurality of backside recesses 43, on the sidewalls of the at least one the backside trench 79, and over the top surface of the contact-level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited employing a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 may be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 21A:
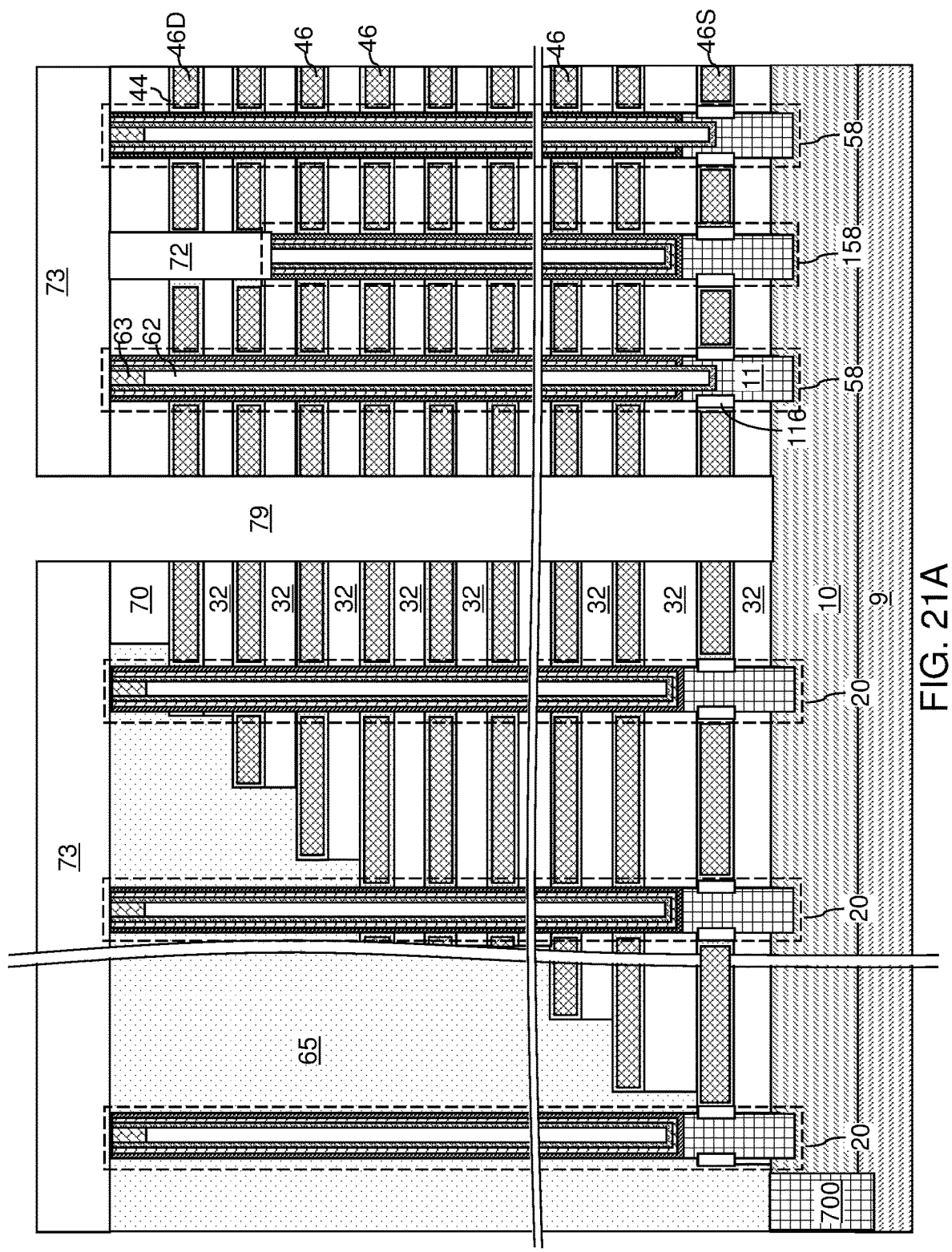
FIG. 21A is a schematic vertical cross-sectional view of the exemplary structure after removal of a deposited conductive material from within the backside trench according to an embodiment of the present disclosure.
Figure 21B:
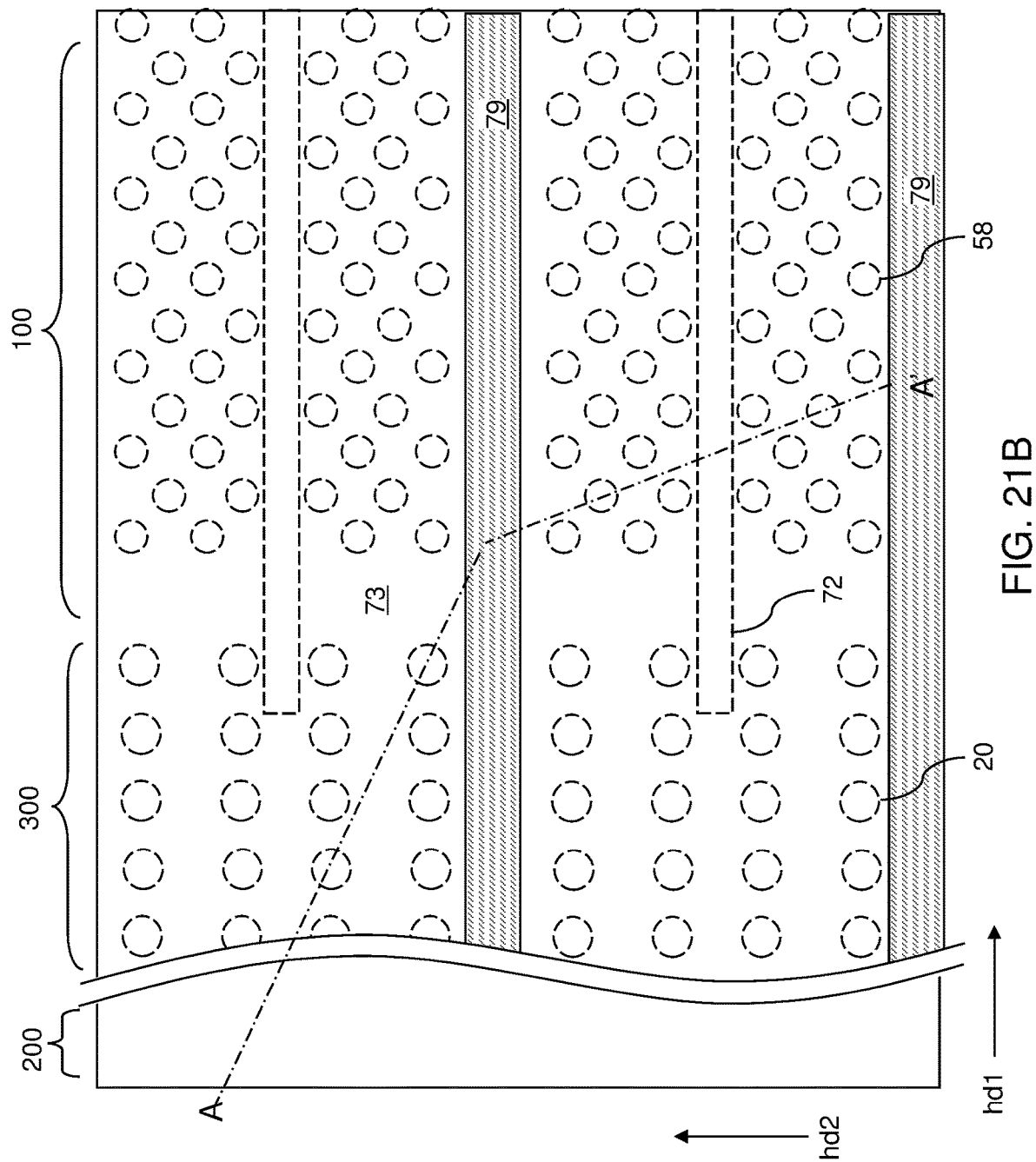
FIG. 21B is a partial see-through top-down view of the exemplary structure of FIG. 21A. The vertical plane A-A' is the plane of the schematic vertical cross-sectional view of FIG. 21A.

Referring to FIGS. 21A and 21B, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each middle electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices. One or more bottommost electrically conductive layers 46S provided upon formation of the electrically conductive layers 46 within the alternating stack (32, 46) may comprise a source select gate electrode for the field effect transistors. One or more topmost electrically conductive layers 46D provided upon formation of the electrically conductive layers 46 within the drain-select-gate-levels of the alternating stack (32, 46) may comprise a drain select gate electrode for the field effect transistors.

In one embodiment, the removal of the continuous electrically conductive material layer 46L may be selective to the material of the backside blocking dielectric layer 44. In this case, a horizontal portion of the backside blocking dielectric layer 44 may be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 may be removed during removal of the continuous electrically conductive material layer 46L. A backside cavity 79' is present within each backside trench 79.

Multiple alternating stacks of insulating layers 32 and electrically conductive layers 46 may be formed over the substrate (9, 10). Each neighboring pair among the alternating stacks (32, 46) is laterally spaced apart by a respective backside trench 79 that vertically extends from the substrate (9, 10) at least to a horizontal plane including a topmost surface of the alternating stacks (32, 46).

Figure 22A:
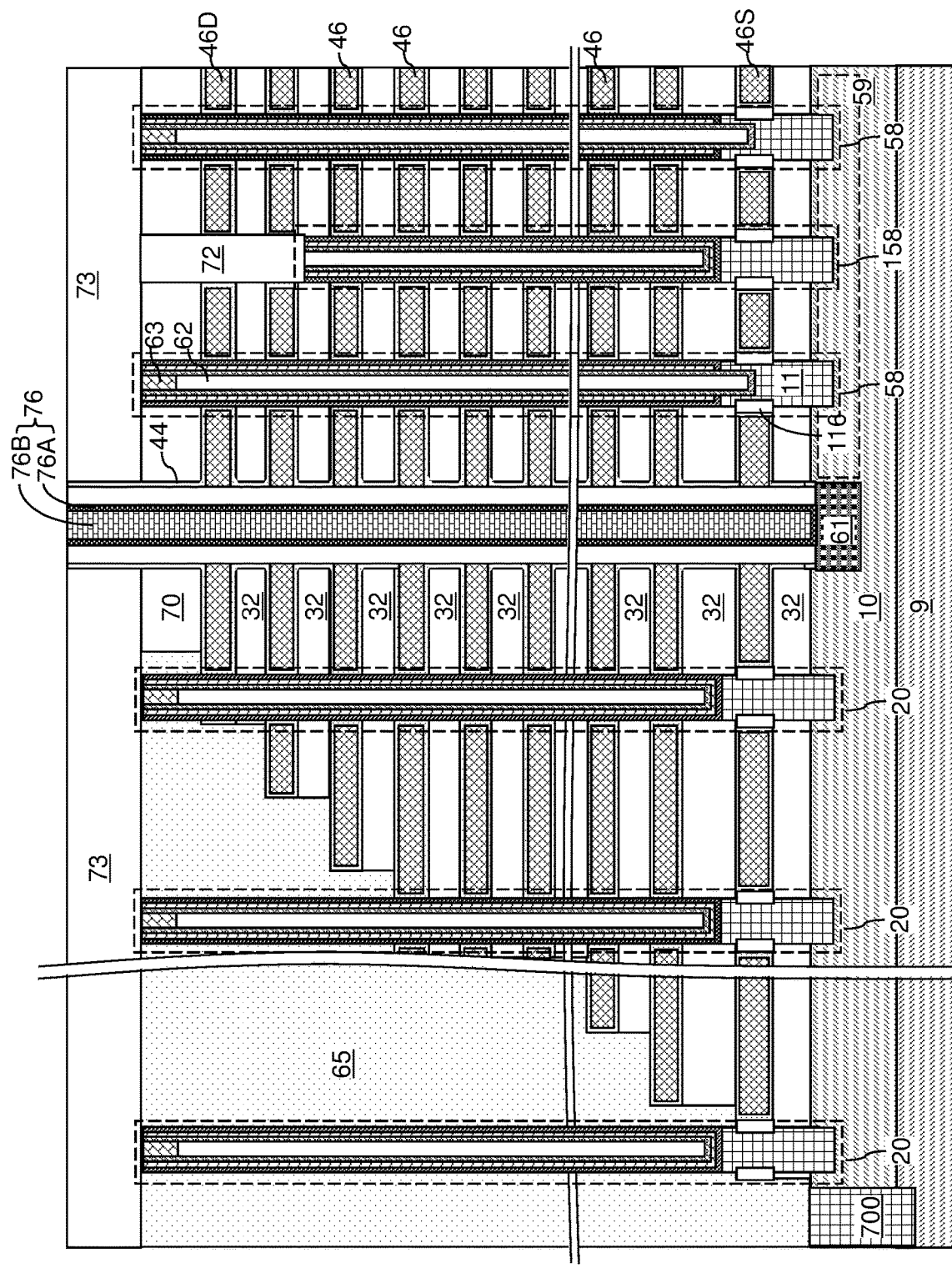
FIG. 22A is a schematic vertical cross-sectional view of the exemplary structure after formation of an insulating spacer and a backside contact structure according to an embodiment of the present disclosure.
Figure 22B:
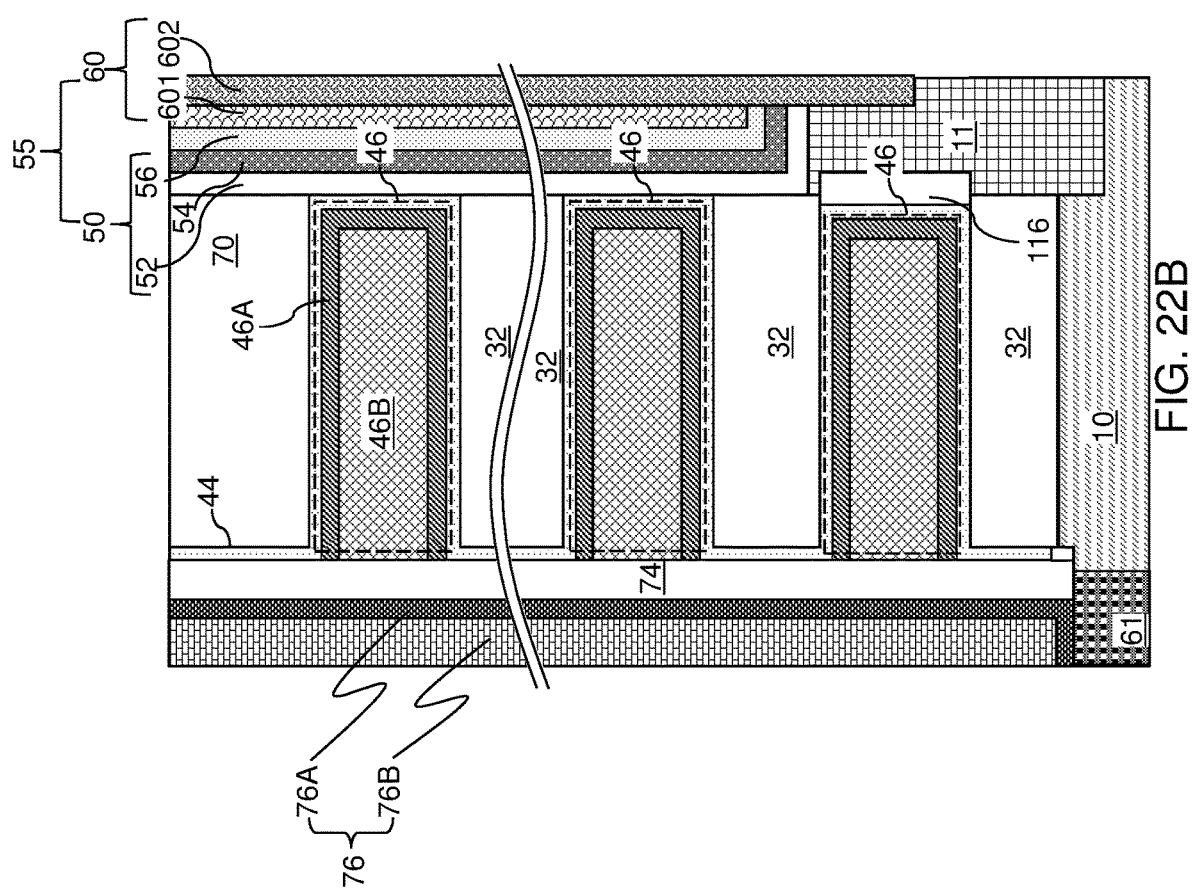
FIG. 22B is a magnified view of a region of the exemplary structure of FIG. 22A.

Referring to FIGS. 22A and 22B, an insulating material layer may be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be employed.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not employed, the insulating material layer may be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be employed. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized employing the contact-level dielectric layer 73 overlying the alternating stack (32, 46) as a stopping layer. If chemical mechanical planarization (CMP) process is employed, the contact-level dielectric layer 73 may be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If the backside blocking dielectric layer 44 is employed, then the backside contact via structure 76 may contact a sidewall of the backside blocking dielectric layer 44.

Figure 23A:
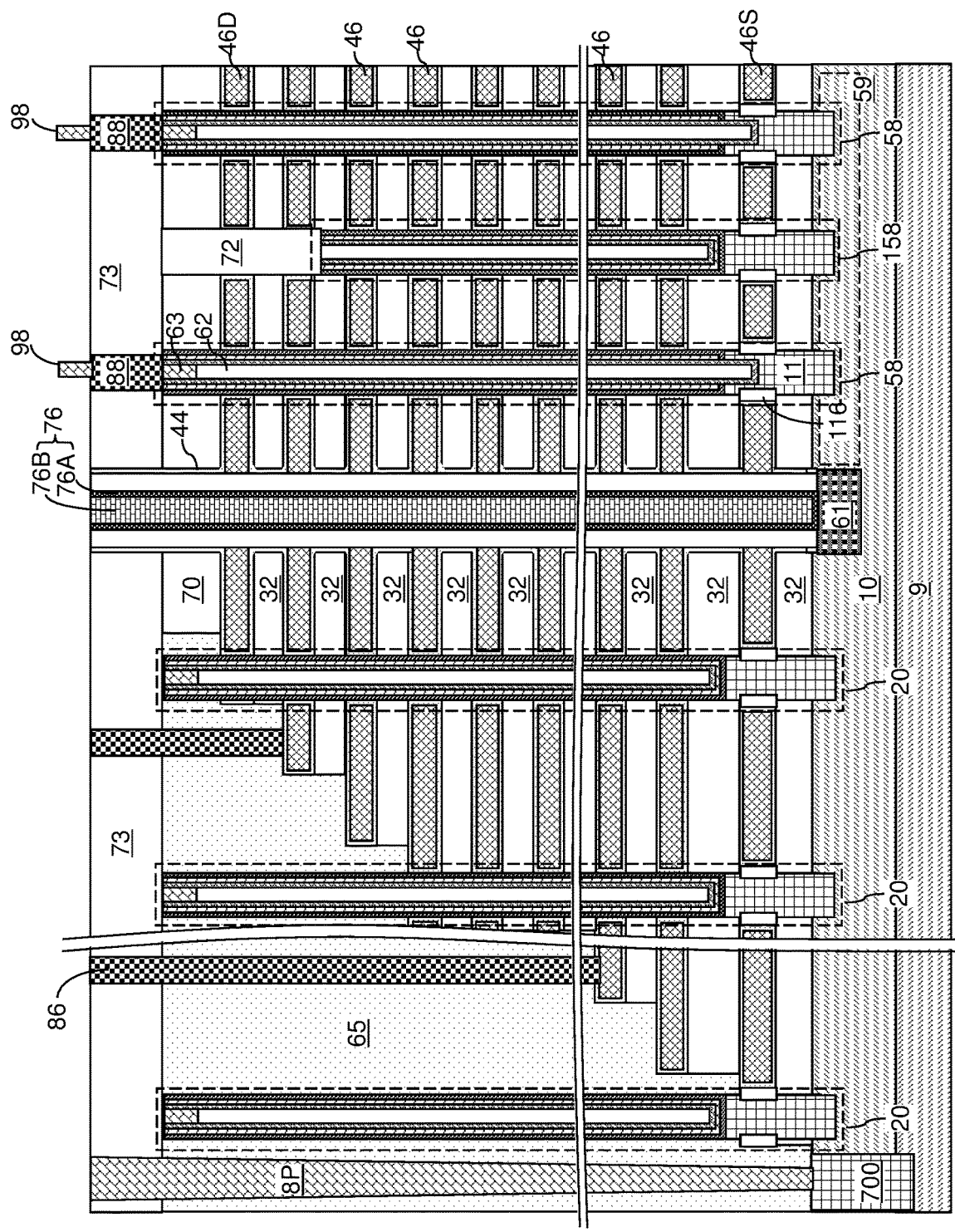
FIG. 23A is a schematic vertical cross-sectional view of the exemplary structure after formation of additional contact via structures according to an embodiment of the present disclosure.
Figure 23B:
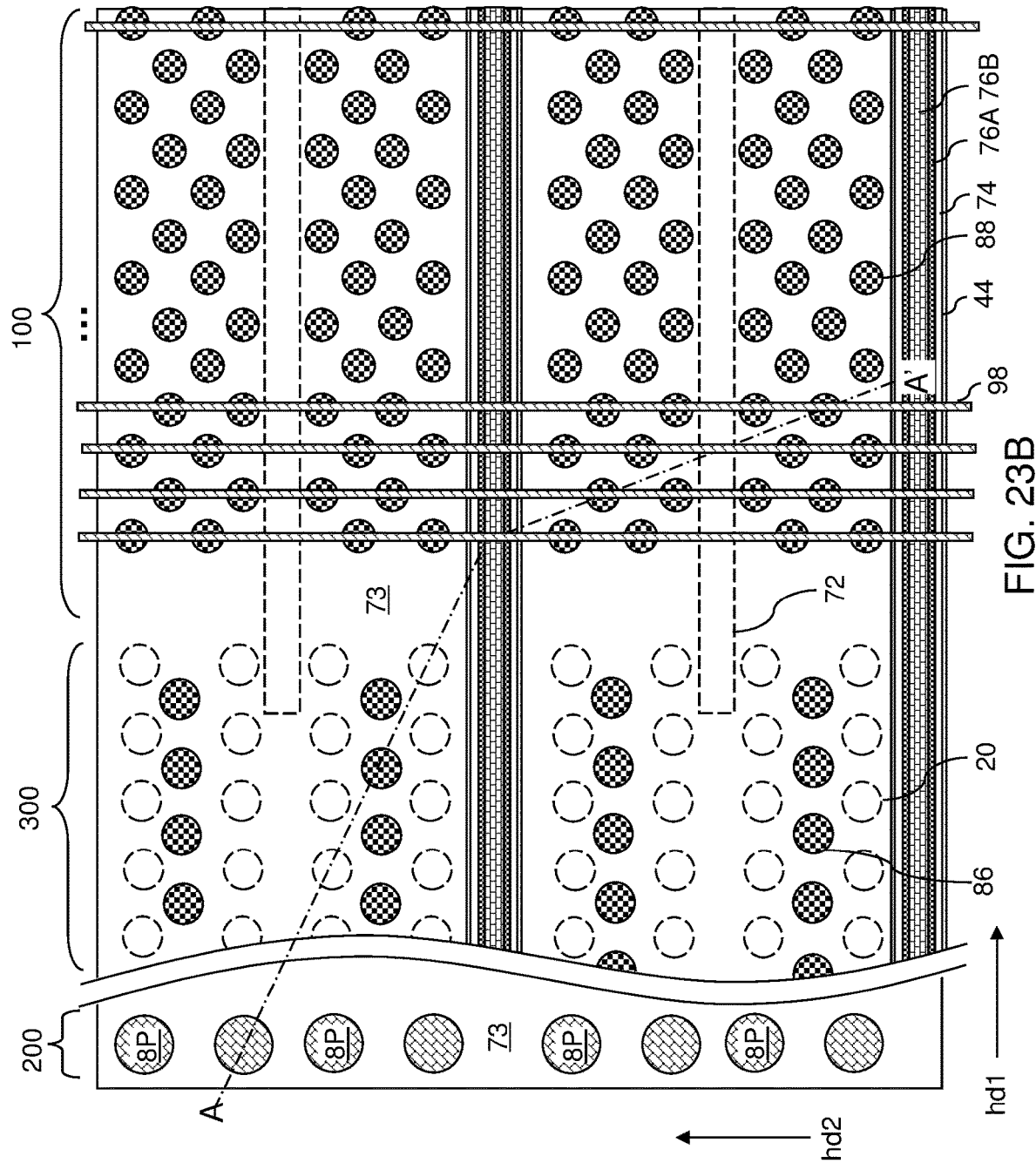
FIG. 23B is a top-down view of the exemplary structure of FIG. 23A. The vertical plane A-A' is the plane of the schematic vertical cross-sectional view of FIG. 23A.

Referring to FIGS. 23A and 23B, additional contact via structures (88, 86, 8P) may be formed through the contact-level dielectric layer 73, and optionally through the retro-stepped dielectric material portion 65. For example, drain contact via structures 88 may be formed through the contact-level dielectric layer 73 on each drain region 63. Word line contact via structures 86 may be formed on the electrically conductive layers 46 through the contact-level dielectric layer 73, and through the retro-stepped dielectric material portion 65. Peripheral device contact via structures 8P may be formed through the retro-stepped dielectric material portion 65 directly on respective nodes of the peripheral devices. Bit lines 98 are then formed in electrical contact with the drain contact via structures 88, which electrically contact the drain regions 63 of the memory opening fill structures 58 located in the memory openings 49A. The bit lines 98 do not electrically contact the dummy memory opening fill structures 158 located in memory openings 49B.

In one alternative embodiment, the peripheral devices 700 are formed on a separate substrate and then bonded to the memory devices. In that case, the peripheral device contact via structures 8P may be omitted.

Figure 23C:
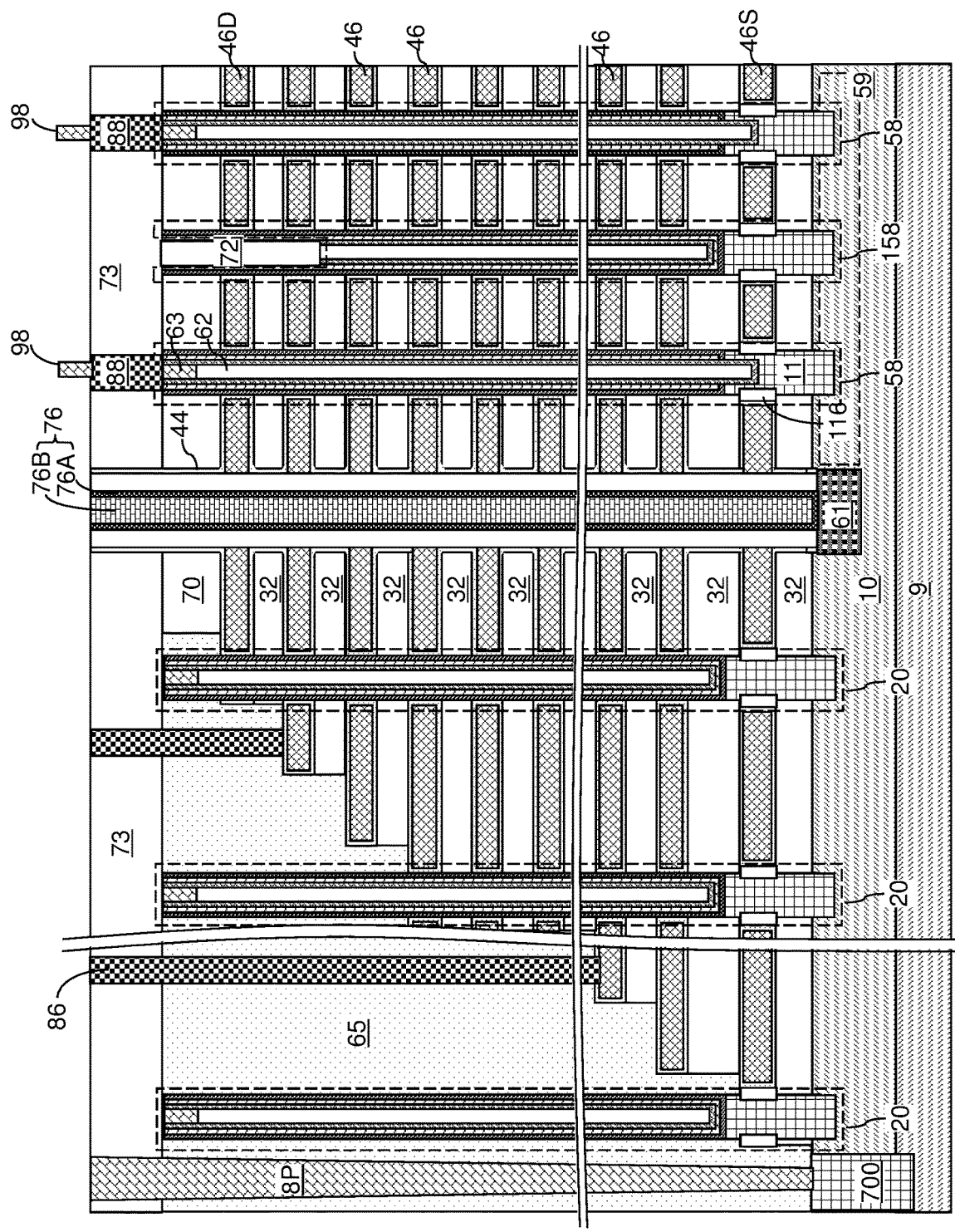
FIG. 23C is a schematic vertical cross-sectional view of a first alternative configuration of the exemplary structure after formation of additional contact via structures according to an embodiment of the present disclosure.

Referring to FIG. 23C, a first alternative configuration of the exemplary structure is illustrated at the processing steps of FIGS. 23A and 23B. The dummy memory opening fill structures 158 may include a respective pair of vertically protruding portions that contacts sidewalls of a respective drain-select-level isolation structure 72.

The dummy vertical semiconductor channels 160 of the dummy memory opening fill structures 158 are electrically floating in the various embodiments of the present disclosure. Particularly, each dummy vertical semiconductor channel 160 is electrically isolated from a respective underlying semiconductor material portion (such as a pedestal channel portion 11 or an underlying surface portion of the semiconductor material layer 10) by a dielectric isolation structure 57 which comprises a horizontal bottom portion of a respective dummy memory film 150. Furthermore, in one embodiment, each dummy vertical semiconductor channel 160 underlies a drain-select-level isolation structure 72, and is not electrically connected to any bit line 98 or a drain contact via structure 88. As discussed above, each dummy drain region 163 may be removed during formation of the drain-select-level isolation structures 72. Thus, the topmost surface of each dummy vertical semiconductor channel 160 may contact a bottom surface of a respective one of the drain-select-level isolation structures 72.

The electrical isolation of each dummy vertical semiconductor channel 160 by the dielectric isolation structure 57 provides protection against formation of leakage paths at the levels of the electrically conductive layers 46. For example, a defect and/or unintentional thinning of the backside blocking dielectric layer 44 around a dummy memory opening fill structure 158 and/or a defect and/or unintentional thinning of a blocking dielectric layer 52 and/or a tunneling dielectric layer 56 within a dummy memory film 150 may generate local weak spots at which tunneling of charge carriers between the dummy vertical semiconductor channel 160 and an electrically conductive layer 46 is enhanced. However, the dummy vertical semiconductor channel 160 is electrically isolated from the semiconductor material layer 10 and from the bit lines 98. Thus, leakage current cannot flow through the local weak spots in the backside blocking dielectric layer 44 and/or in the dummy memory films 150. Thus, the memory device of the embodiments of the present disclosure may provide superior leakage current suppression due to the electrical isolation of the dummy vertical semiconductor channels 160 from underlying structures and overlying structures.

Figure 24A:
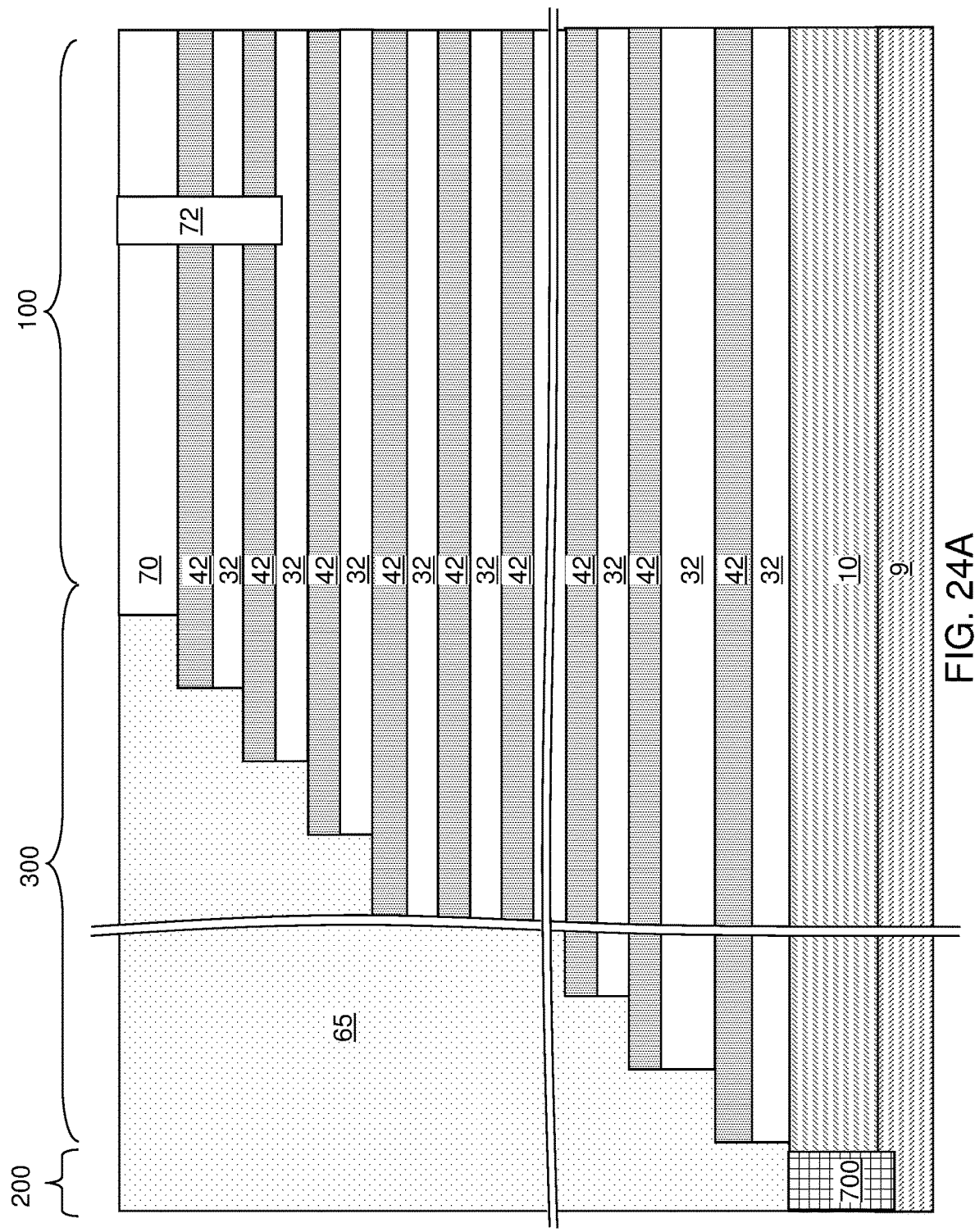
FIG. 24A is a vertical cross-sectional view of a second alternative configuration of the exemplary structure after formation of drain-select-level isolation structures according to an embodiment of the present disclosure.
Figure 24B:
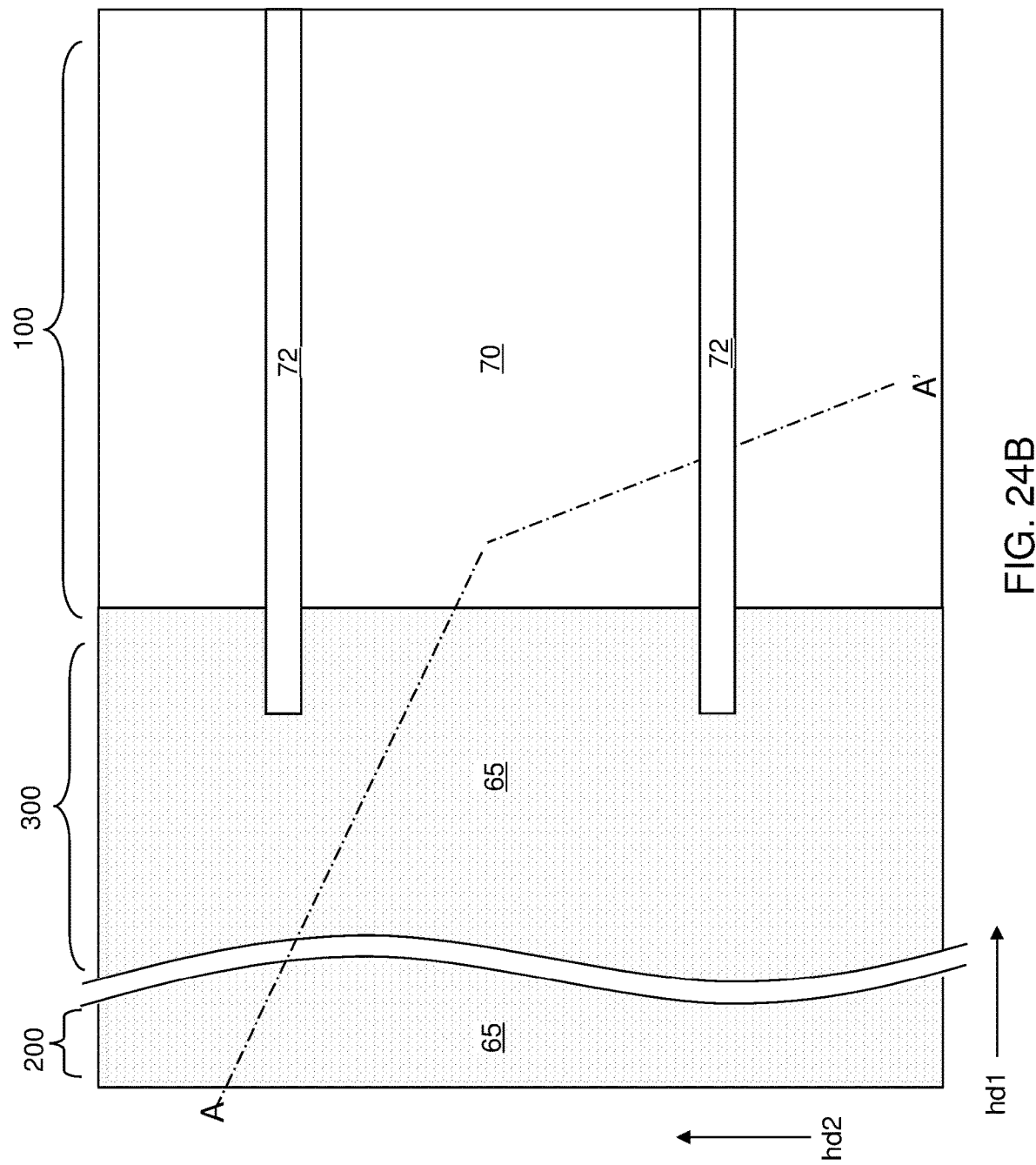
FIG. 24B is a top-down view of the second alternative configuration of the exemplary structure of FIG. 24A.

Referring to FIGS. 24A and 24B, a second alternative configuration of the exemplary structure according to an embodiment of the present disclosure is illustrated, which can be derived from the exemplary structure of FIG. 3 by forming drain-select-level isolation structures 72 thorough the insulating cap layer 70 and a subset of the sacrificial material layers 42 that are proximal to the insulating cap layer 70.

Figure 25A:
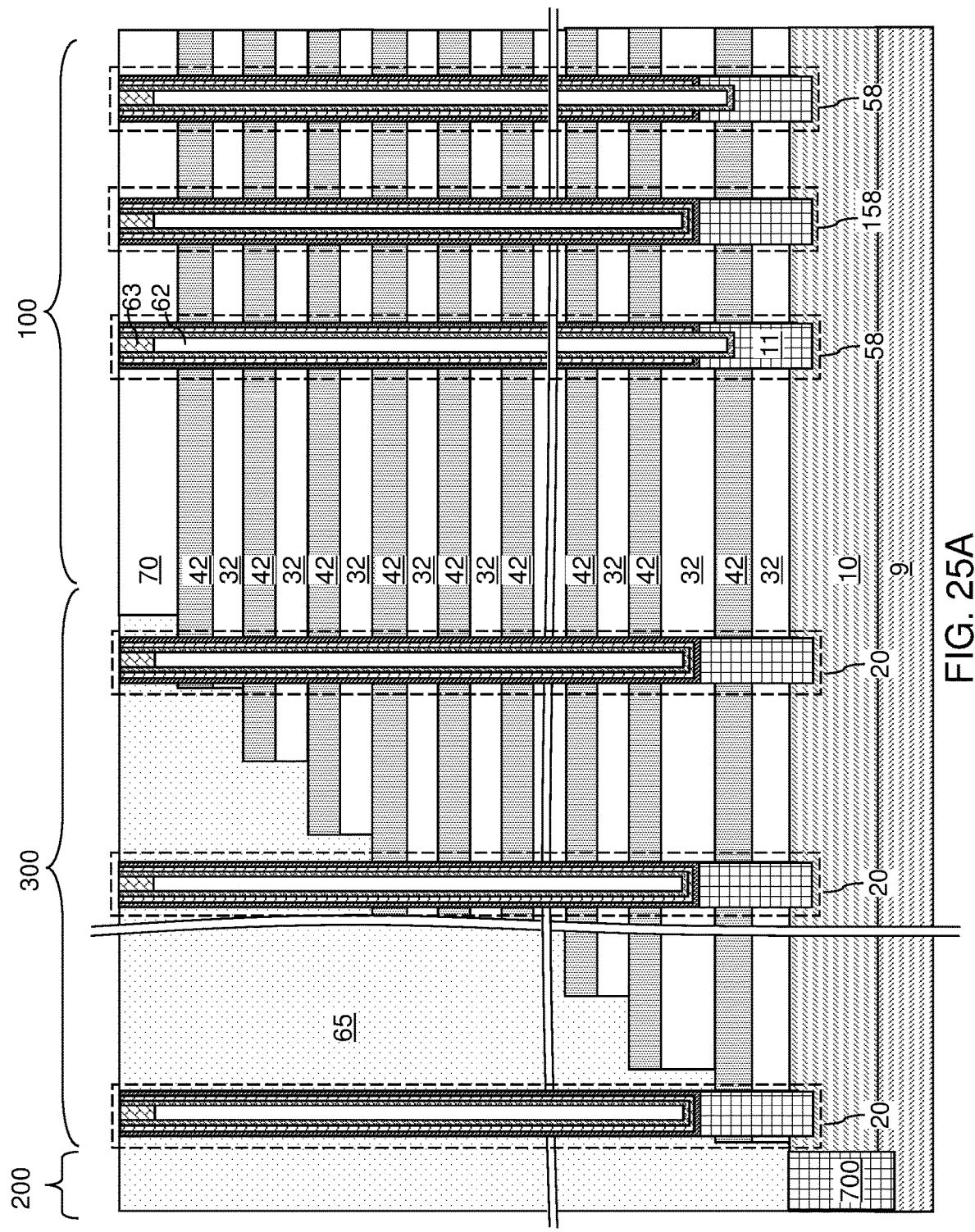
FIG. 25A is a vertical cross-sectional view of the second alternative configuration of the exemplary structure after formation of memory opening fill structures and dummy memory opening fill structures according to an embodiment of the present disclosure.
Figure 25B:
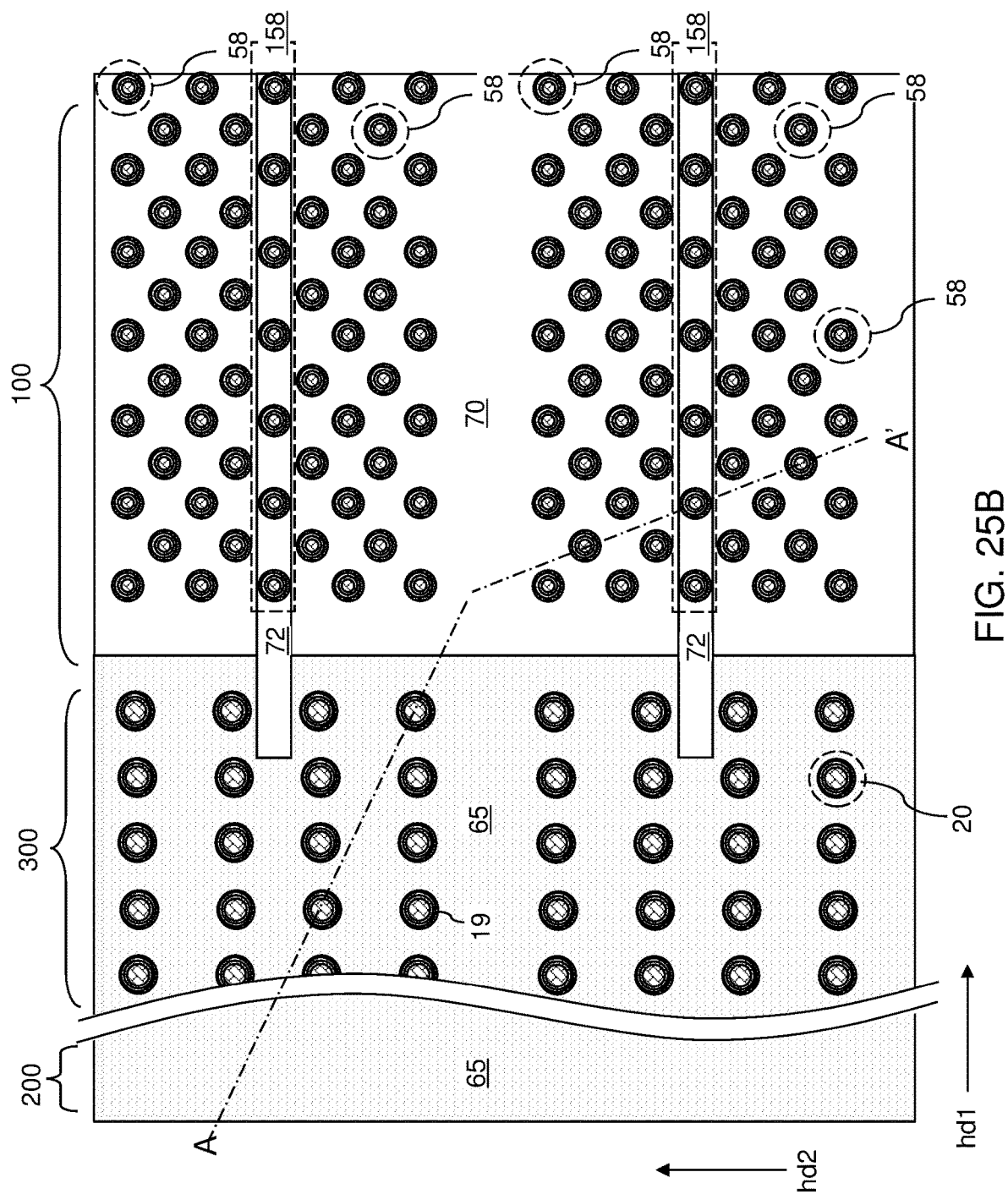
FIG. 25B is a top-down view of the second alternative configuration of the exemplary structure of FIG. 25A.

Referring to FIGS. 25A and 25B, the processing steps of FIGS. 4A and 4B can be performed to form memory openings 49 and support openings 19. A row of memory openings 19 can be formed through each drain-select-level isolation structures 72. The processing steps of FIGS.

5A-5C, 6A and 6B, 7A and 7B, 8A-13B, and 14A and 14B can be subsequently performed to provide the structure illustrated in FIGS. 25A and 25B.

Figure 26:
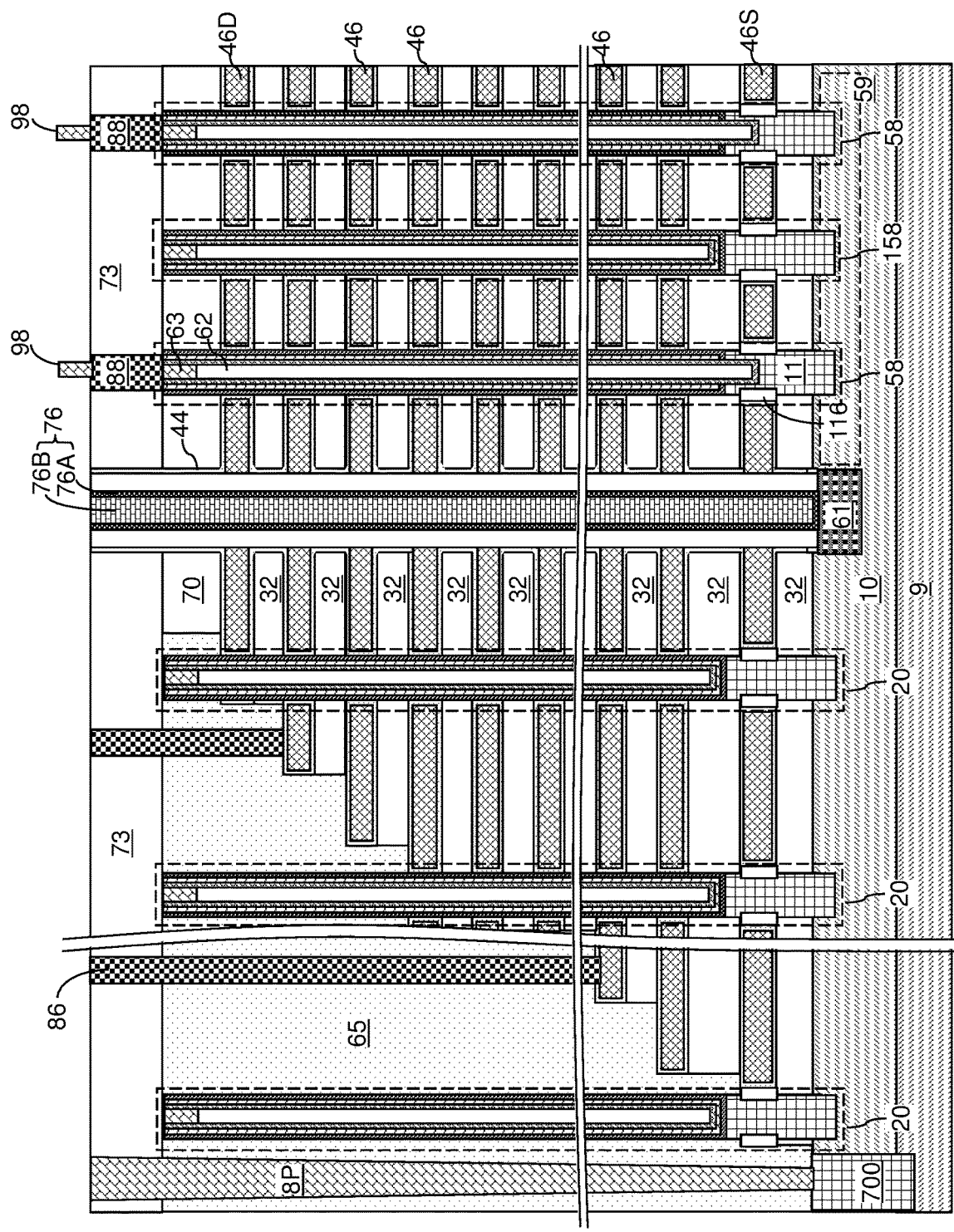
FIG. 26 is a vertical cross-sectional view of the second alternative configuration of the exemplary structure at the processing steps of FIGS. 23A-23C.

Referring to FIG. 26, a contact-level dielectric layer 73 can be formed over the insulating cap layer 70, the memory opening fill structures 58, and the dummy memory opening fill structures 158. Subsequently, the processing steps of FIG. 17A-23B can be subsequently performed to provide the structure illustrated in FIG. 26.

Referring to all drawings and according to various embodiments of the present disclosure, a three-dimensional memory device is provided, which comprises: an alternating stack of insulating layers 32 and electrically conductive layers 46 located over a substrate (9, 10); rows of memory openings 49 vertically extending through the alternating stack (32, 46); memory opening fill structures 58 located within a first subset of the rows of memory openings 49A, wherein each of the memory opening fill structures 58 comprises a respective memory film 50 and a respective vertical semiconductor channel 60 extending through an opening at a bottom portion of the respective memory film 50 and contacting a respective underlying semiconductor material portion (such as a first pedestal channel portion 11 or a surface portion of a semiconductor material layer 10); and dummy memory opening fill structures 158 located within a second subset of the rows of memory openings 49B that do not belong the first subset, wherein each of the dummy memory opening fill structures 158 comprises a respective dummy memory film 150 and a respective dummy vertical semiconductor channel 160 that is electrically isolated from a respective underlying semiconductor material portion (such as a second pedestal channel portion 11 or a surface portion of a semiconductor material layer 10) by a bottom portion of the respective dummy memory film 150 (e.g., by the dielectric isolation structure 57).

In one embodiment, a drain-select-level isolation structure 72 comprising a dielectric material may contact a top surface of each of the dummy memory opening fill structures 158 in a row, and may vertically extend through, and divide, at least a topmost one of the electrically conductive layers 46 (e.g., the drain select gate electrode 46D). In one embodiment, top surfaces of the memory opening fill structures 58 and the drain-select-level isolation structure 72 may be located within a horizontal plane including a top surface of an insulating cap layer 70.

In one embodiment shown in FIG. 6A, each of the dummy memory opening fill structures 158 has a respective topmost surface that contacts a bottom surface of the drain-select-level isolation structure 172. In another embodiment shown in FIG. 6B, each of the dummy memory opening fill structures 158 has a respective topmost surface within the horizontal plane including the top surfaces of the memory opening fill structures 58 and the drain-select-level isolation structure 72. Each of the dummy memory films 150 contacts a respective portion of sidewalls of the drain-select-level isolation structure 72.

In one embodiment, the bottom portion of the respective memory film 50 contacts a top surface of the respective underlying semiconductor material portion (such as a first pedestal channel portion 11 or a surface portion of a semiconductor material layer 10) within each of the memory opening fill structures 58, and the bottom portion of the respective dummy memory film 150 is free of any opening therethrough and contacts a top surface of the respective underlying semiconductor material portion (such as a second pedestal channel portion 11 or a surface portion of a semiconductor material layer 10).

In one embodiment, each of the underlying semiconductor material portions located within the first subset of the rows of memory openings 49A comprises a first pedestal channel portion 11 contacting a semiconductor material layer 10 located within the substrate (9, 10), and each of the underlying semiconductor material portions located within the second subset of the rows of memory openings 49B comprises a second pedestal channel portion 11 contacting the semiconductor material layer 10.

In one embodiment, bit lines 98 are located over the alternating stack (32, 46). Each memory opening fill structure 58 is electrically connected to one of the bit lines 98, and each dummy memory opening fill structure 158 is not electrically connected to the bit lines 98.

In one embodiment, each memory opening 49 within the rows of memory openings 49 vertically extends through each layer within the alternating stack of the insulating layers 32 and the electrically conductive layers 46. In one embodiment, the alternating stack (32, 46) comprises a terrace region in which each electrically conductive layer 46 other than a topmost electrically conductive layer 46D within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46).

In one embodiment, support pillar structures 20 extend through the stepped surfaces and through a retro-stepped dielectric material portion 65 that overlies the stepped surfaces. In one embodiment, each of the support pillar structures 20 comprises a respective dummy memory film 150 and a respective dummy vertical semiconductor channel 160 that is electrically isolated from a respective underlying material portion by a bottom portion of the respective dummy memory film 150.

In one embodiment, each of the memory films 50 of the memory opening fill structures 58 and each of the dummy memory films 150 of the dummy memory opening fill structures 158 comprise a respective layer stack including a tunneling dielectric layer 56 and a charge storage layer 54 that vertically extends through a plurality of layers within the alternating stack (32, 46).

In one embodiment, the three-dimensional memory device comprises additional alternating stacks of additional insulating layers 32 and additional electrically conductive layers 46 located over the substrate (9, 10). Each neighboring pair of the alternating stack and the additional alternating stacks is laterally spaced apart by a respective backside trench 79 that vertically extends from the substrate (9, 10) at least to a horizontal plane including a topmost surface of the alternating stack (32, 46). In one embodiment, each row of memory openings 49 laterally extends along a first horizontal direction hd1, and the backside trenches 79 laterally extend along the first horizontal direction hd1.

In one embodiment, each alternating stack (32, 46) is located between two adjacent backside trenches 79 comprises a memory block 490. Each first subset of rows memory openings 49A includes a plurality of rows of memory openings 49A. Each second subset of rows of memory openings 49B includes a single row of memory openings 49B located between two adjacent first subsets of rows of memory openings 49A. Each memory block 490 contains the two adjacent first subsets of rows of memory openings 49A separated by the second subset of rows of memory openings 49B.

The exemplary structures may include a three-dimensional memory device. In one embodiment, the three-dimensional memory device comprises a monolithic three-dimensional NAND memory device. The electrically conductive layers 46 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one memory cell (which comprises a portion of a charge storage layer 54 at a level of an electrically conductive layer 46) in a first device level of the array of monolithic three-dimensional NAND strings may be located over another memory cell (which comprises another portion of the charge storage layer 54 at a level of another electrically conductive layer 46) in a second device level of the array of monolithic three-dimensional NAND strings. The silicon substrate may contain an integrated circuit comprising a driver circuit (which comprises a subset of the least one semiconductor device 700) for the memory device located thereon. The electrically conductive layers 46 may comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (which comprise portions of the memory films 50, i.e., portions of the charge storage layer 54). Each charge storage element may be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate;
   rows of memory openings vertically extending through the alternating stack;
   memory opening fill structures located within a first subset of the rows of memory openings, wherein each of the memory opening fill structures comprises a respective memory film and a respective vertical semiconductor channel extending through an opening at a bottom portion of the respective memory film and contacting a respective underlying semiconductor material portion;
   dummy memory opening fill structures located within a second subset of the rows of memory openings that do not belong the first subset, wherein each of the dummy memory opening fill structures comprises a respective dummy memory film and a respective dummy vertical semiconductor channel that is electrically isolated from a respective underlying semiconductor material portion by a bottom portion of the respective dummy memory film; and
   a drain-select-level isolation structure comprising a dielectric material and contacting a top surface of each of the dummy memory opening fill structures and vertically extending through, and dividing, at least a topmost one of the electrically conductive layers.

2. The three-dimensional memory device of claim 1, further comprising an insulating cap layer, wherein top surfaces of the memory opening fill structures and the drain-select-level isolation structure are located within a horizontal plane including a top surface of the insulating cap layer.

3. The three-dimensional memory device of claim 2, wherein each of the dummy memory opening fill structures has a respective topmost surface that contacts a bottom surface of the drain-select-level isolation structure.

4. The three-dimensional memory device of claim 1, wherein:
   the bottom portion of the respective memory film contacts a top surface of the respective underlying semiconductor material portion within each of the memory opening fill structures; and
   the bottom portion of the respective dummy memory film is free of any opening therethrough and contacts a top surface of the respective underlying semiconductor material portion.

5. The three-dimensional memory device of claim 1, further comprising bit lines located over the alternating stack, wherein each memory opening fill structure is electrically connected to one of the bit lines, and each dummy memory opening fill structure is not electrically connected to the bit lines.

6. The three-dimensional memory device of claim 1, wherein:
   each memory opening within the rows of memory openings vertically extends through each layer within the alternating stack of the insulating layers and the electrically conductive layers;
   the alternating stack comprises a terrace region in which each electrically conductive layer other than a topmost electrically conductive layer within the alternating stack laterally extends farther than any overlying electrically conductive layer within the alternating stack;
   the terrace region includes stepped surfaces of the alternating stack that continuously extend from a bottommost layer within the alternating stack to a topmost layer within the alternating stack; and
   support pillar structures extend through the stepped surfaces and through a retro-stepped dielectric material portion that overlies the stepped surfaces.

7. The three-dimensional memory device of claim 1, wherein each of the memory films of the memory opening fill structures and each of the dummy memory films of the dummy memory opening fill structures comprise a respective layer stack including a tunneling dielectric layer and a charge storage layer that vertically extends through a plurality of layers within the alternating stack.

8. The three-dimensional memory device of claim 1, further comprising additional alternating stacks of additional insulating layers and additional electrically conductive layers located over the substrate, wherein:
   each neighboring pair of the alternating stack and the additional alternating stacks is laterally spaced apart by a respective backside trench that vertically extends from the substrate at least to a horizontal plane including a topmost surface of the alternating stack'
   each row among the rows of memory openings through the alternating stack laterally extends along a first horizontal direction; and
   the backside trenches laterally extend along the first horizontal direction.

9. A method of forming a three-dimensional memory device, comprising:
   forming an alternating stack of insulating layers and spacer material layers over a substrate, wherein the spacer material layers are formed as, or are subsequently replaced with, electrically conductive layers;
   forming rows of memory openings extending through each layer within the alternating stack down to the substrate;
   forming a continuous memory film that extends into each of the memory openings;
   forming a patterned etch mask layer that masks portions of the continuous memory film, wherein a first subset of the memory openings is not covered by the patterned etch mask layer and a second subset of the memory openings that includes a single row of memory openings is covered by the patterned etch mask layer;
   forming connection openings by anisotropically etching through bottom portions of the continuous memory film located within the first subset of the rows of memory openings;
   removing the patterned etch mask layer; and
   forming memory opening fill structures within the first subset of rows of memory openings and dummy memory opening fill structures within the second subset of the rows of memory openings, wherein each of the memory opening fill structures comprises a respective memory film that is a respective remaining portion of the continuous memory film and a respective vertical semiconductor channel extending through a respective connection opening and contacting a respective first underlying semiconductor material portion, and wherein each of the dummy memory opening fill structures comprises a respective dummy memory film that is a respective remaining portion of the continuous memory film and a respective dummy vertical semiconductor channel that is electrically isolated from a respective second underlying semiconductor material portion by a bottom portion of the respective dummy memory film.

10. The method of claim 9, further comprising forming a drain-select-level isolation structure comprising a dielectric material through the dummy memory opening fill structures, wherein a topmost one of the spacer material layers is divided into two discrete portions by the drain-select-level isolation structure.

11. The method of claim 10, further comprising:
    forming an insulating cap layer over the alternating stack;
    forming a drain-select-level isolation trench at least through the insulating cap layer and the topmost one of the spacer material layers and through upper portions of each of the dummy memory opening fill structures; and
    depositing a dielectric material in the drain-select-level isolation trench, wherein the drain-select-level isolation structure comprises a portion of the dielectric material deposited in the drain-select-level isolation trench.

12. The method of claim 10, wherein:
    each of the memory opening fill structures comprises a respective drain region that is formed at an upper end of a respective vertical semiconductor channel;
    each of the dummy memory opening fill structures comprises a respective dummy drain region that is formed at an upper end of a respective dummy vertical semiconductor channel; and
    the method comprises removing each of the dummy drain regions, and the drain-select-level isolation structure is formed as a continuous structure including volumes from which the drain regions are removed.

13. The method of claim 12, further comprising:
    depositing a semiconductor channel layer in the memory openings after removal of the patterned etch mask layer, wherein the semiconductor channel layer contacts each of the first underlying semiconductor material portions and is vertically spaced from each of the second underlying semiconductor material portions by the continuous memory film; and
    removing portions of the continuous memory film from above the alternating stack, wherein each remaining portion of the continuous memory film within the first subset of the rows of memory openings constitutes a respective memory film, and each remaining portion of the continuous memory film within the second subset of the rows of memory openings constitutes a respective dummy memory film.

14. The method of claim 9, further comprising:
    forming stepped surfaces of the alternating stack by patterning the alternating stack in a terrace region, wherein each spacer material layer other than a topmost spacer material layer within the alternating stack laterally extends farther than any overlying spacer material layer within the alternating stack;
    forming a retro-stepped dielectric material portion over the stepped surfaces of the alternating stack; and
    forming support pillar structures through a retro-stepped dielectric material portion and through the stepped surfaces by forming support openings simultaneously with formation of the memory openings and by depositing material portions in the support openings simultaneously with formation of the memory opening fill structures and the dummy memory opening fill structures.

15. The method of claim 9, wherein each of the memory films of the memory opening fill structures and each of the dummy memory films of the dummy memory opening fill structures comprises a respective layer stack including a tunneling dielectric layer and a charge storage layer that vertically extends through a plurality of layers within the alternating stack.

16. A three-dimensional memory device comprising:
    an alternating stack of insulating layers and electrically conductive layers located over a substrate;
    rows of memory openings vertically extending through the alternating stack;

memory opening fill structures located within a first subset of the rows of memory openings, wherein each of the memory opening fill structures comprises a respective memory film and a respective vertical semiconductor channel extending through an opening at a bottom portion of the respective memory film and contacting a respective underlying semiconductor material portion; and dummy memory opening fill structures located within a second subset of the rows of memory openings that do not belong the first subset, wherein each of the dummy memory opening fill structures comprises a respective dummy memory film and a respective dummy vertical semiconductor channel that is electrically isolated from a respective underlying semiconductor material portion by a bottom portion of the respective dummy memory film, wherein:
- the bottom portion of the respective memory film contacts a top surface of the respective underlying semiconductor material portion within each of the memory opening fill structures;
- the bottom portion of the respective dummy memory film is free of any opening therethrough and contacts a top surface of the respective underlying semiconductor material portion;
- each of the underlying semiconductor material portion located within the first subset of the rows of memory openings comprises a first pedestal channel portion contacting a semiconductor material layer located over or within the substrate; and
- each of the underlying semiconductor material portions located within the second subset of memory openings comprises a second pedestal channel portion contacting the semiconductor material layer.

17. A three-dimensional memory device comprising:

an alternating stack of insulating layers and electrically conductive layers located over a substrate;

rows of memory openings vertically extending through the alternating stack;

memory opening fill structures located within a first subset of the rows of memory openings, wherein each of the memory opening fill structures comprises a respective memory film and a respective vertical semiconductor channel extending through an opening at a bottom portion of the respective memory film and contacting a respective underlying semiconductor material portion; and dummy memory opening fill structures located within a second subset of the rows of memory openings that do not belong the first subset, wherein each of the dummy memory opening fill structures comprises a respective dummy memory film and a respective dummy vertical semiconductor channel that is electrically isolated from a respective underlying semiconductor material portion by a bottom portion of the respective dummy memory film, wherein:
- each memory opening within the rows of memory openings vertically extends through each layer within the alternating stack of the insulating layers and the electrically conductive layers;
- the alternating stack comprises a terrace region in which each electrically conductive layer other than a topmost electrically conductive layer within the alternating stack laterally extends farther than any overlying electrically conductive layer within the alternating stack;
- the terrace region includes stepped surfaces of the alternating stack that continuously extend from a bottommost layer within the alternating stack to a topmost layer within the alternating stack;
- support pillar structures extend through the stepped surfaces and through a retro-stepped dielectric material portion that overlies the stepped surfaces; and
- each of the support pillar structures comprises a respective dummy memory film and a respective dummy vertical semiconductor channel that is electrically isolated from a respective underlying material portion by a bottom portion of the respective dummy memory film.

* * * * *